United States Patent [19]

Shedletsky

[11] Patent Number: 5,557,775

[45] Date of Patent: Sep. 17, 1996

[54] EXPERT SYSTEM FOR DESIGNING COMPUTER NETWORKS

[75] Inventor: John J. Shedletsky, Brewster, N.Y.

[73] Assignee: International Business Machines Corporation, Armonk, N.Y.

[21] Appl. No.: 200,249

[22] Filed: Feb. 23, 1994

[51] Int. Cl.⁶ .............................. G06F 9/30; G06F 13/10
[52] U.S. Cl. ............................ 395/500; 395/50; 395/800
[58] Field of Search .................................. 395/500, 325, 395/800, 908, 75, 50, 63, 21, 306, 309

[56] References Cited

U.S. PATENT DOCUMENTS 4,918,620  4/1990  Ulug .......................................... 395/75
4,965,741  10/1990 Winchell et al. ......................... 395/12

OTHER PUBLICATIONS

Ceri et al., "Expert Design of Local Area Networks", IEEE 1990, pp. 23–33 (Oct., 1990).
Mehdi Owrang O. et al., "An Expert System Based Configuration Design of Hybrid–. Ethernet Local Area Network", IEEE 1991, pp. 807–812 (Oct., 1991).
Merabti et al., "Knowledge–Based Support for Distributed Real–Time System Design", IEEE 1992, pp. 218–225. (Aug., 1992).
Merabti et al., "Towards a Design Toolset for Lan–Based Real–Time Systems", IEEE 1990, pp. 234–240. (Mar., 1990).
Schneidewind, "Distributed System Software Design Paradigm with Application to Computer Networks", IEEE 1989, pp. 402–412. (Apr., 1989).
Shiratori et al., "Using Artificial Intelligence in Communication System Design", IEEE Jan., 1992, pp. 38–46. (Jan., 1992).
Ma et al., "A Knowledge–Based Planner of LAN", IEEE 1992, pp. 496–501. (Nov., 1992).
Shedletsky et al., "Application Reference Designs for Distributed Systems", IBM 1993, vol. 32, No. 4 pp. 624–646. (month not available).

IBM Systems Journal, vol. 32, No. 4, 1993, "Application reference designs for distributed systems", by Shedletsky et al, pp. 625–646. (month is not available).

Primary Examiner—Kevin J. Teska
Assistant Examiner—Tan Nguyen
Attorney, Agent, or Firm—Arthur J. Samodovitz

[57] ABSTRACT

An expert system is used to design a computer network comprising hardware platforms, applications, data bases, user interfaces, etc. The expert system initially displays questions and receives responsive information from a user as to characteristics of backend data bases and whether copies of said backend data bases should be stored in respective frontend data bases. In response, the expert system "builds" one of a predetermined set of backend models which corresponds to the information. Next, to reduce complexity, the expert system identifies two or more of the frontend data bases of compatible type that can be merged together and then displays questions and receives responsive information indicating whether the mergers should be made. Next, the expert system displays questions and receives responsive information as to characteristics of frontend components including an intermediate server. In response, the expert system builds one of a set of predetermined frontend models which corresponds to the information. Next, the expert system identifies a function of the intermediate server that can be performed on a backend platform within the backend model. Next, the expert system displays questions and receives responsive information whether the function should be performed on the backend platform, and updates the frontend model accordingly. Next, the expert system displays questions and receives responsive information as to characteristics of connections between the updated frontend model and the backend model. In response, the expert system determines a final design of the computer network based on the connection information, backend model and updated frontend model.

28 Claims, 60 Drawing Sheets

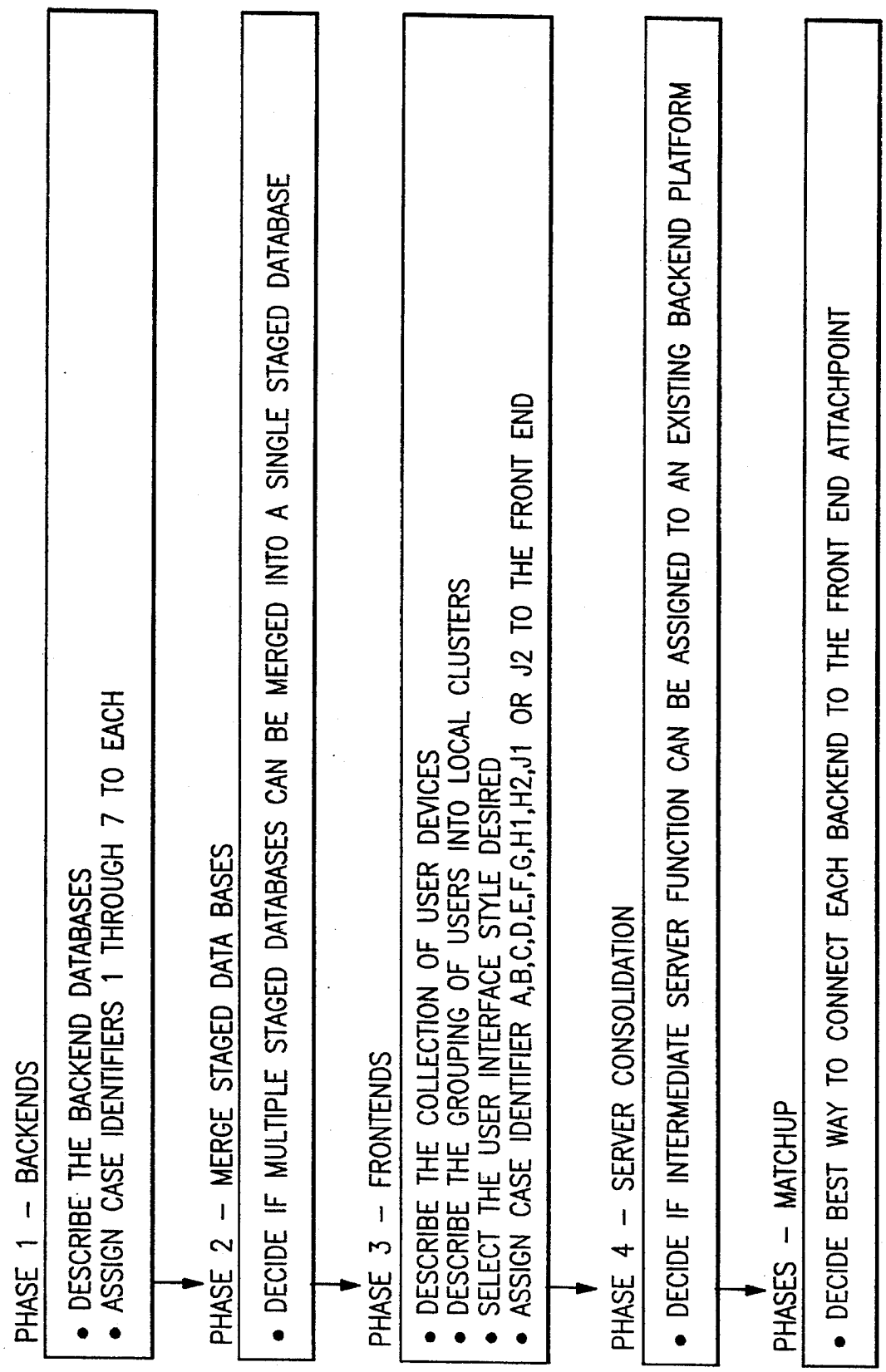

PHASE 1 — BACKENDS
- DESCRIBE THE BACKEND DATABASES
- ASSIGN CASE IDENTIFIERS 1 THROUGH 7 TO EACH

PHASE 2 — MERGE STAGED DATA BASES
- DECIDE IF MULTIPLE STAGED DATABASES CAN BE MERGED INTO A SINGLE STAGED DATABASE

PHASE 3 — FRONTENDS
- DESCRIBE THE COLLECTION OF USER DEVICES
- DESCRIBE THE GROUPING OF USERS INTO LOCAL CLUSTERS
- SELECT THE USER INTERFACE STYLE DESIRED
- ASSIGN CASE IDENTIFIER A,B,C,D,E,F,G,H1,H2,J1 OR J2 TO THE FRONT END

PHASE 4 — SERVER CONSOLIDATION
- DECIDE IF INTERMEDIATE SERVER FUNCTION CAN BE ASSIGNED TO AN EXISTING BACKEND PLATFORM

PHASES — MATCHUP
- DECIDE BEST WAY TO CONNECT EACH BACKEND TO THE FRONT END ATTACHPOINT

FIG. 4g

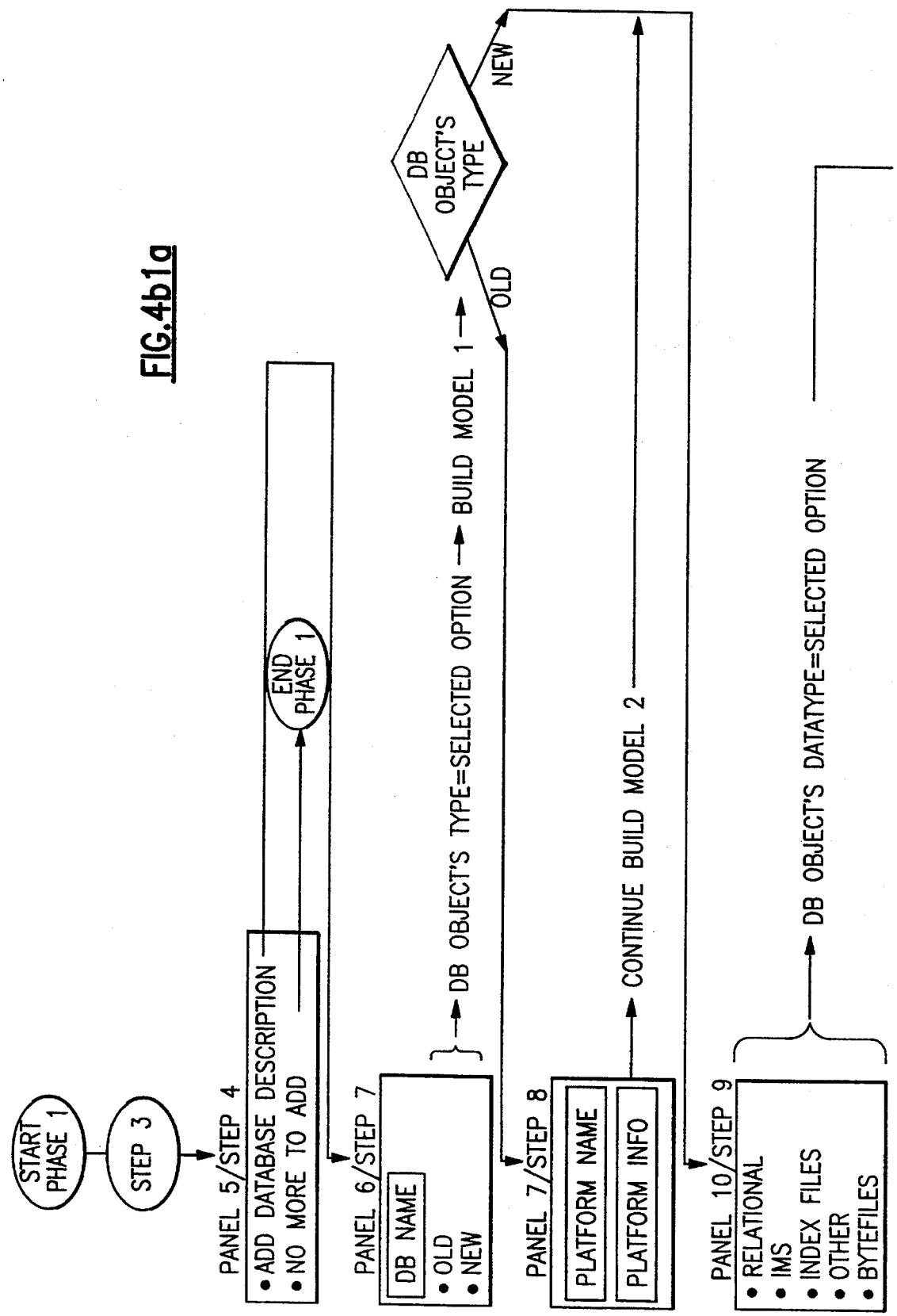

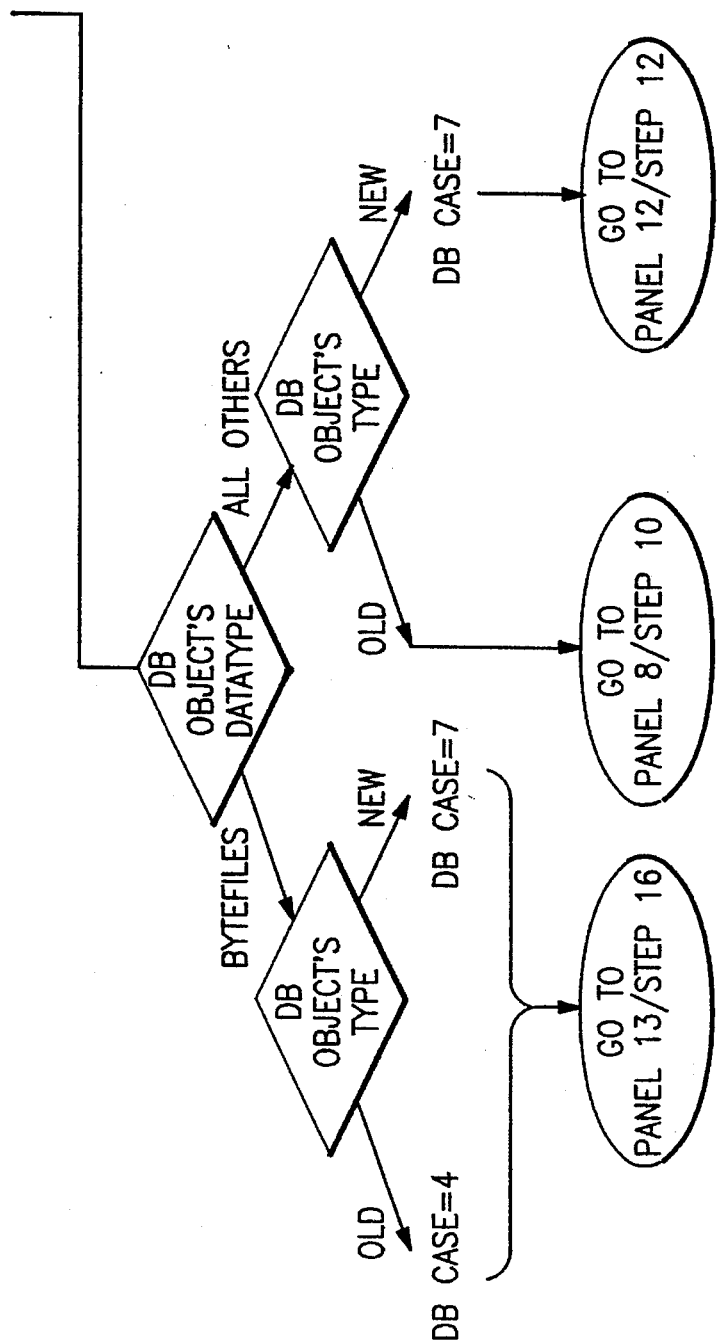
FIG.4b1b
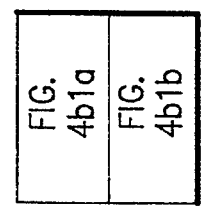
FIG.4b1

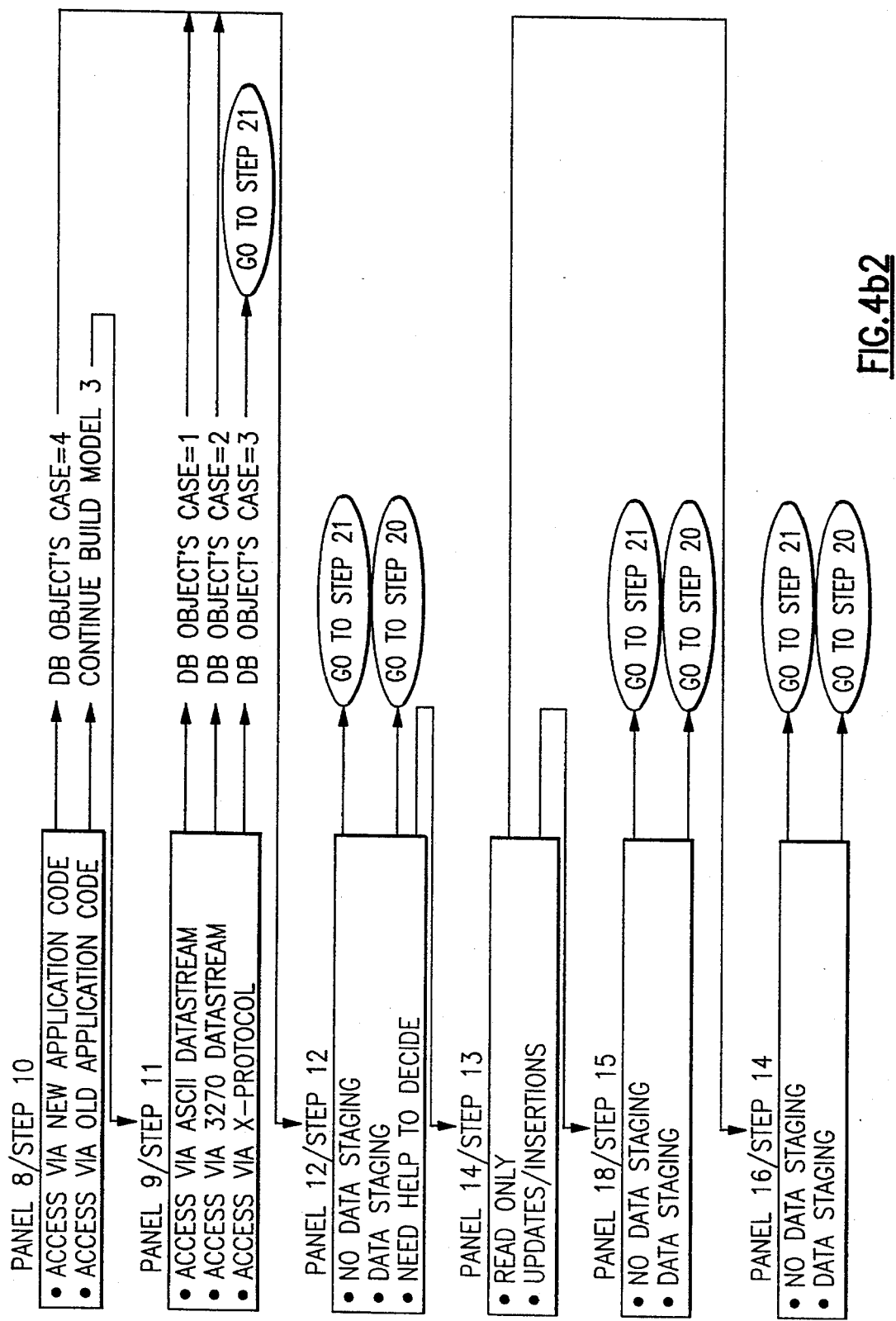
FIG.4b2

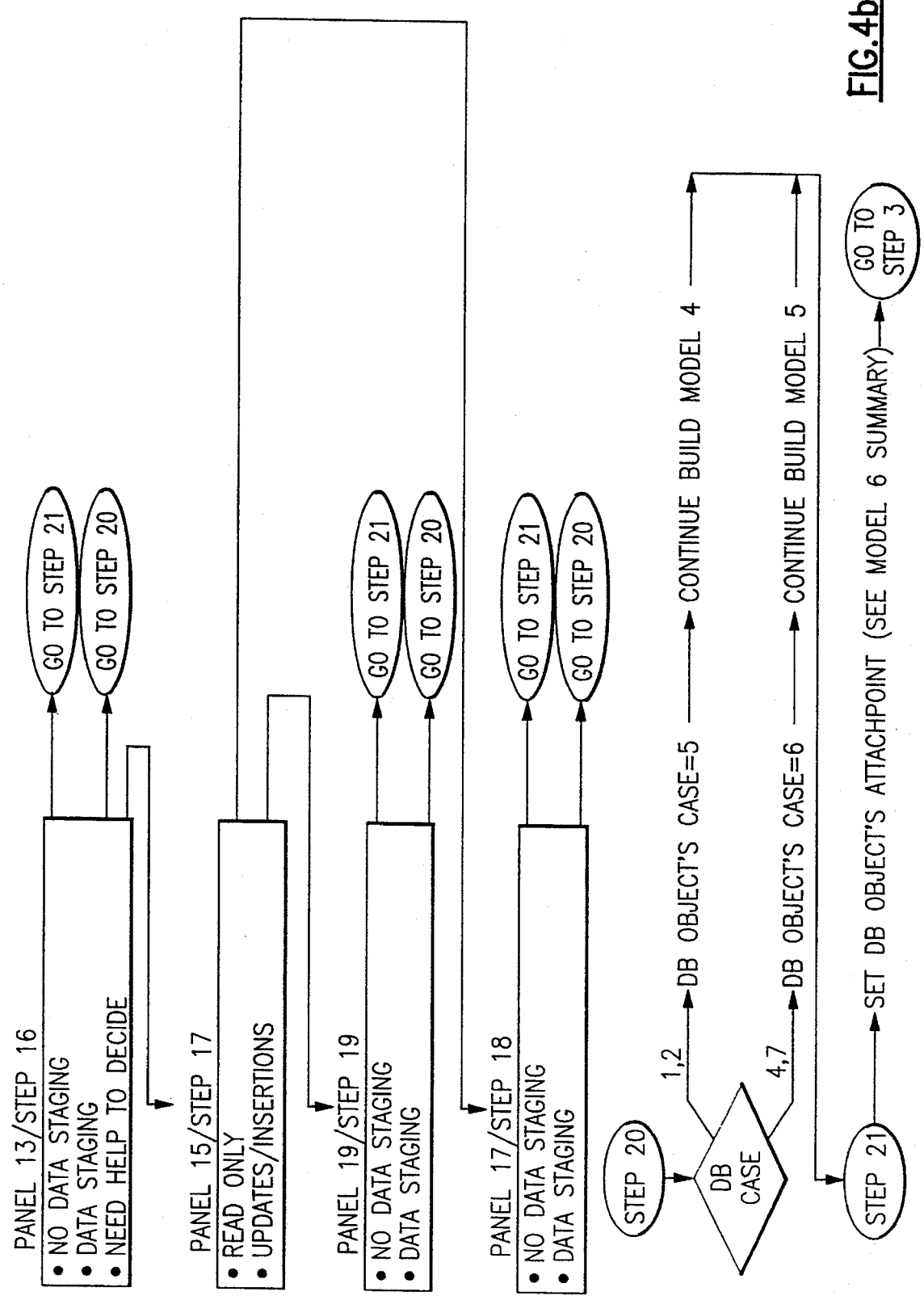
FIG.4b3

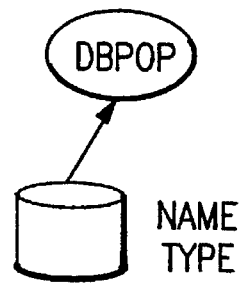
FIG.4c1
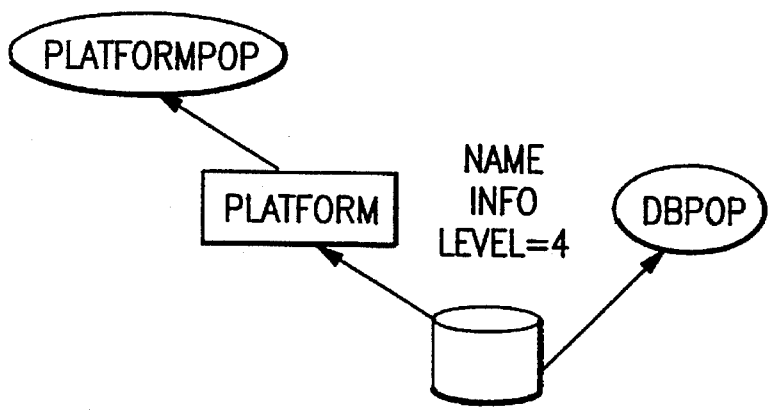
FIG.4c2
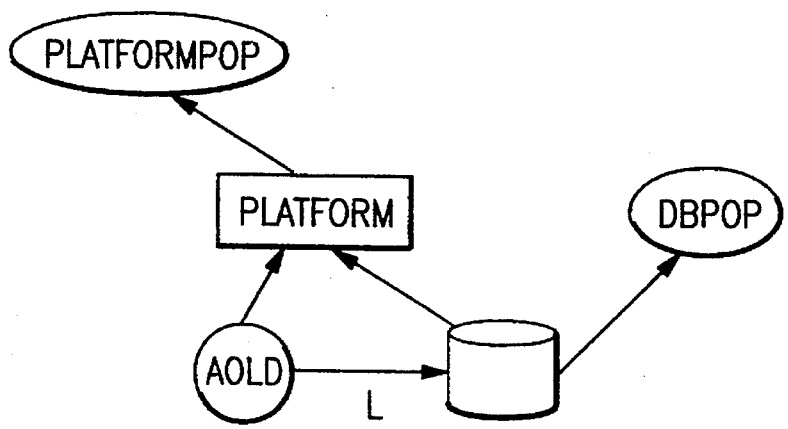
FIG.4c3

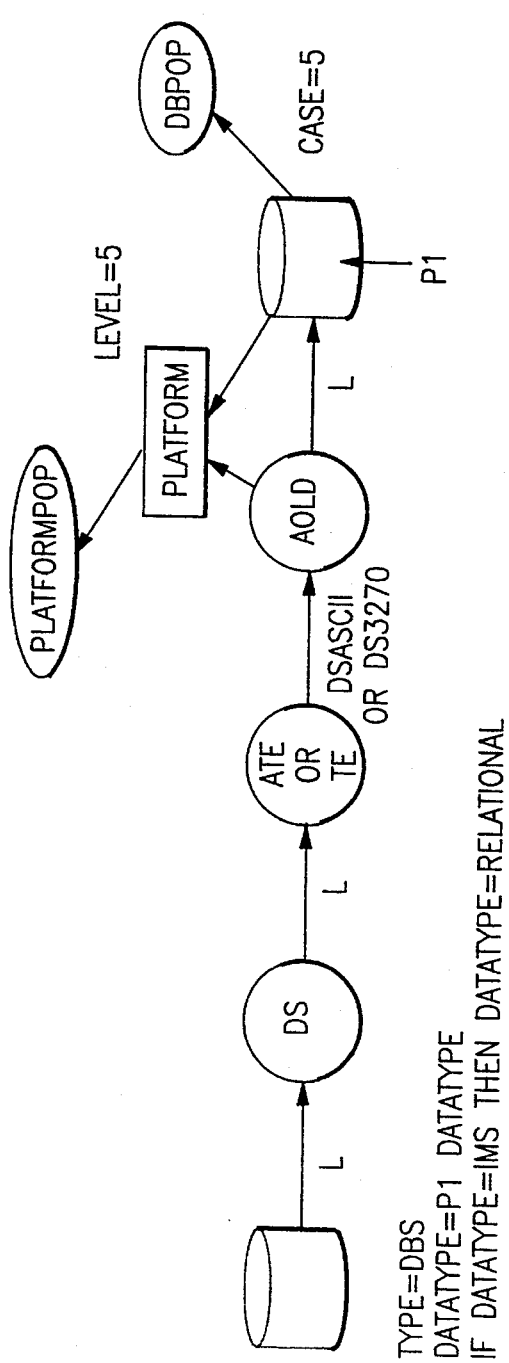
FIG.4c4
TYPE=DBS
DATATYPE=P1 DATATYPE
IF DATATYPE=IMS THEN DATATYPE=RELATIONAL
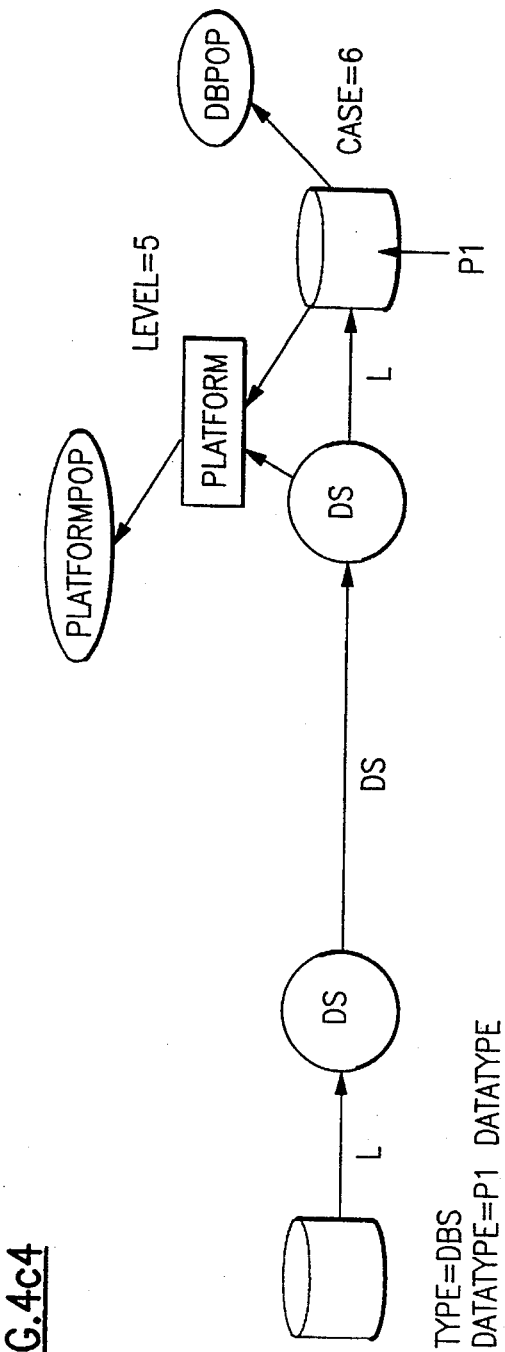
FIG.4c5
TYPE=DBS
DATATYPE=P1 DATATYPE
IF DATATYPE=IMS THEN DATATYPE=RELATIONAL

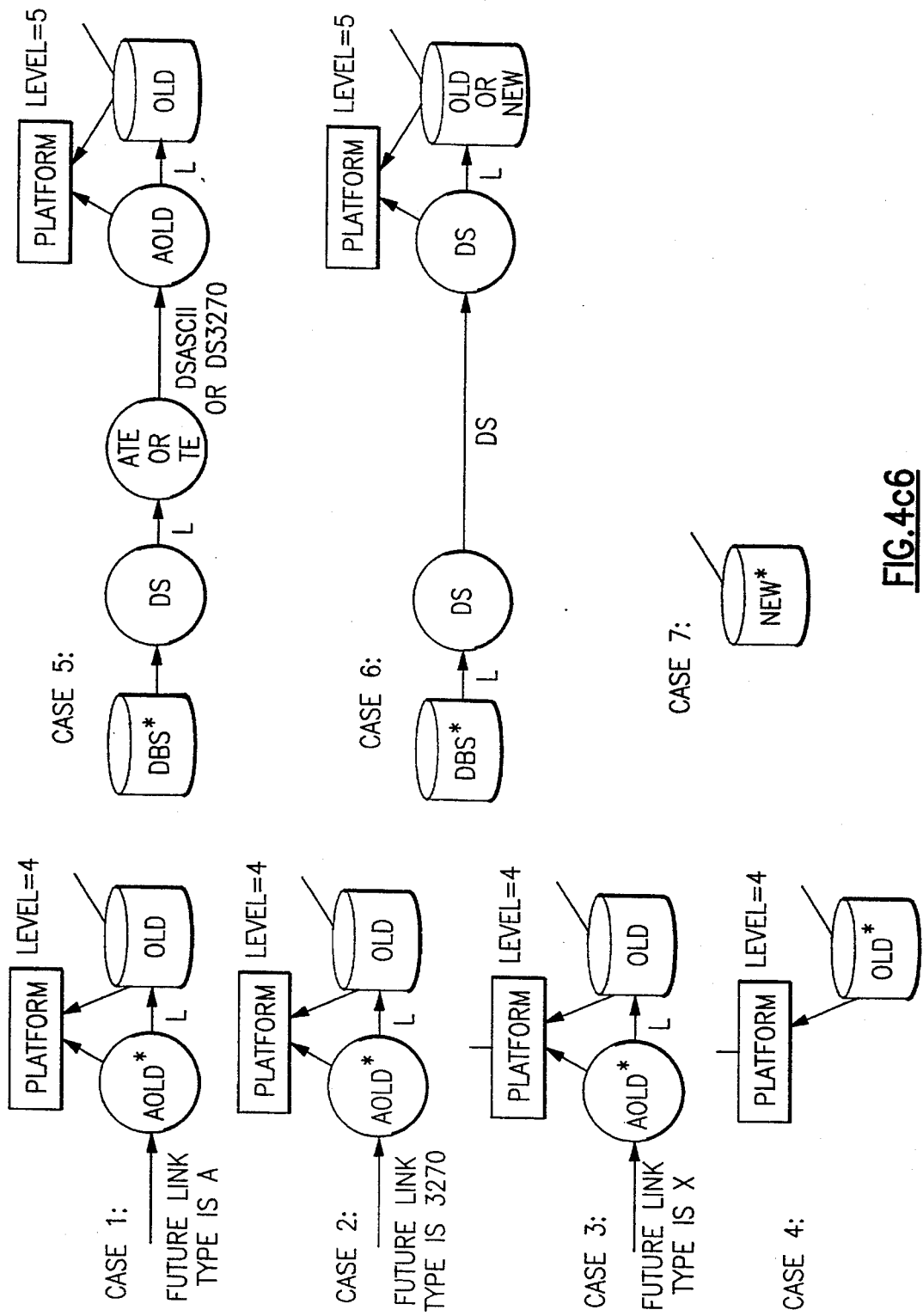
FIG.4c6

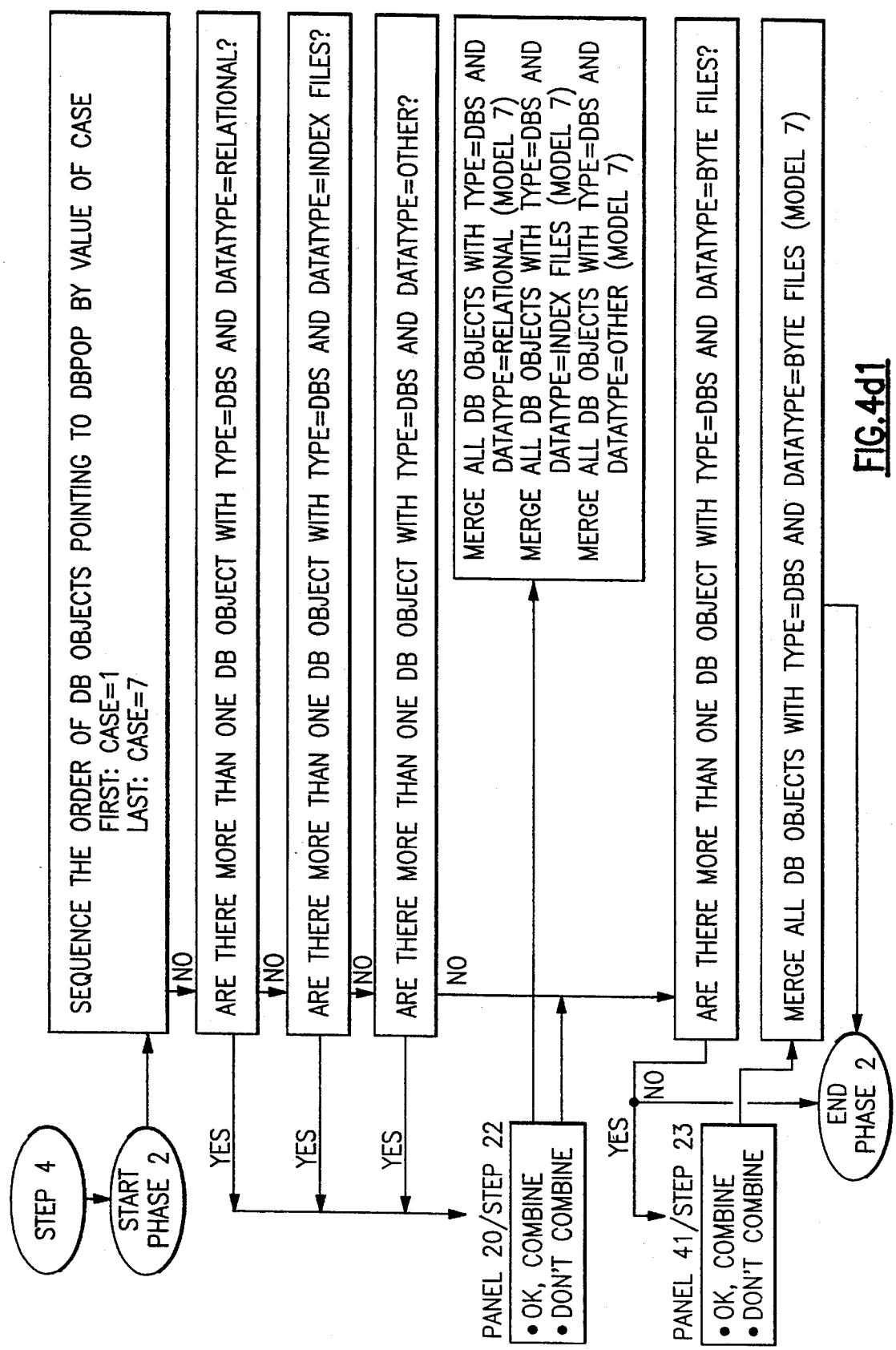
FIG.4d1

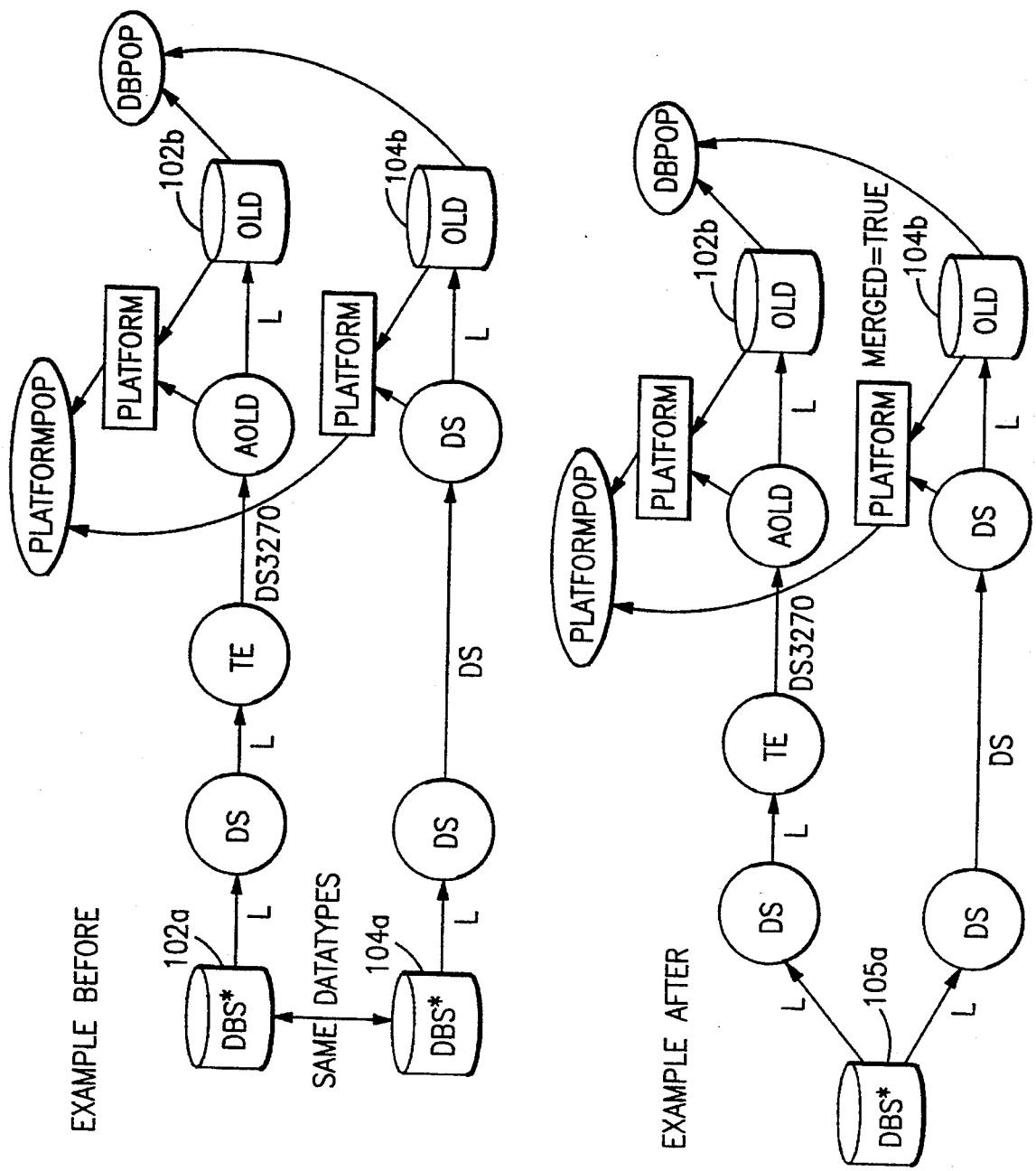
FIG.4e1

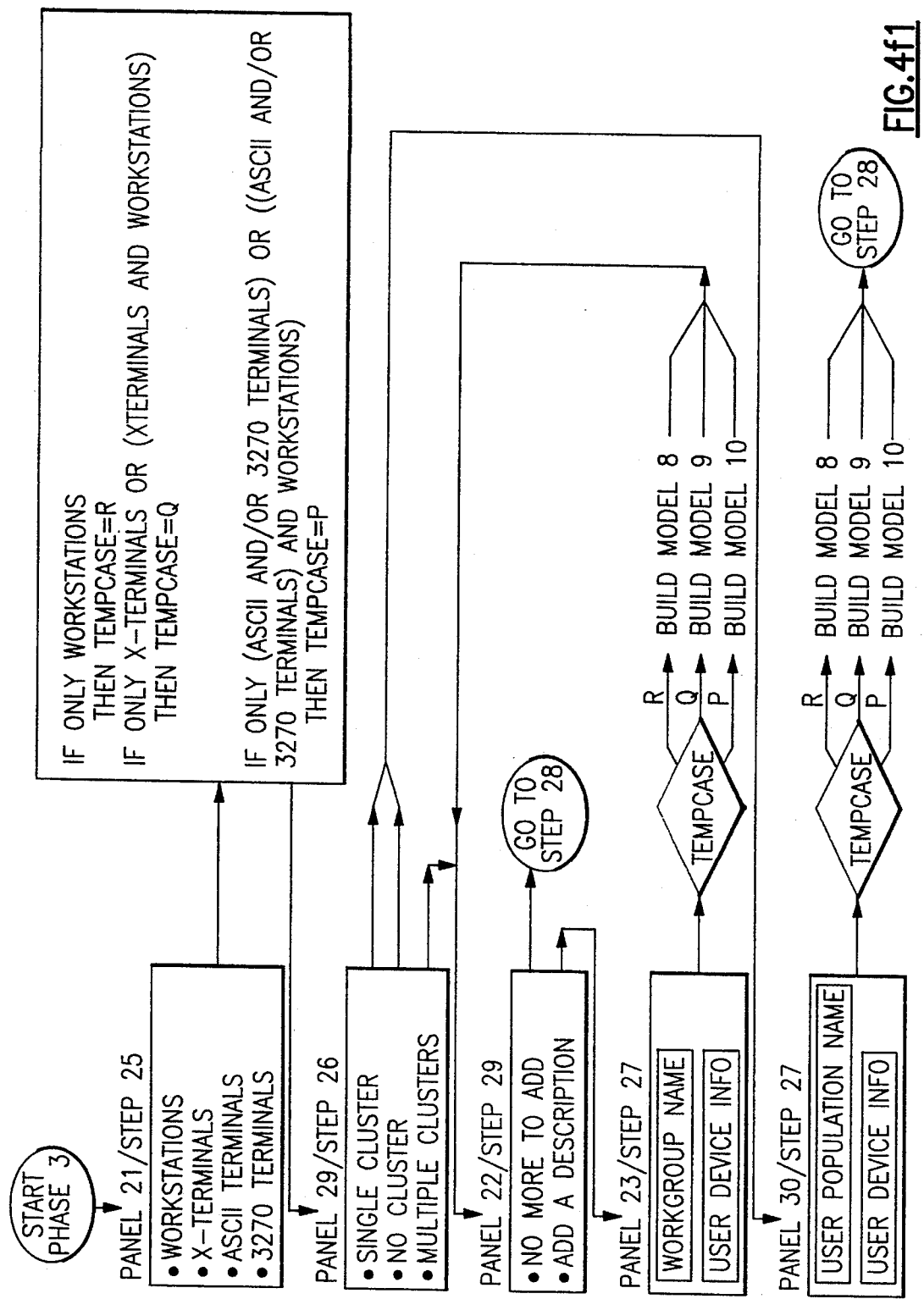

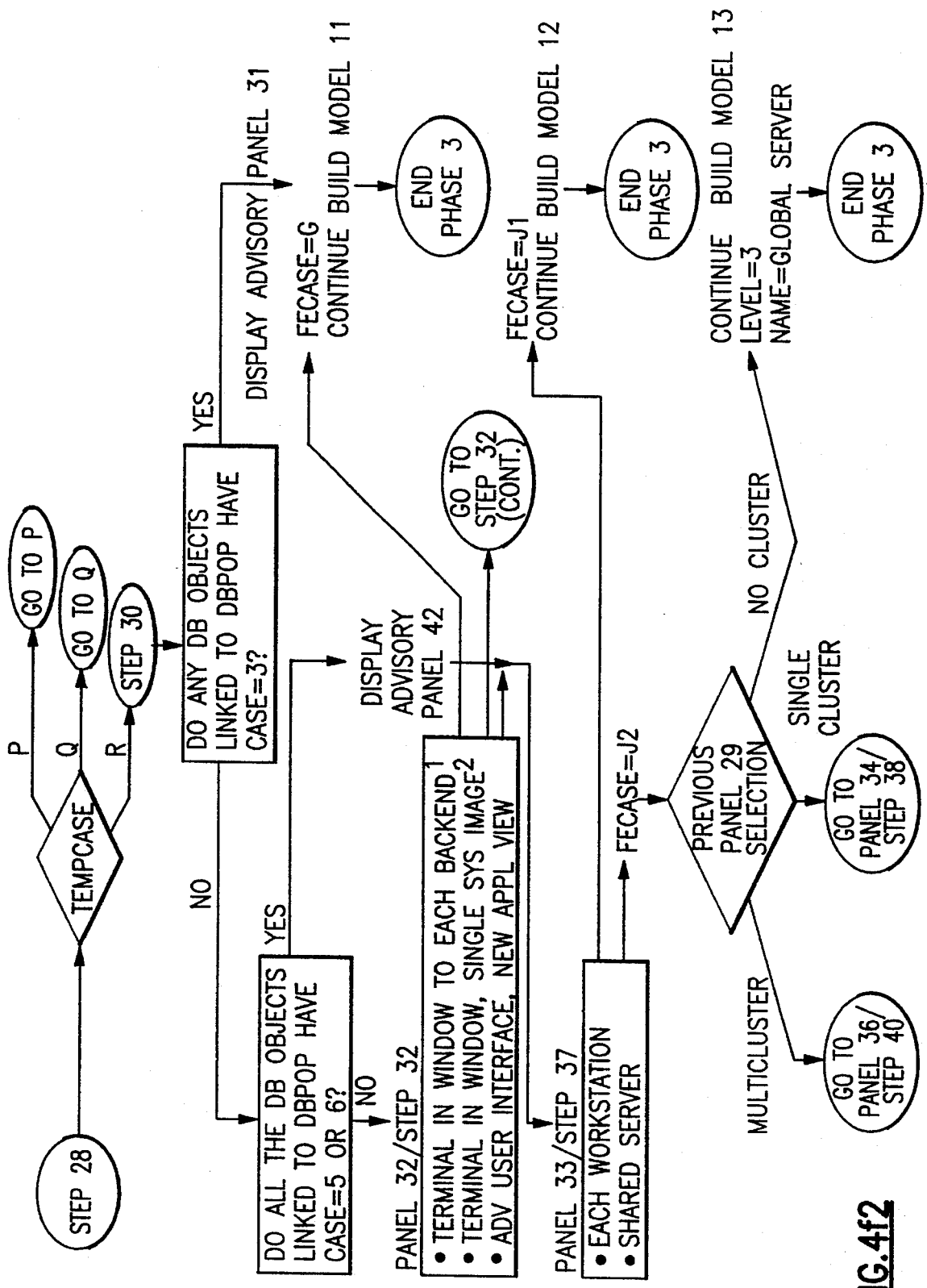
FIG.4f2

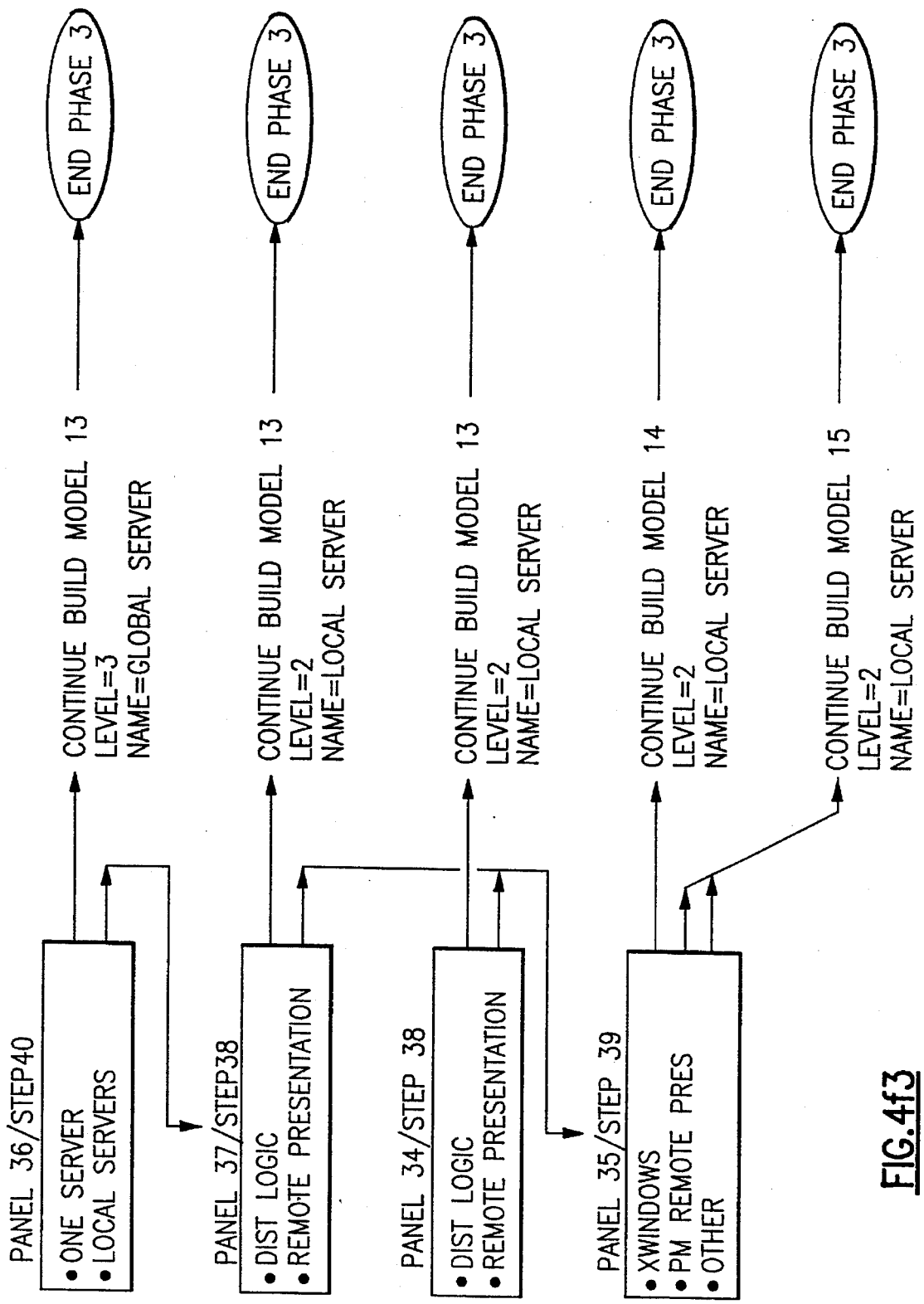
FIG.4f3

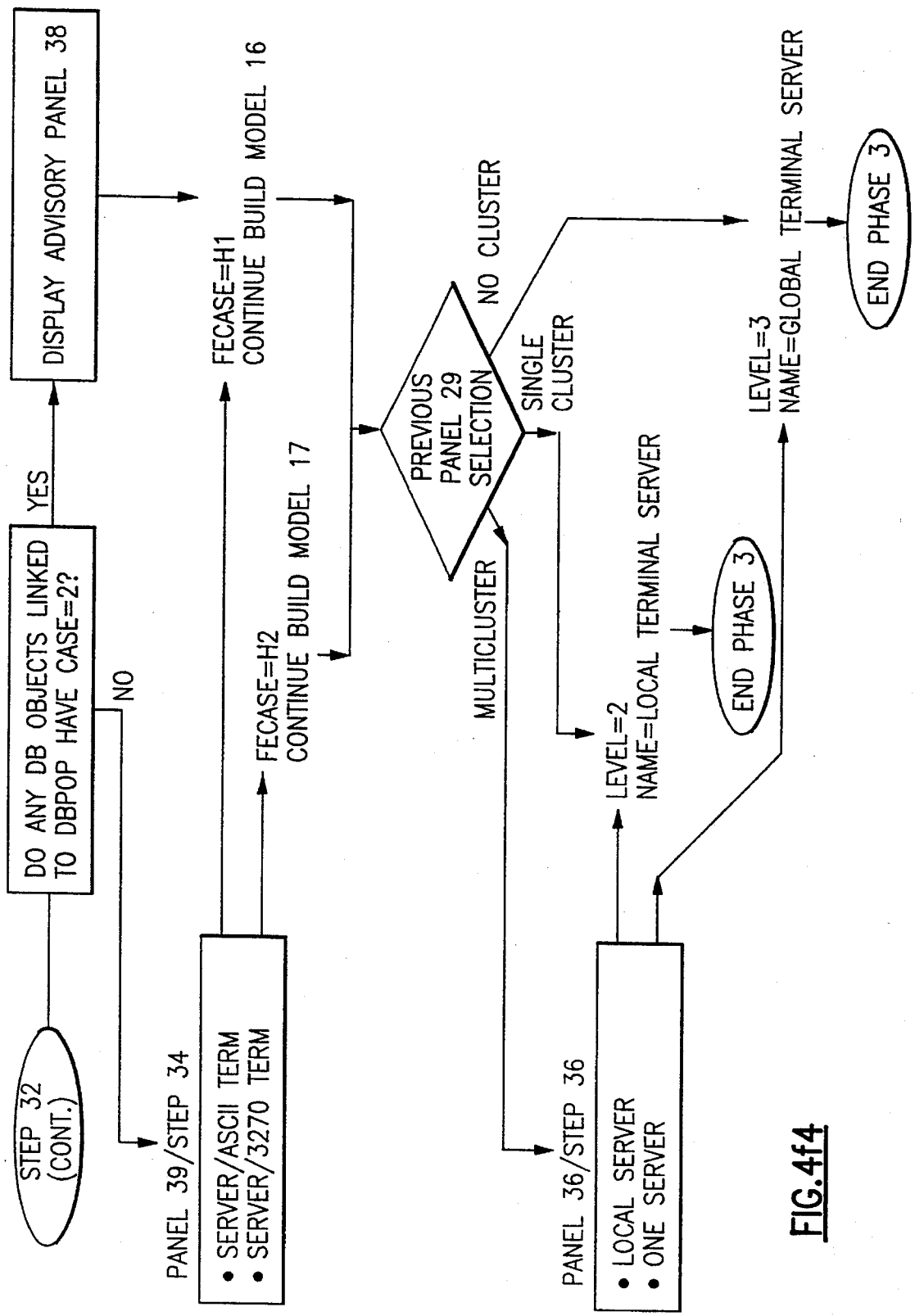
FIG. 4f4

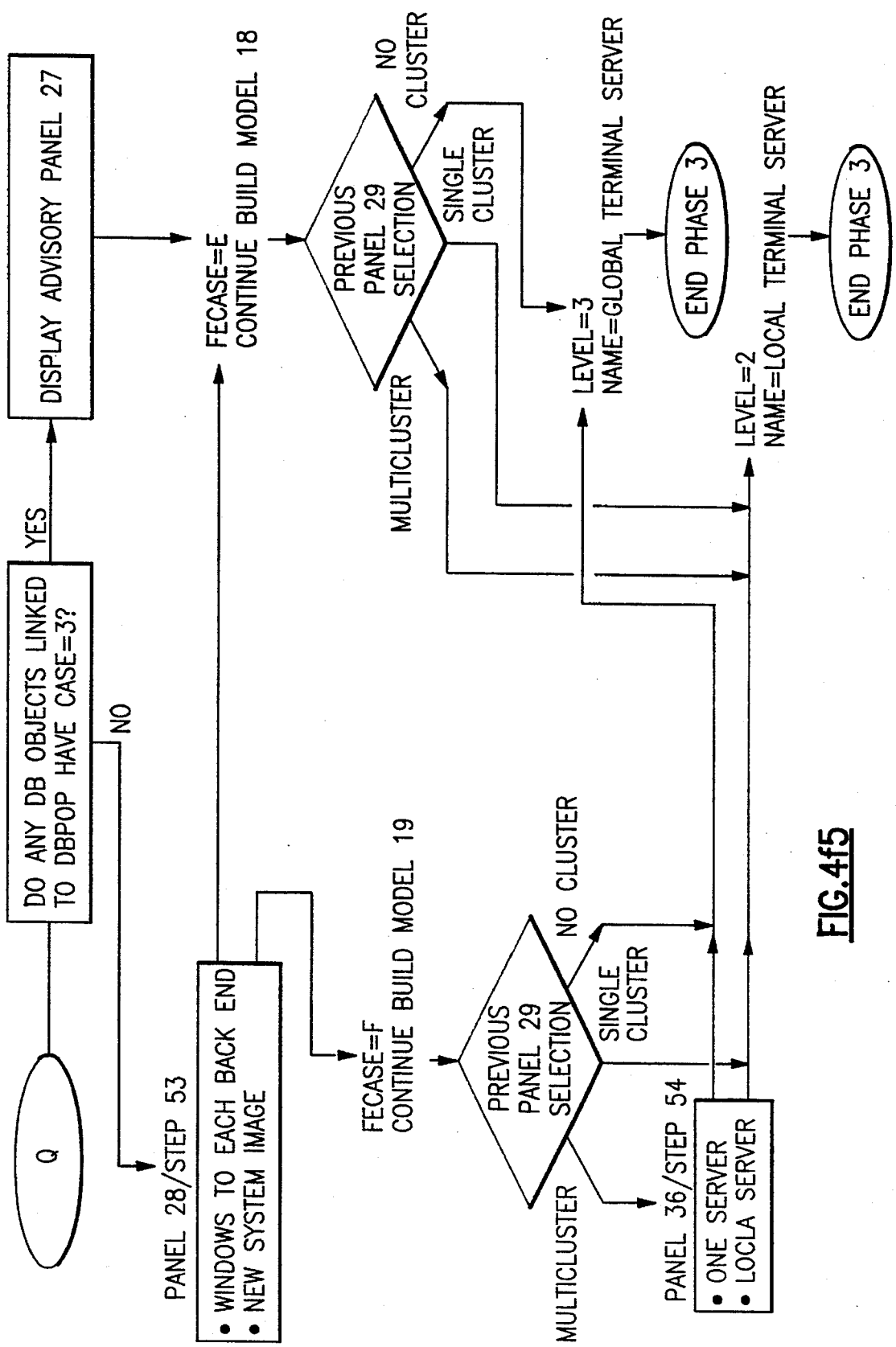
FIG.4f5

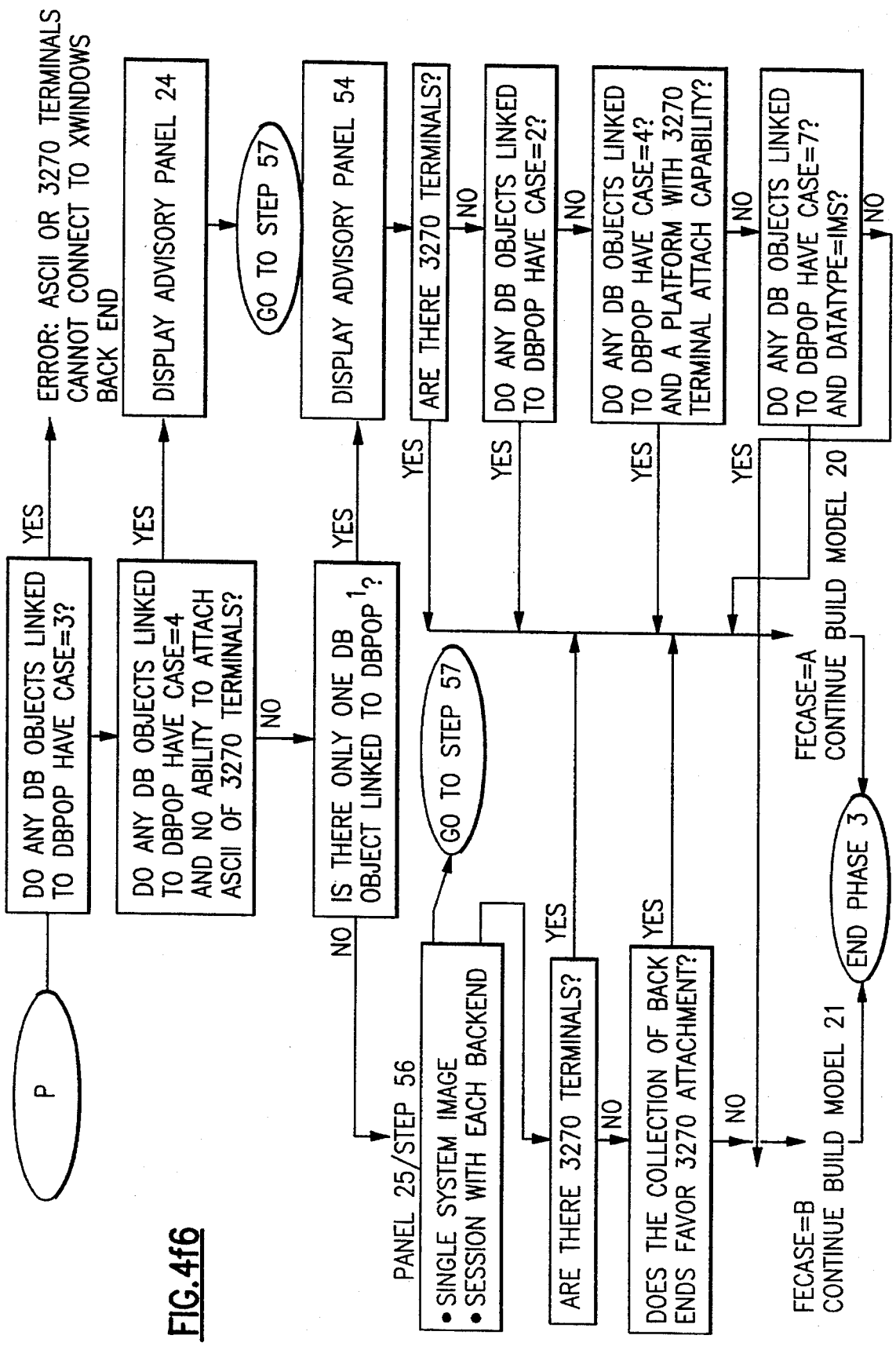
FIG.4f6

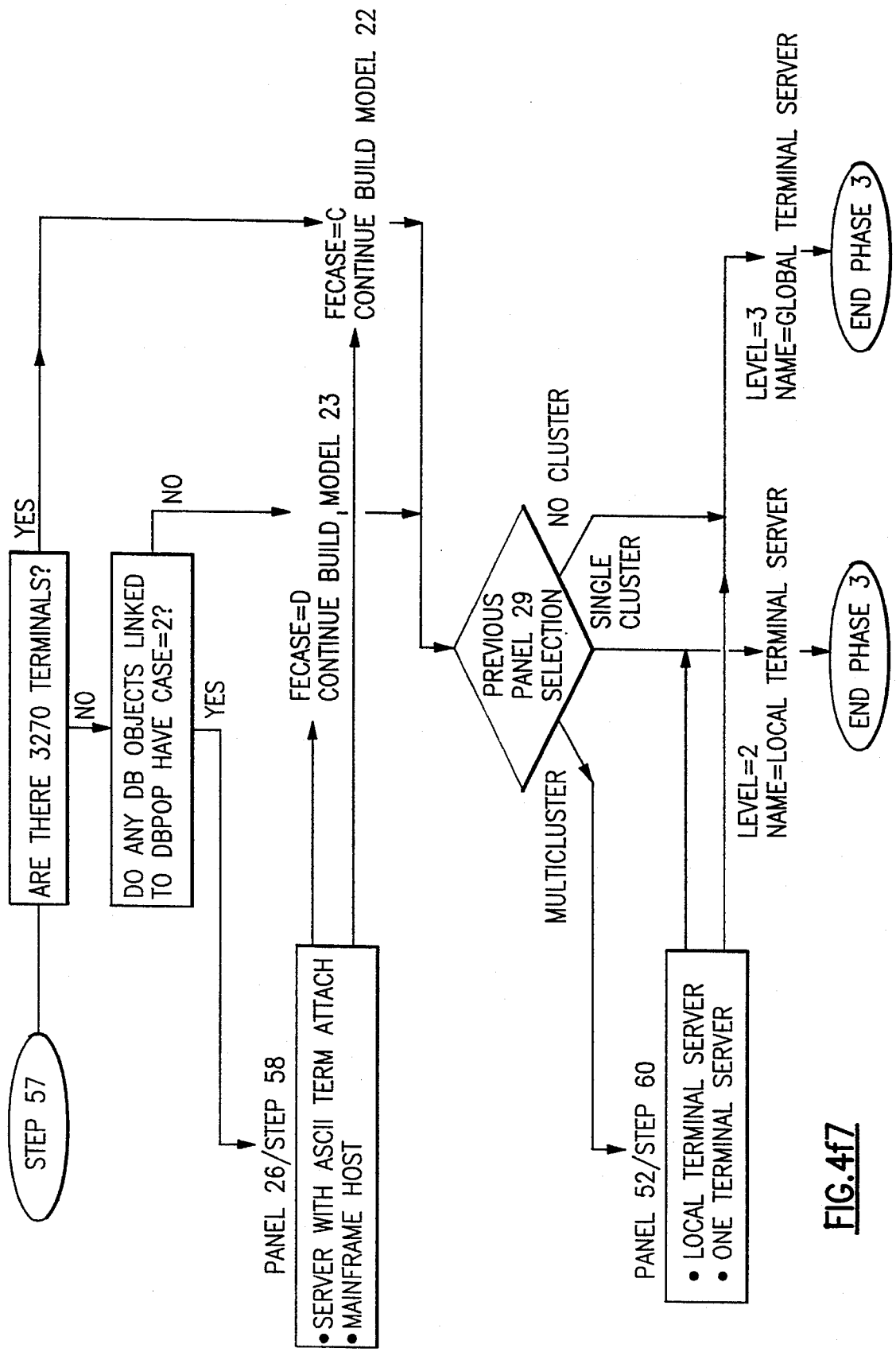
FIG. 4f7

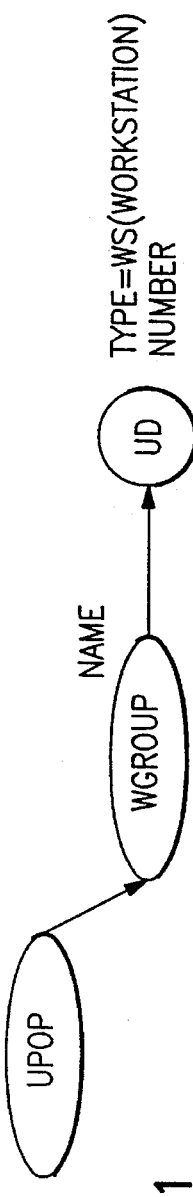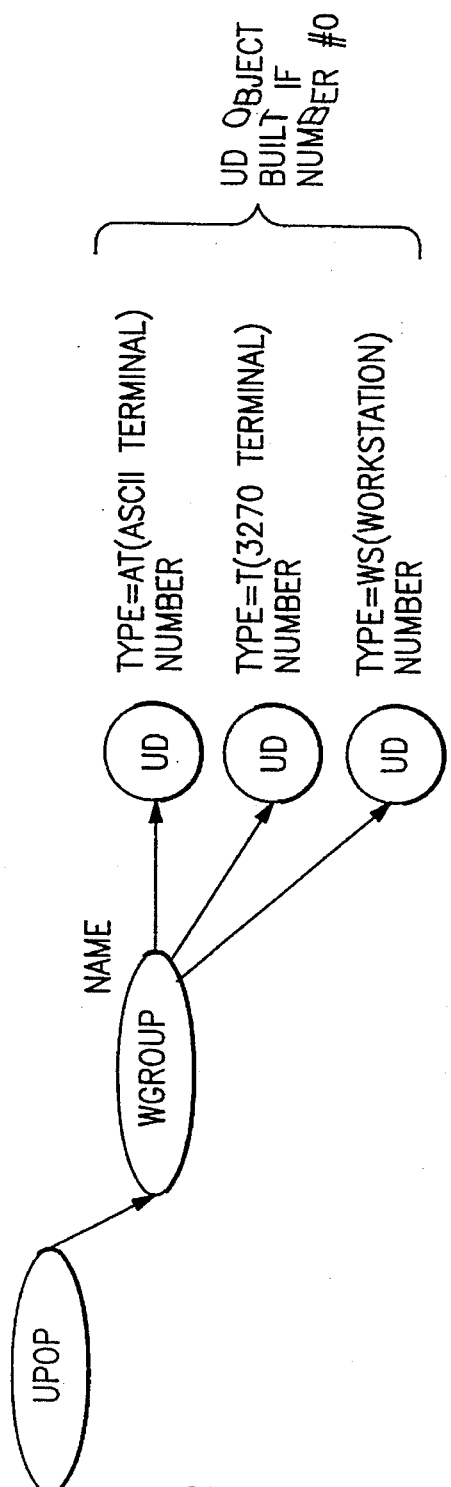
FIG.4g1  FIG.4g2  FIG.4g3

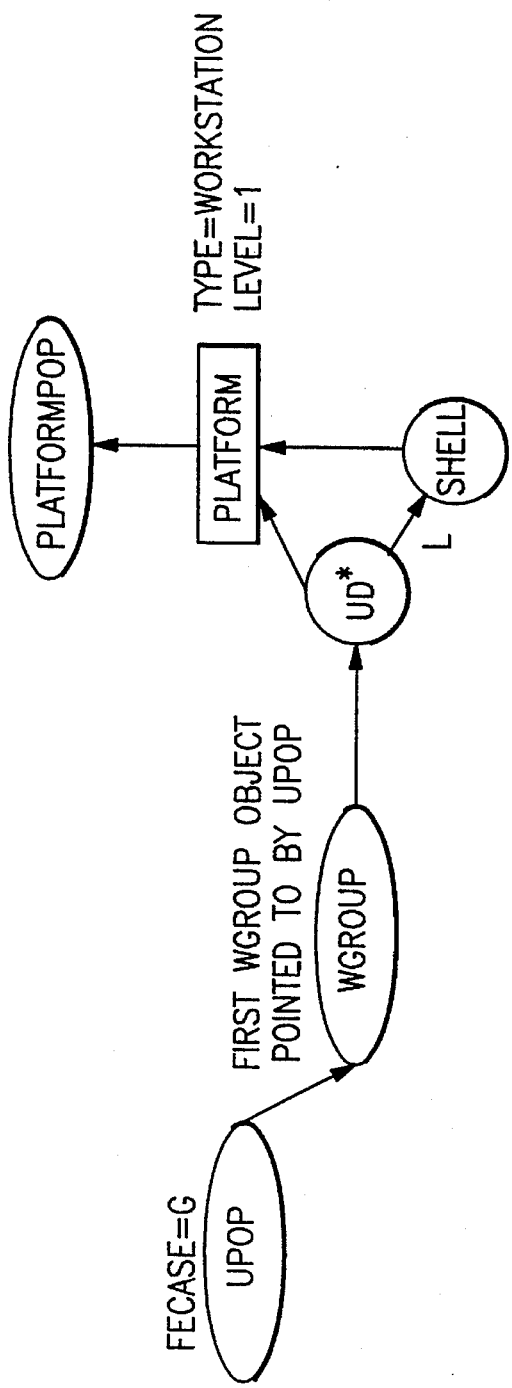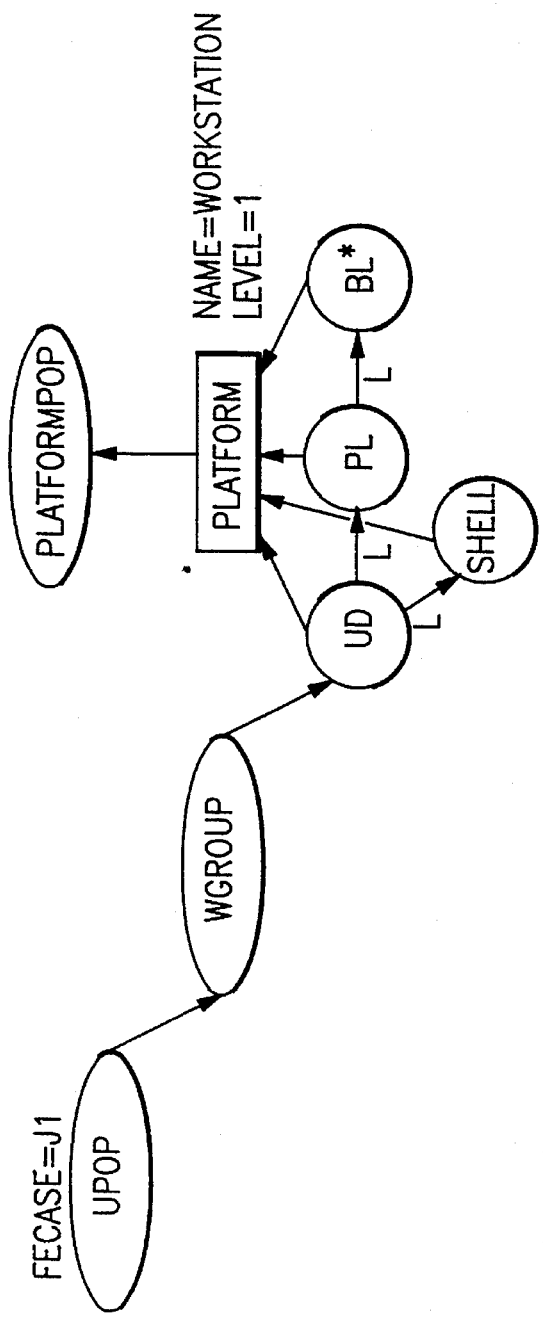
FIG.4g4
FIG.4g5

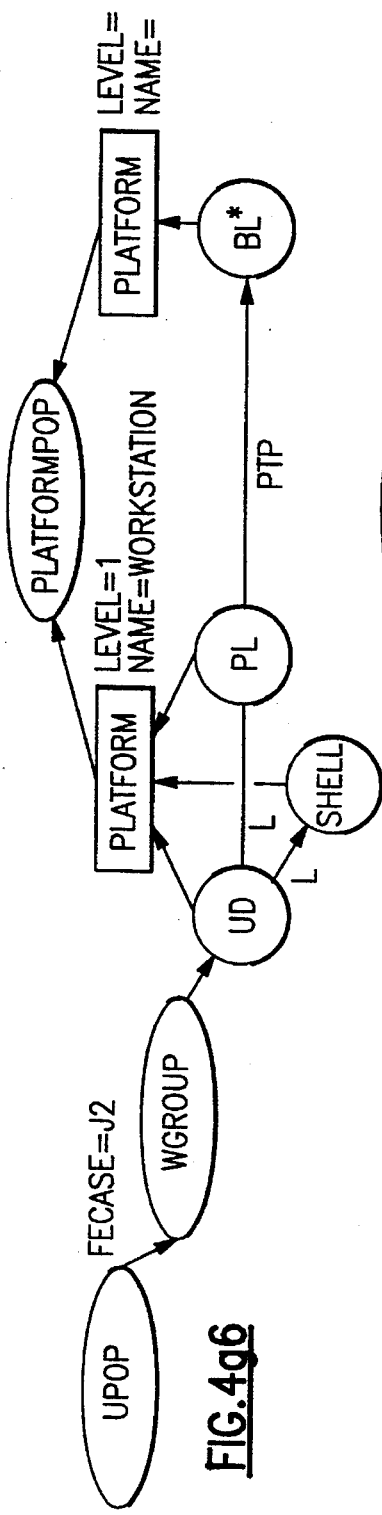
FIG.4g6
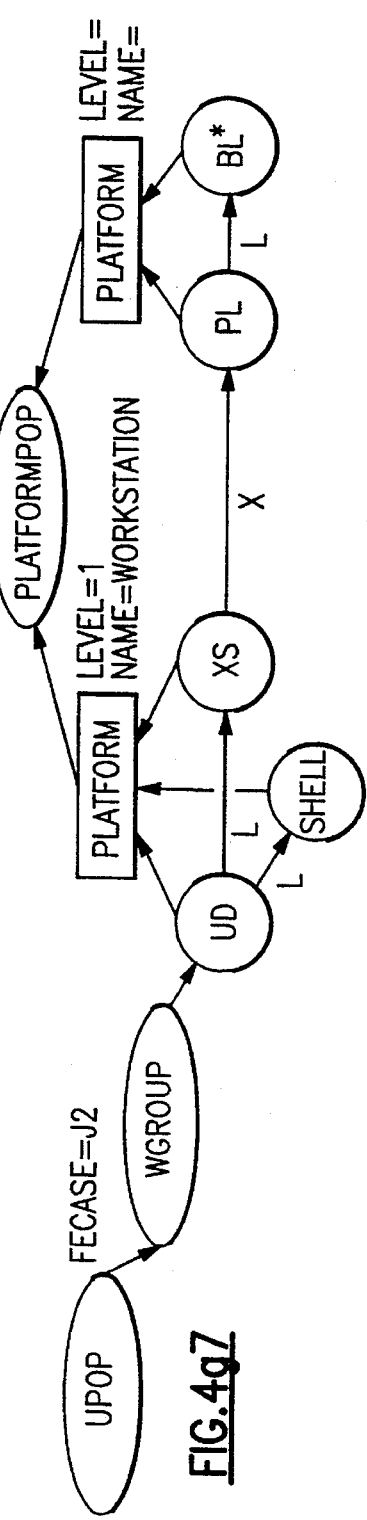
FIG.4g7
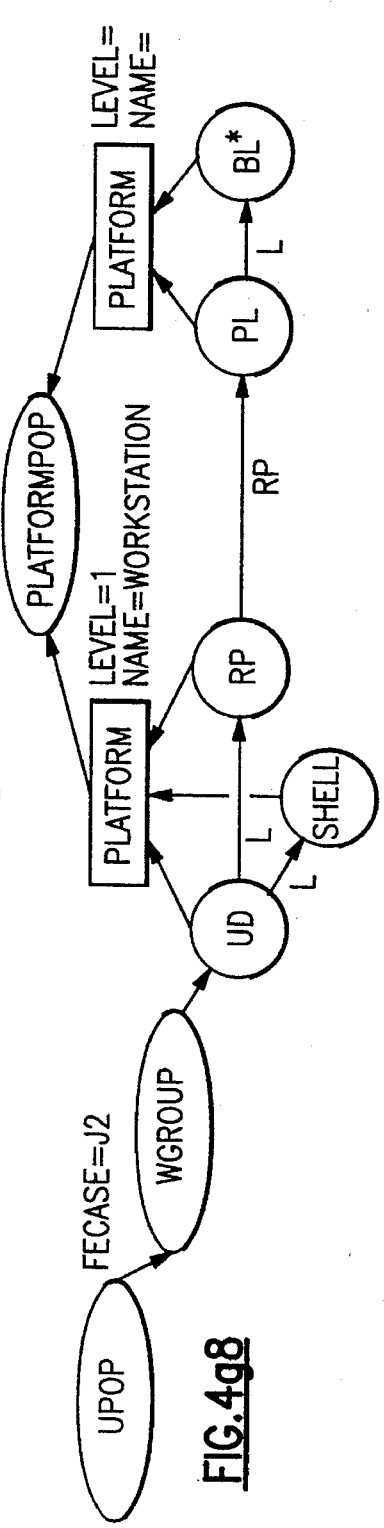
FIG.4g8

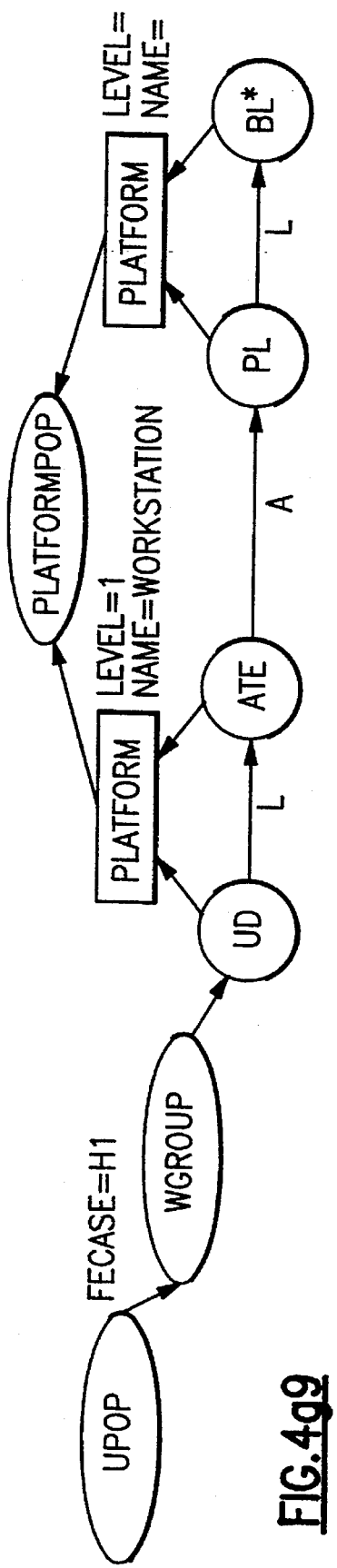
FIG.4g9
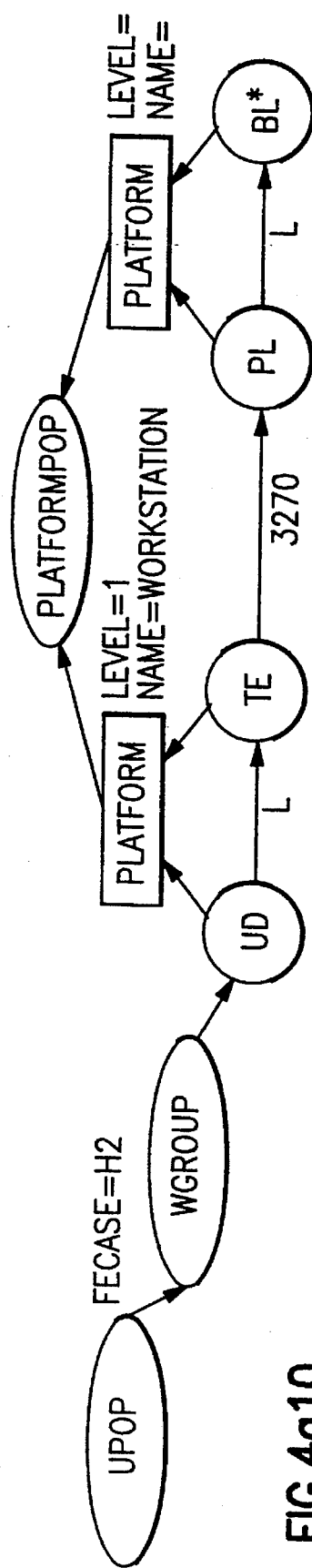
FIG.4g10

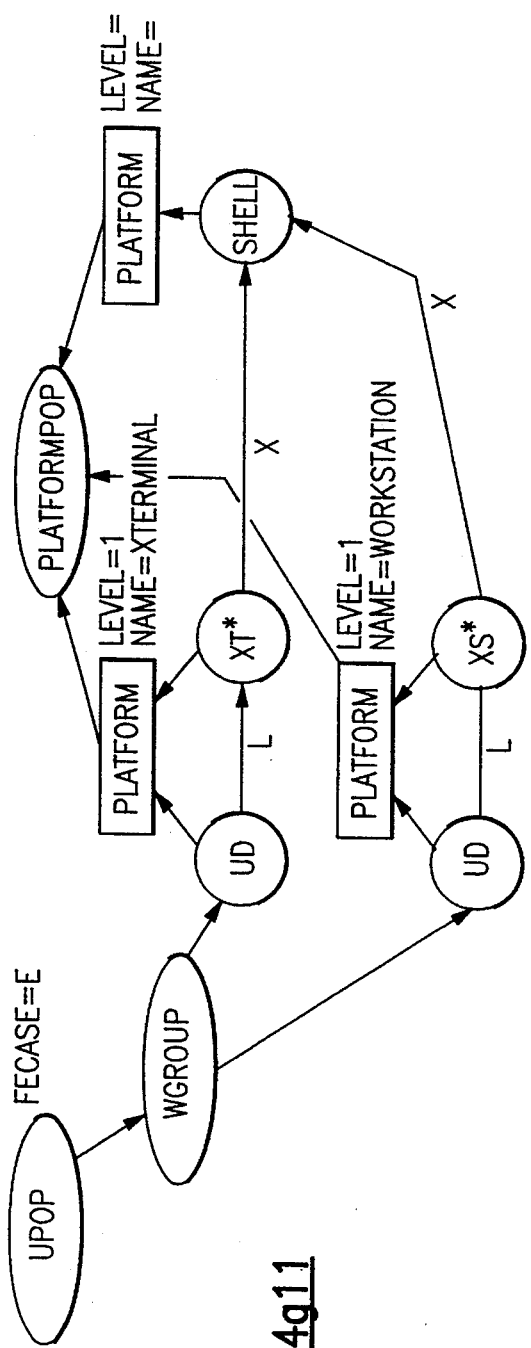
FIG.4g11
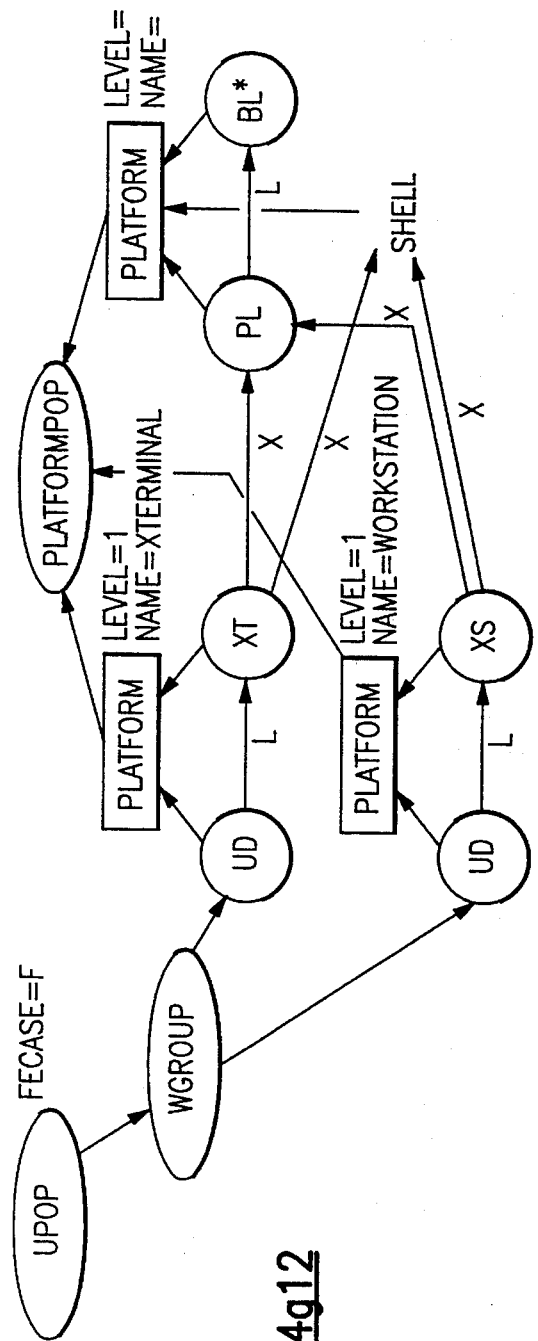
FIG.4g12

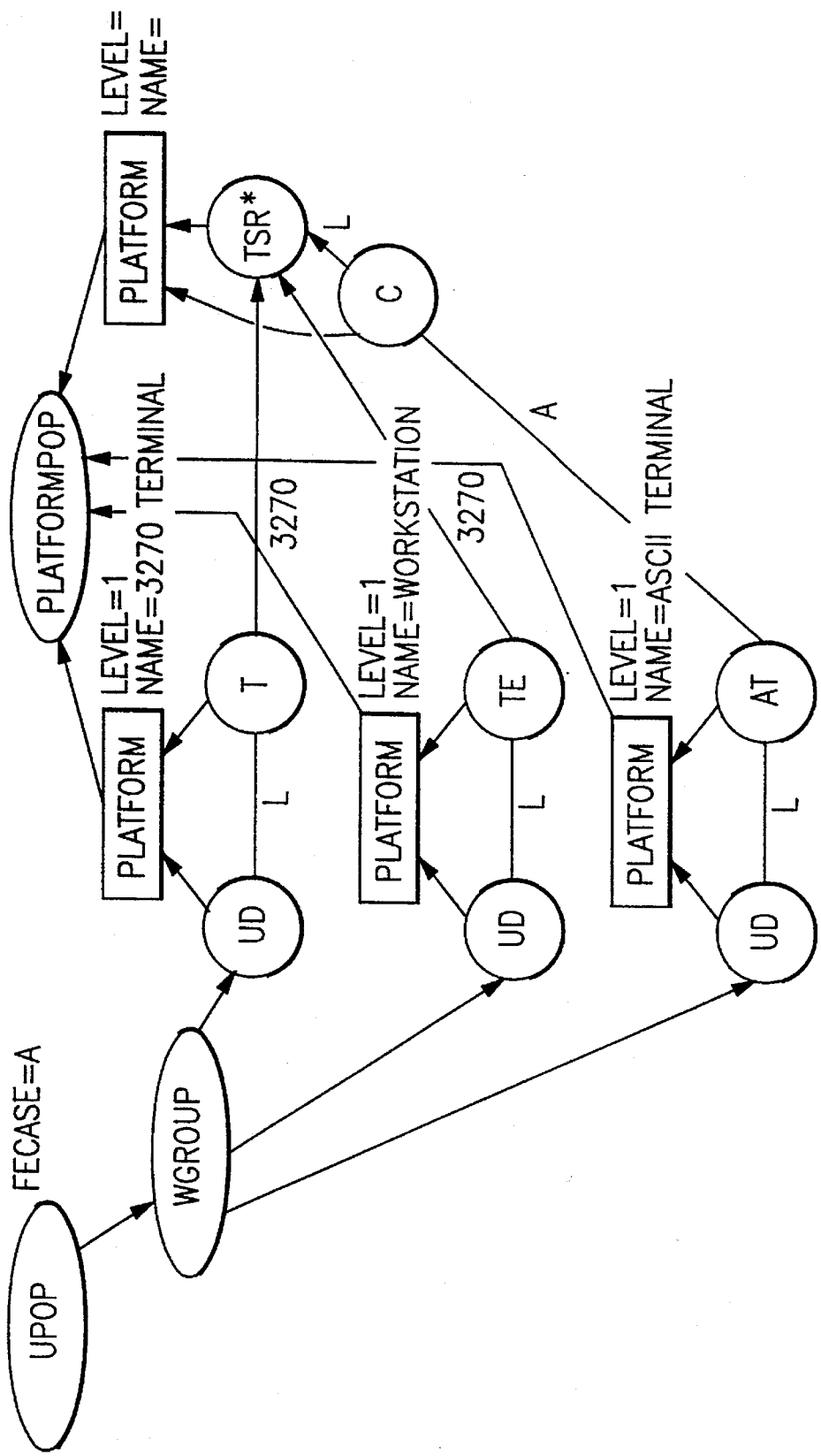
FIG.4g13

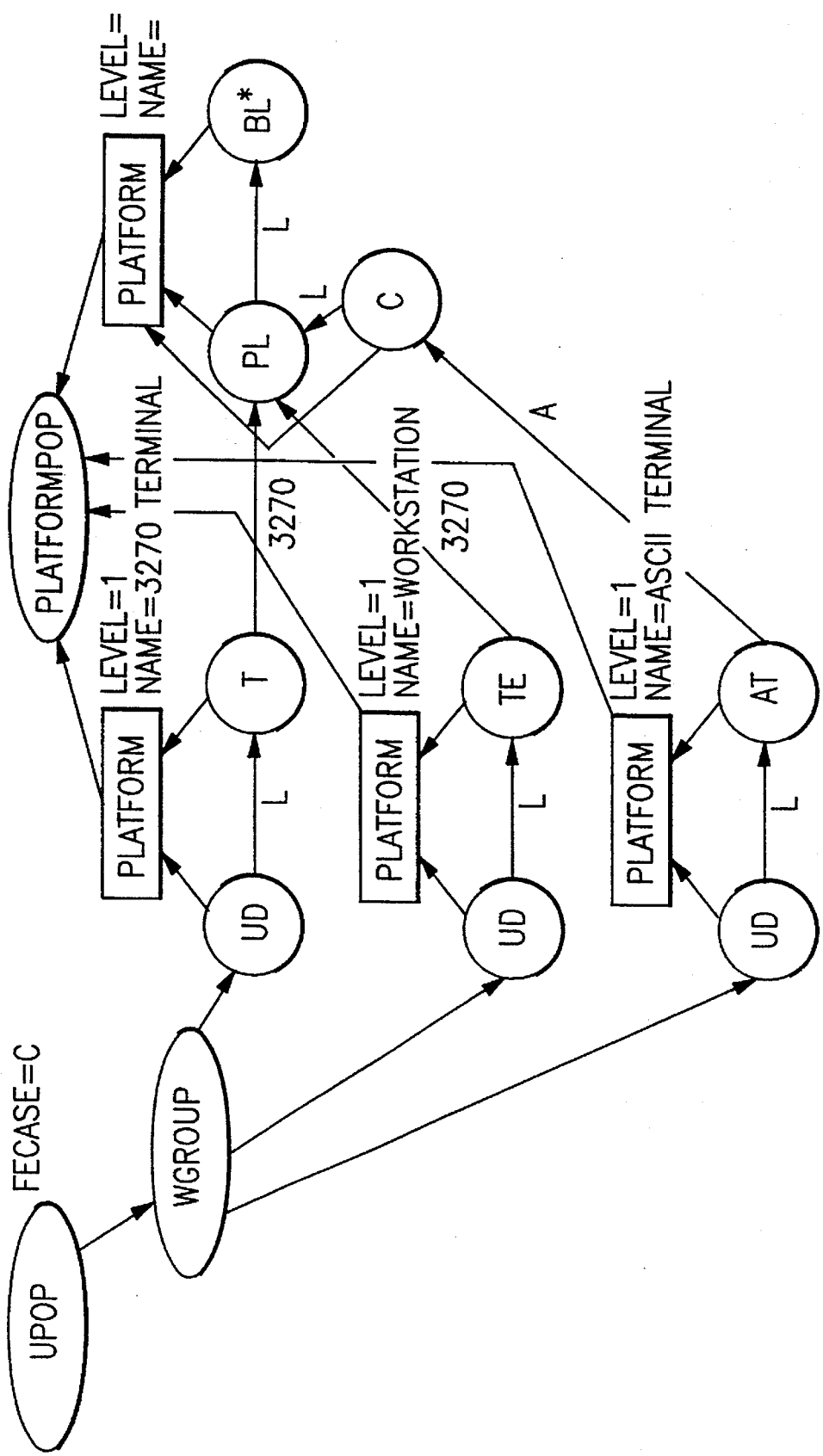
FIG.4g14

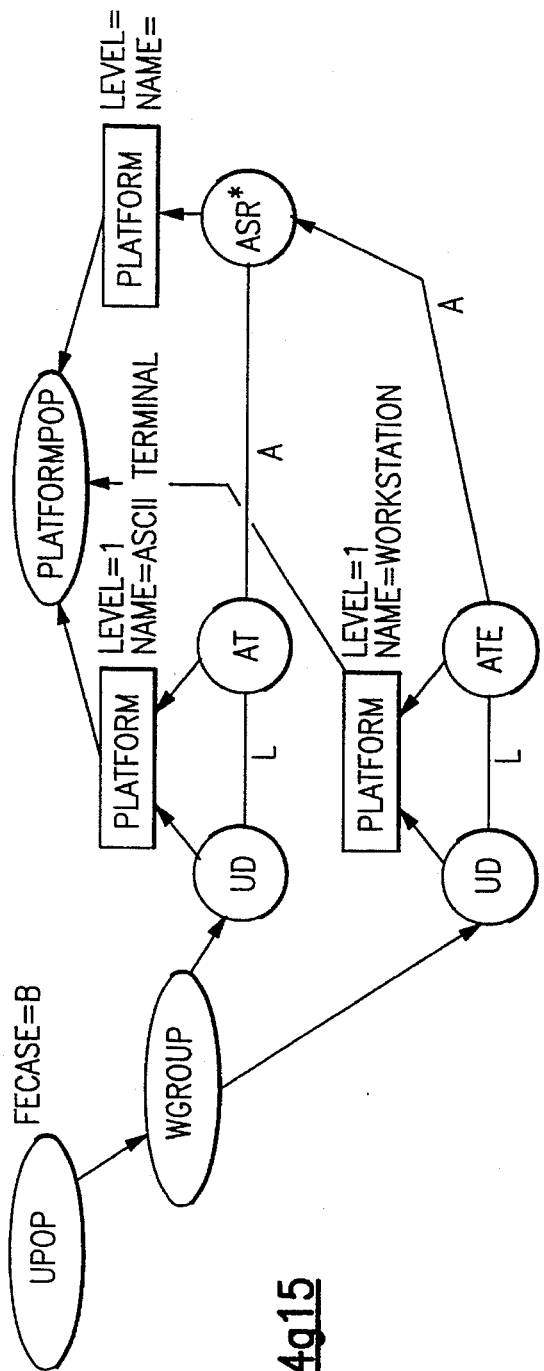
FIG.4g15
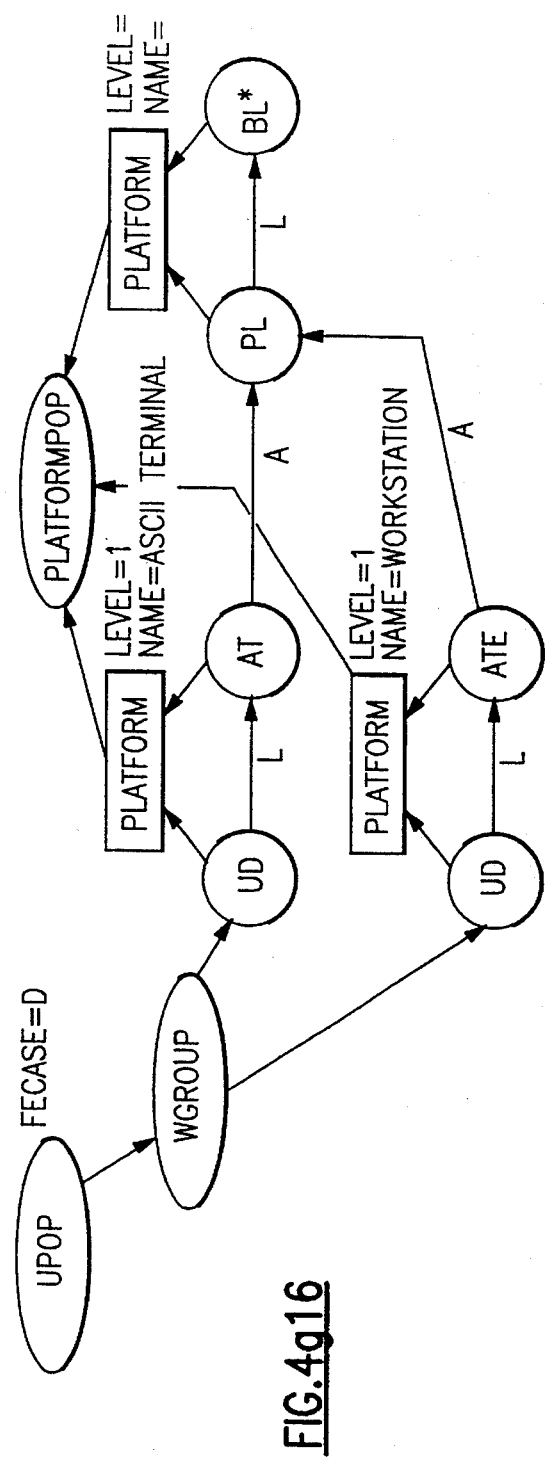
FIG.4g16

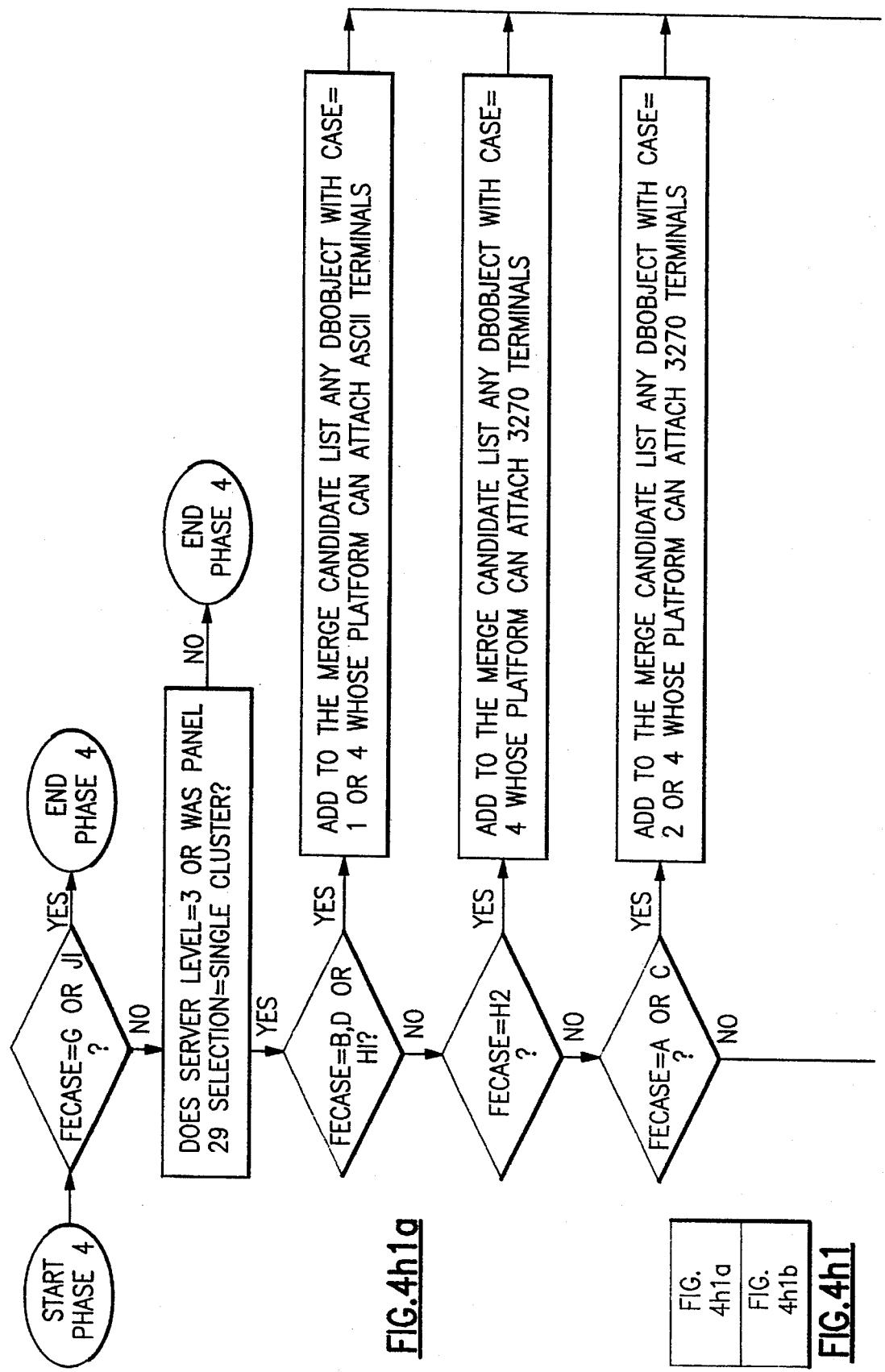
FIG.4h1a
FIG.4h1

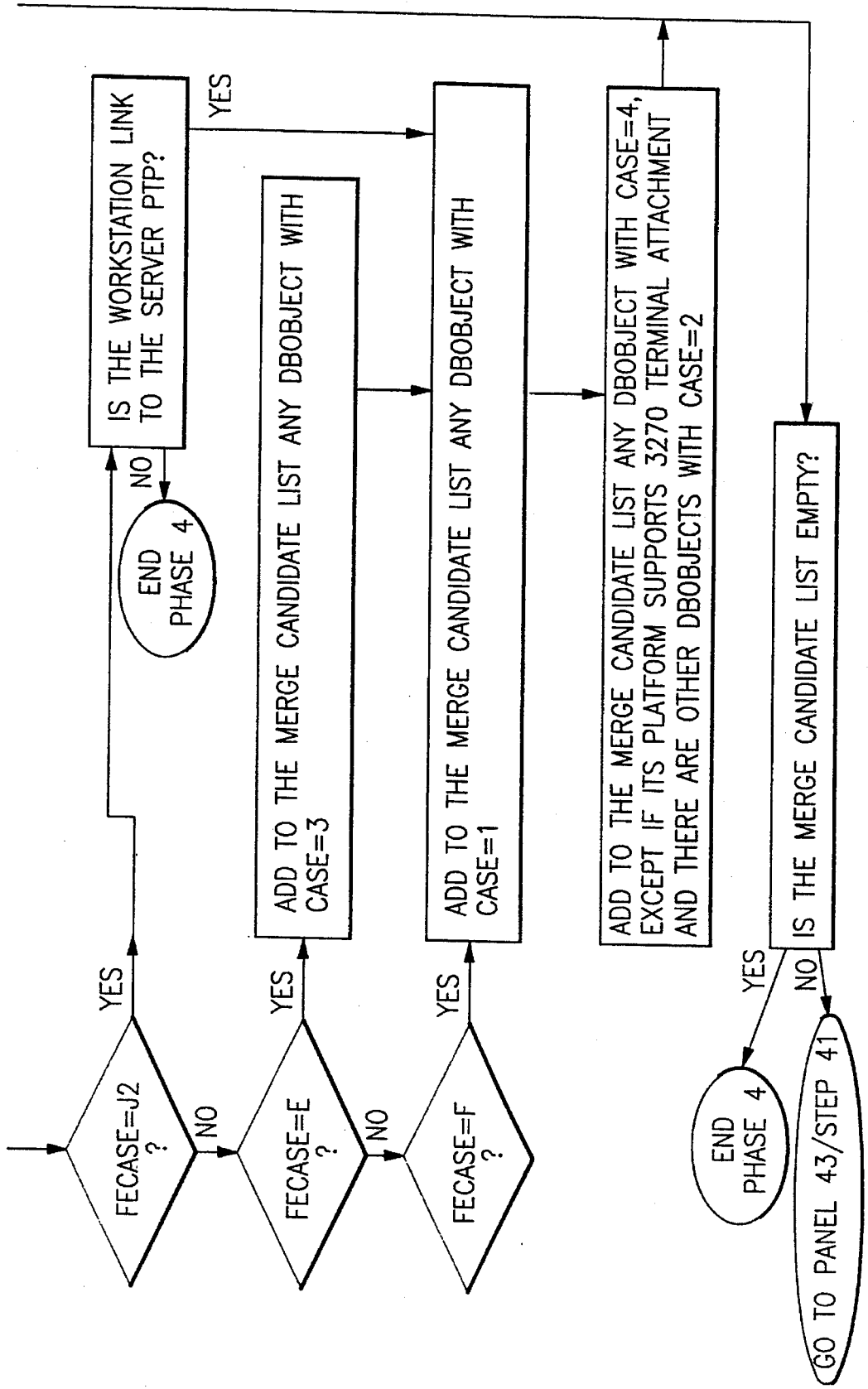
FIG.4h1b

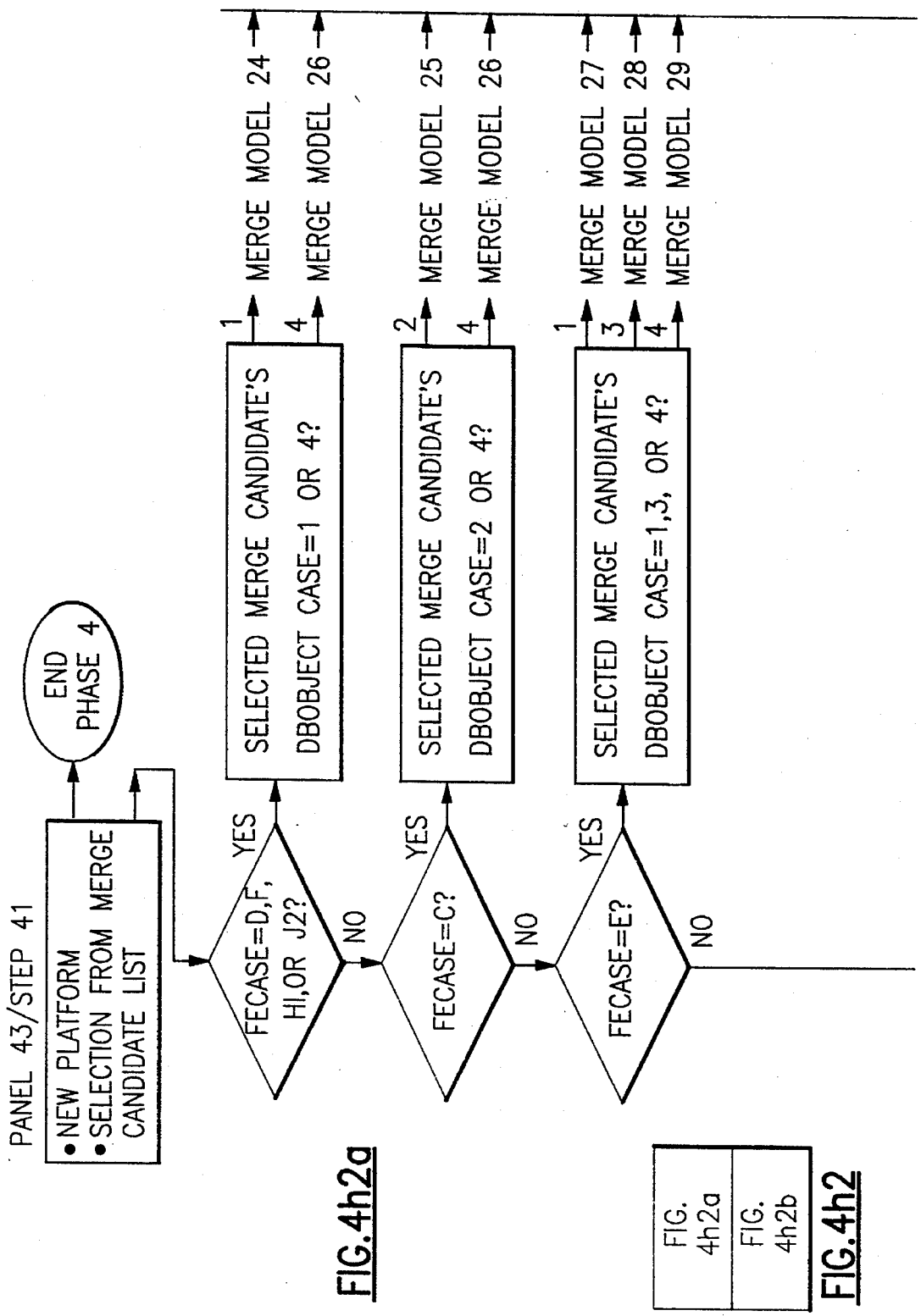
FIG.4h2a
FIG.4h2

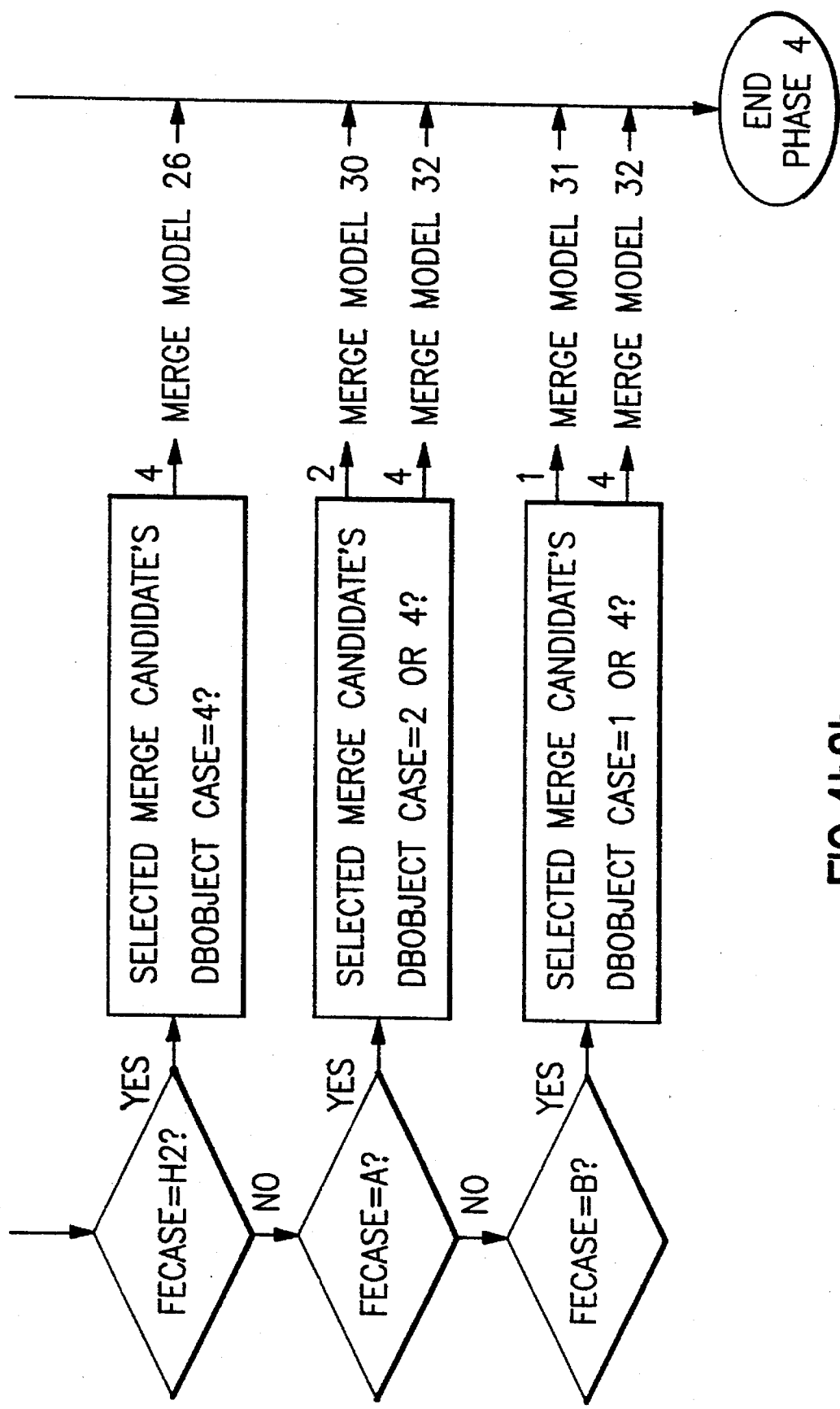
FIG.4h2b

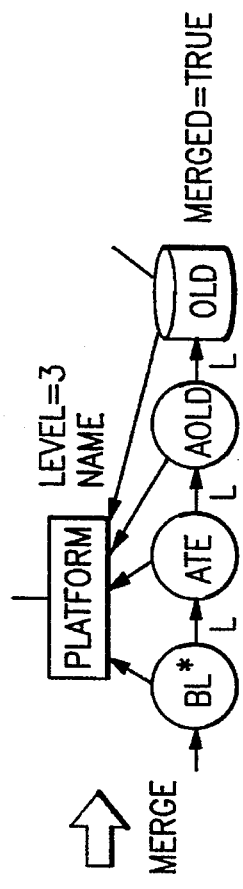
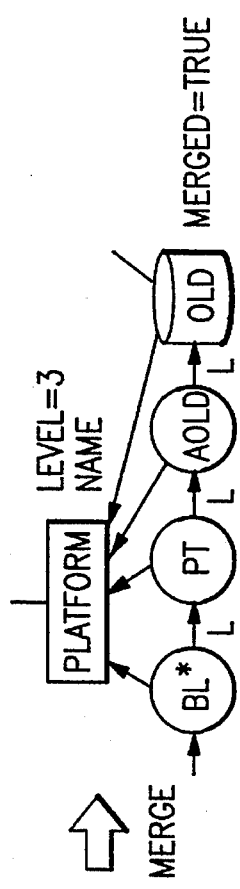
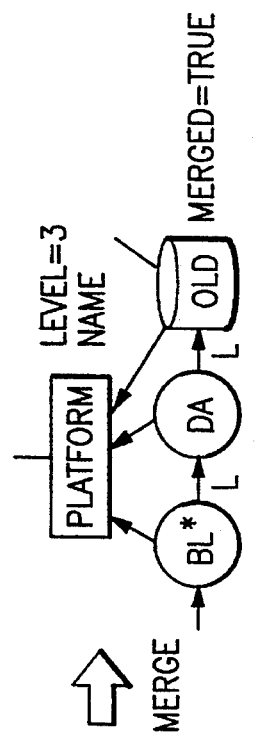
FIG.4i1    FIG.4i2    FIG.4i3
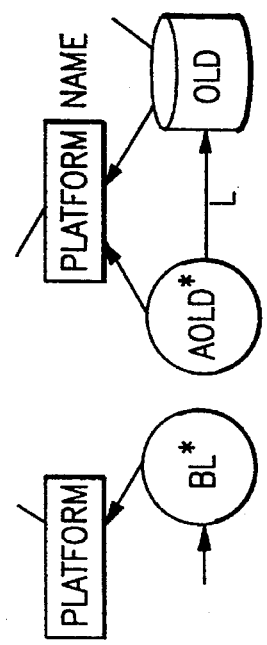
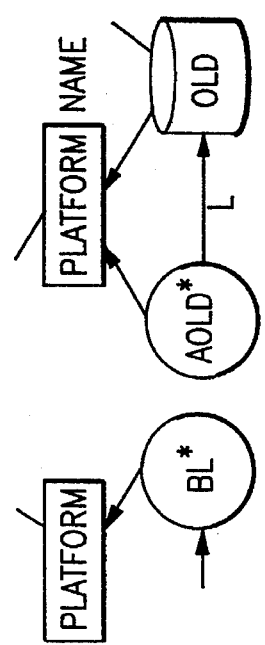
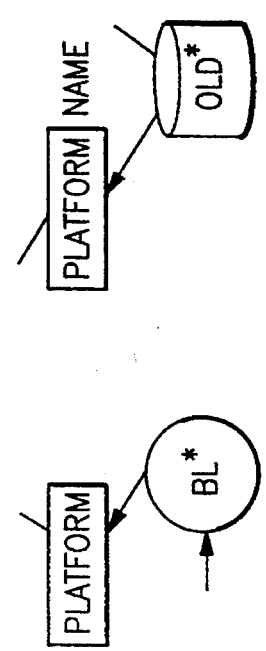

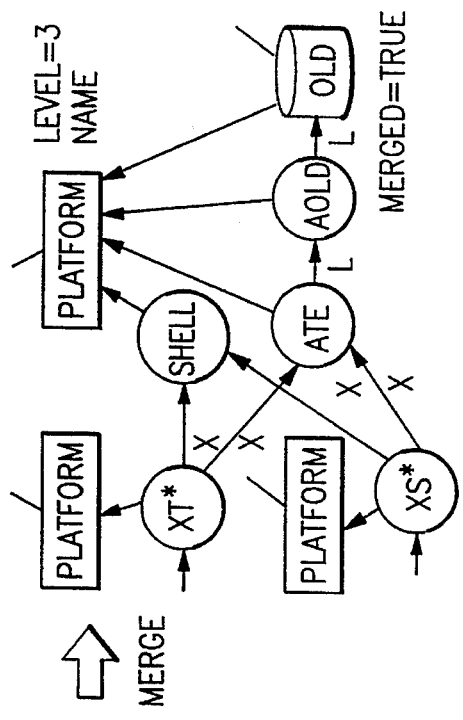
FIG.4i4
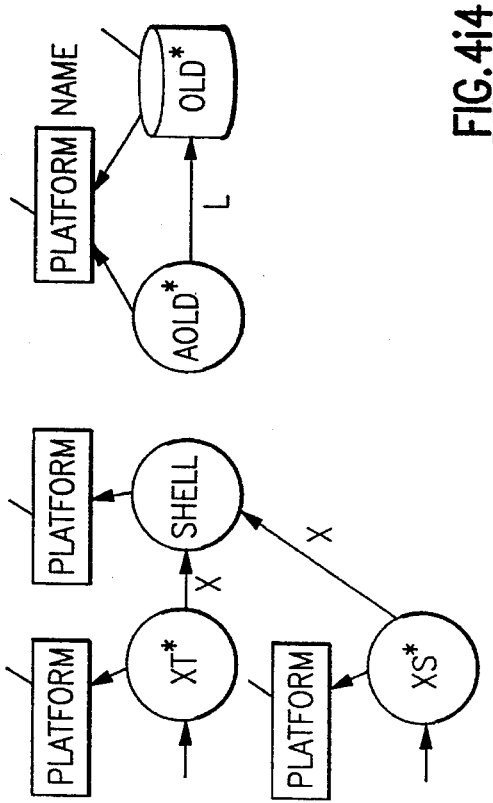
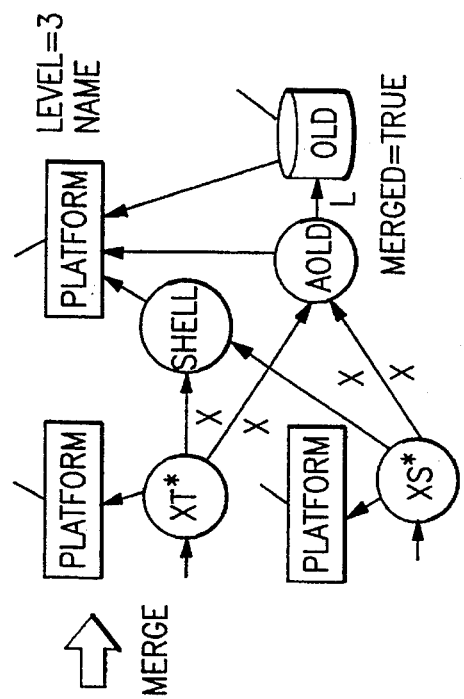
FIG.4i5
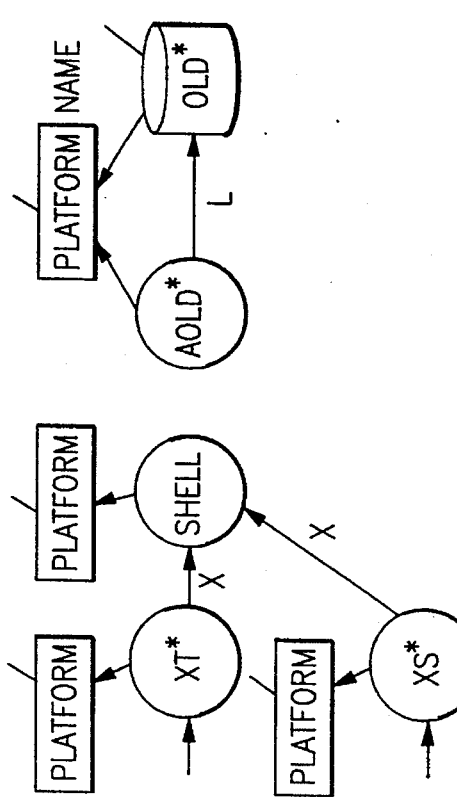

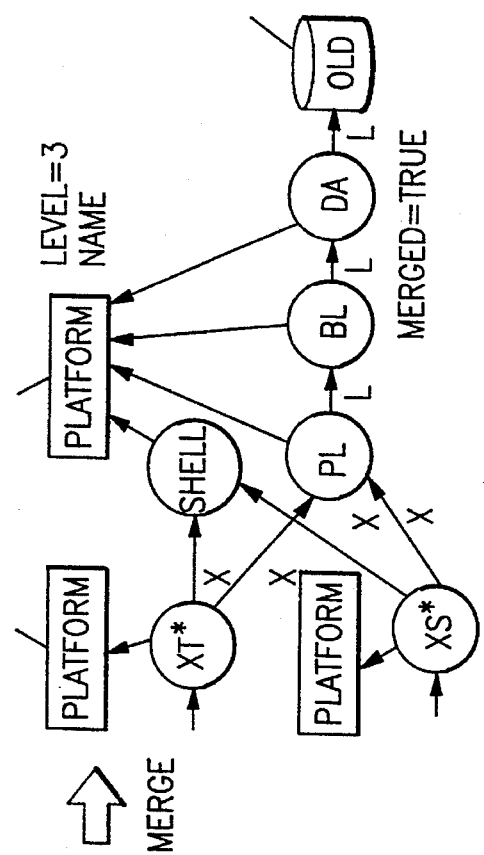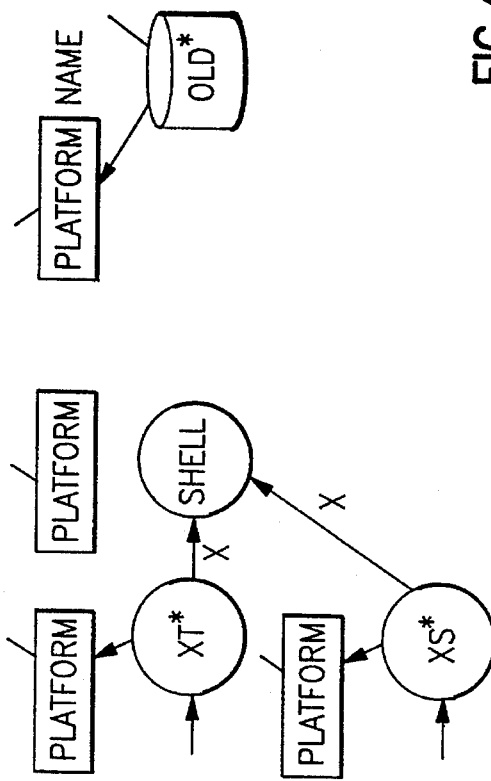
FIG.4i6
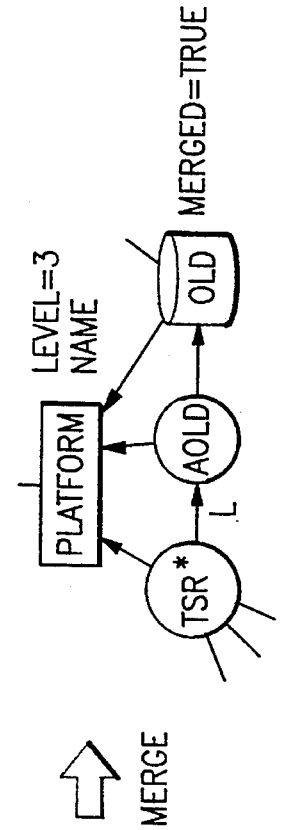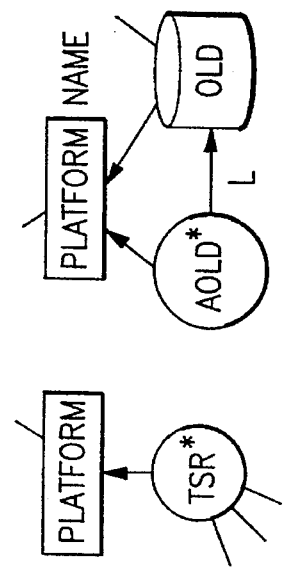
FIG.4i7

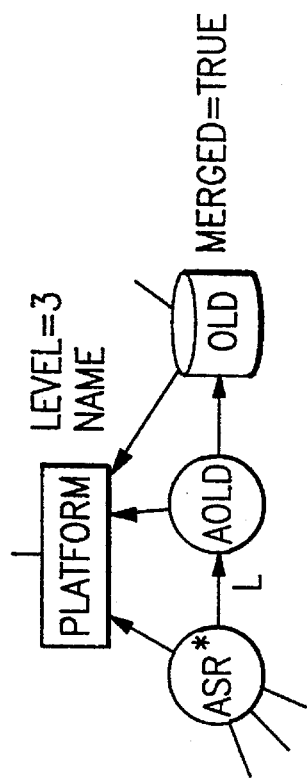
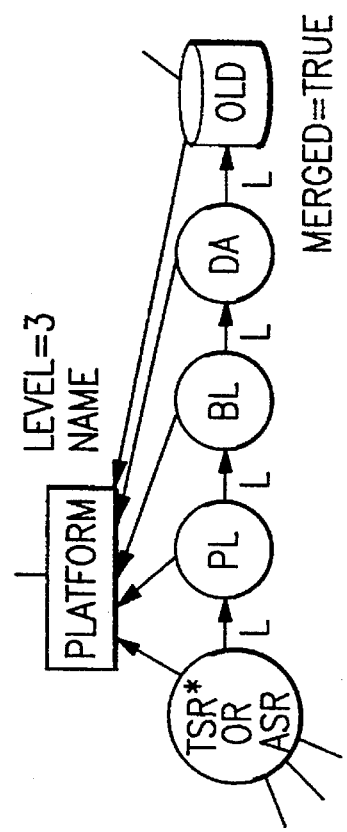
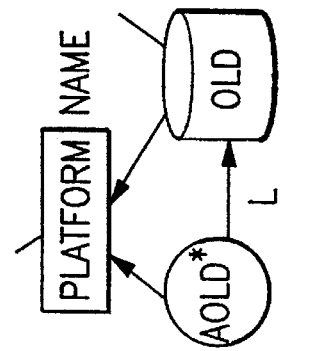
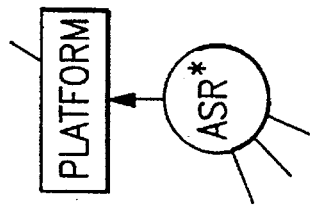
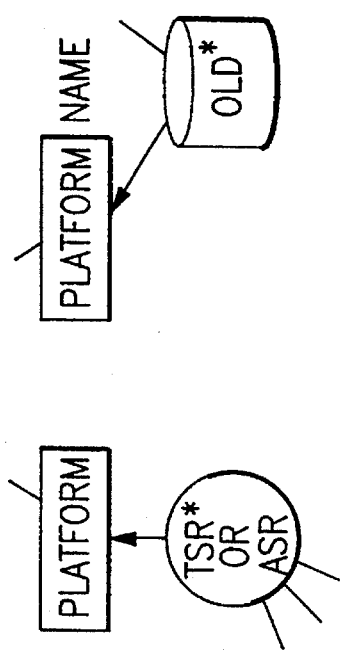
FIG. 4i8
FIG. 4i9

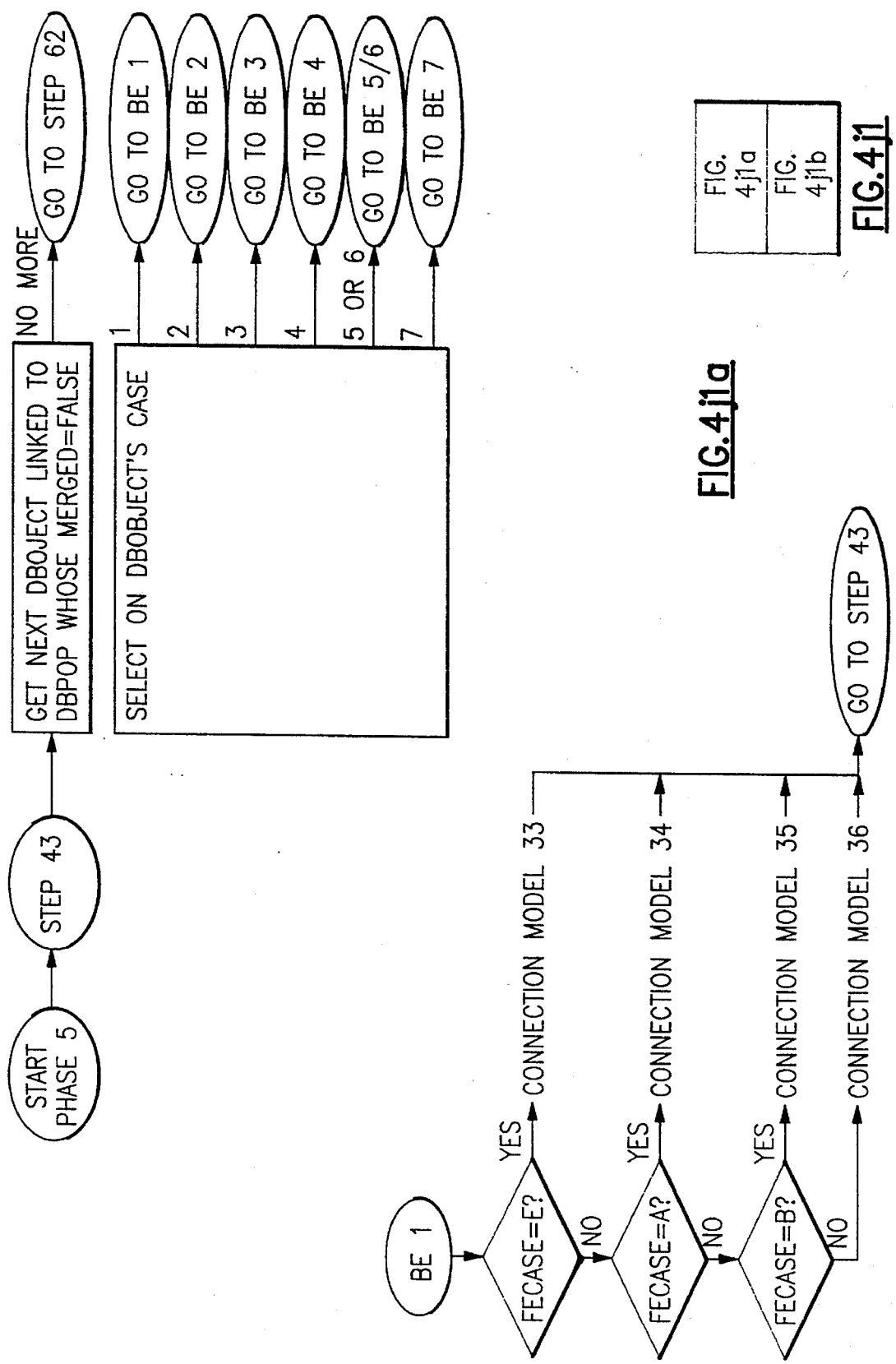

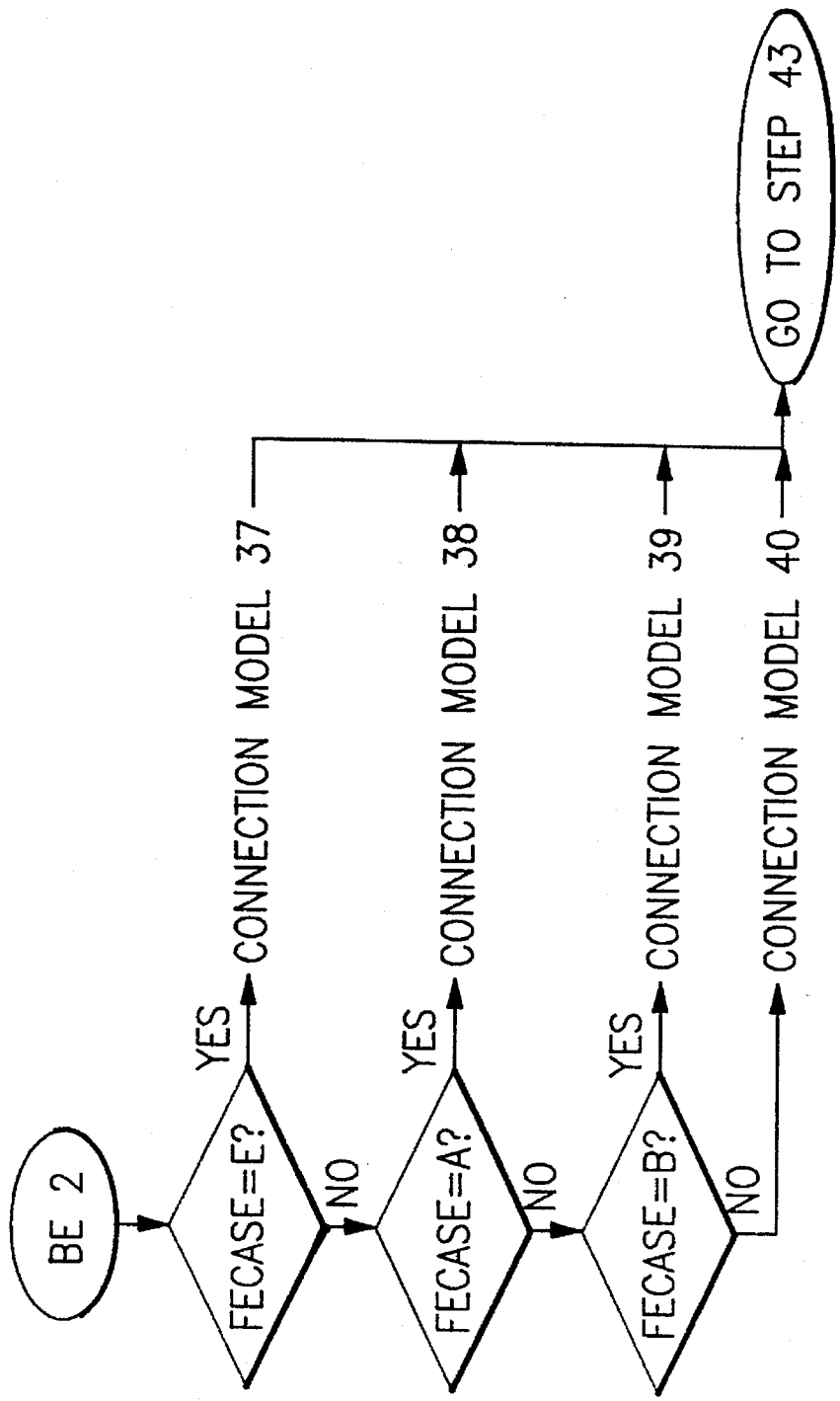
FIG.4j1b

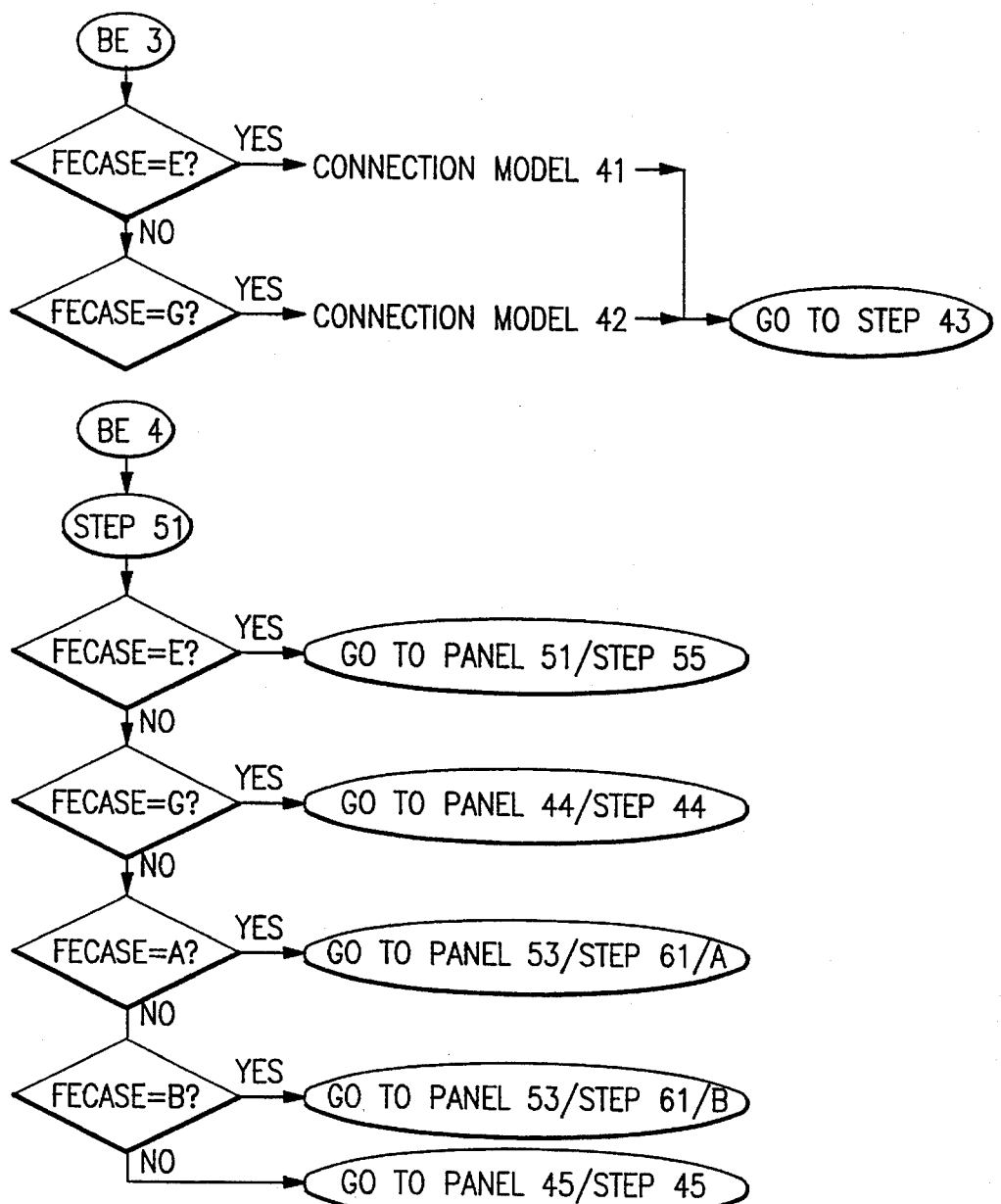
FIG.4j2

FIG. 4i3

PANEL 44/STEP 44
- X IN A WINDOW[3]
- REMOTE PRESENTATION IN A WINDOW[2]
- ASCII TERMINAL IN A WINDOW[1]
- 3270 TERMINAL IN A WINDOW[1]

→ CONNECTION MODEL 47
→ CONNECTION MODEL 48
→ CONNECTION MODEL 49
→ CONNECTION MODEL 50 → GO TO STEP 43

PANEL 53/STEP 61A
- ROUTE ASCII SESSION[5]
- ROUTE 3270 SESSION[6]
- RESOURCE CENTRIC
- DISTRIBUTED LOGIC

→ CONNECTION MODEL 51
→ CONNECTION MODEL 52
→ CONNECTION MODEL 53
→ CONNECTION MODEL 54 → GO TO STEP 43

PANEL 53/STEP 61B
- ROUTE ASCII SESSION[5]
- ROUTE 3270 SESSION[6]
- RESOURCE CENTRIC
- DISTRIBUTED LOGIC

→ CONNECTION MODEL 55
→ CONNECTION MODEL 56
→ CONNECTION MODEL 57
→ CONNECTION MODEL 58 → GO TO STEP 43

PANEL 45/STEP 45
- RESOURCE CENTRIC
- DISTRIBUTED LOGIC
- ASCII TERMINAL EMULATION[1]
- 3270 TERMINAL EMULATION[2]

→ CONNECTION MODEL 59
→ CONNECTION MODEL 60
→ CONNECTION MODEL 61
→ CONNECTION MODEL 62 → GO TO STEP 43

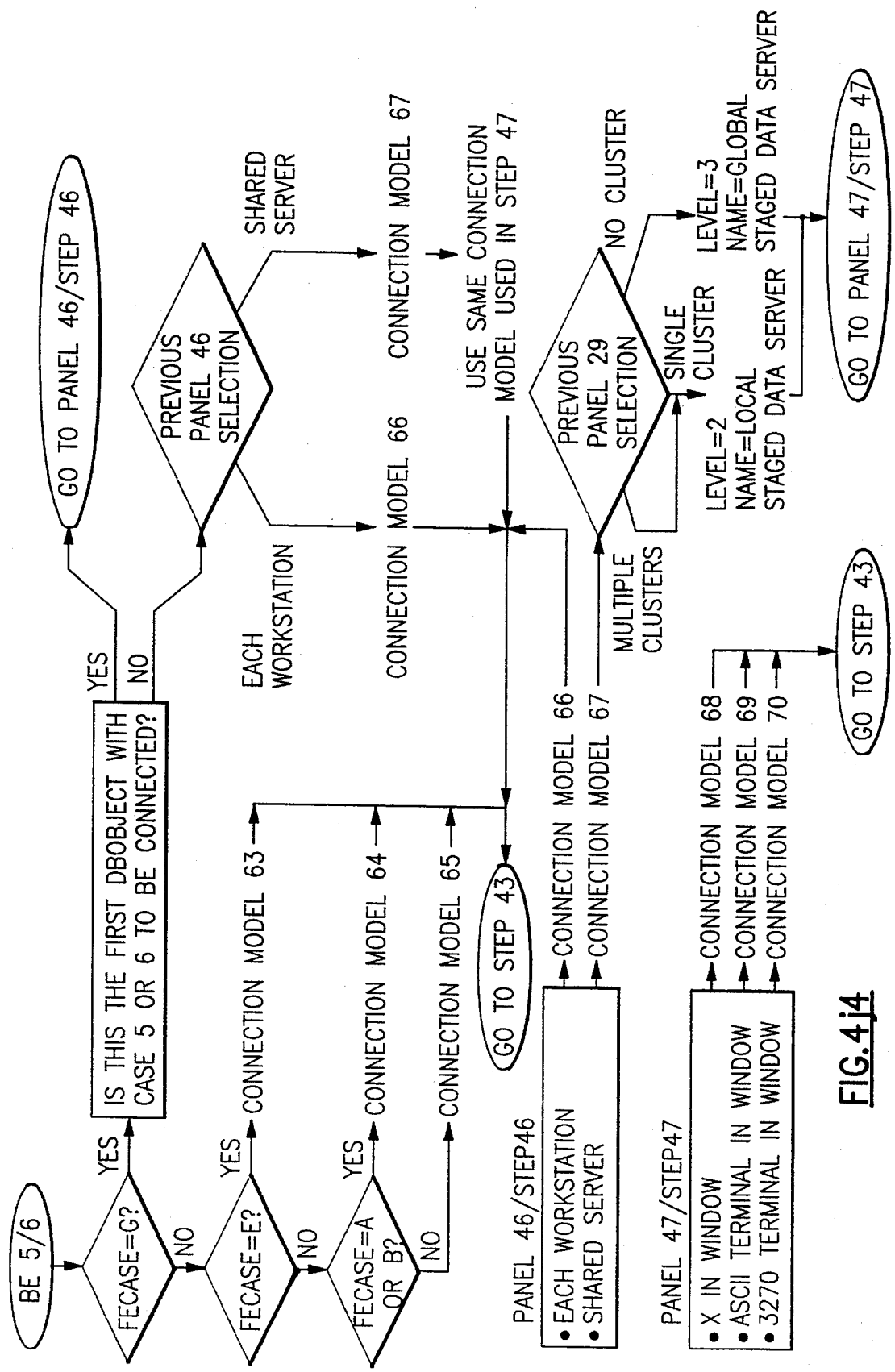
FIG.4i4

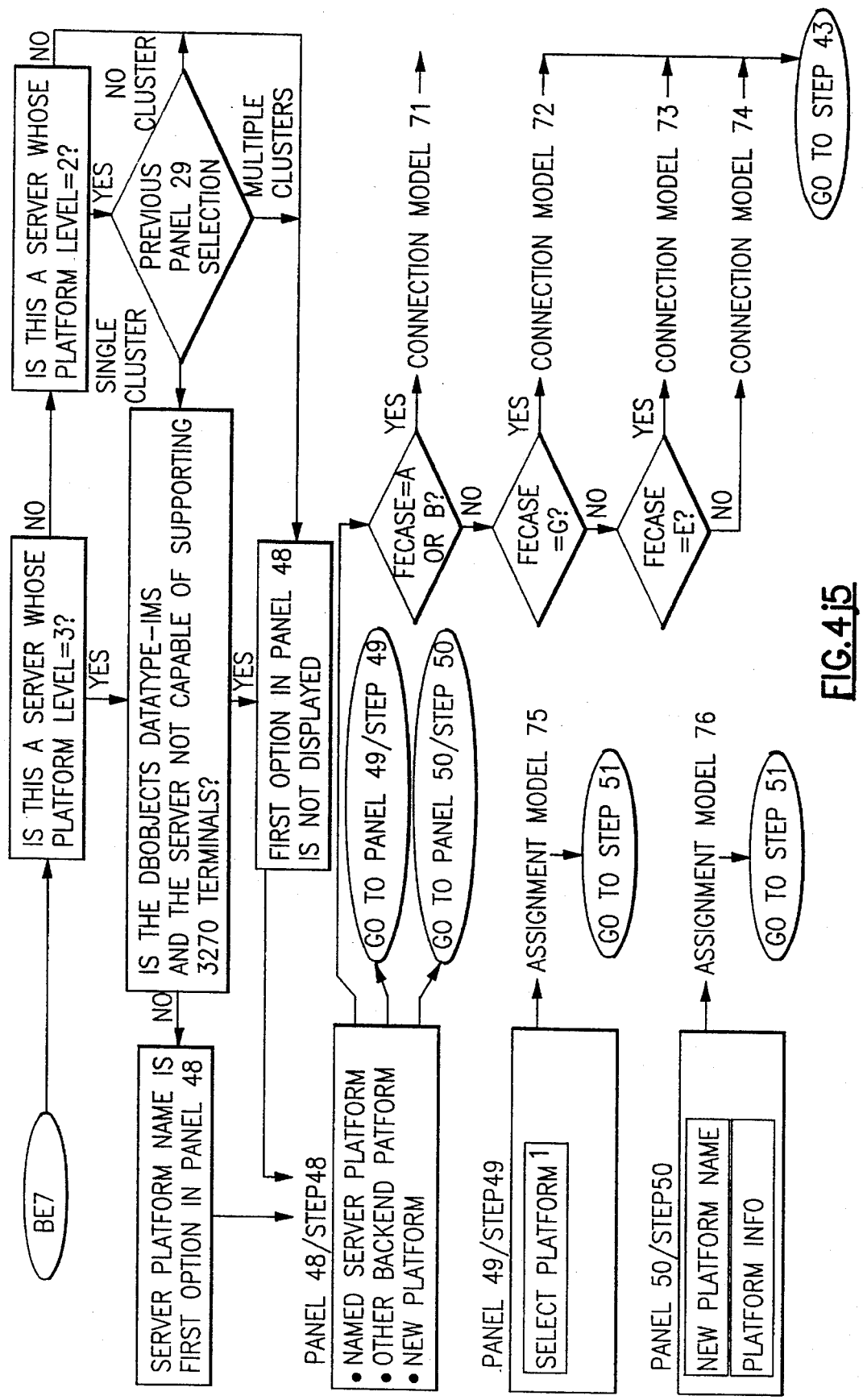
FIG.4i5

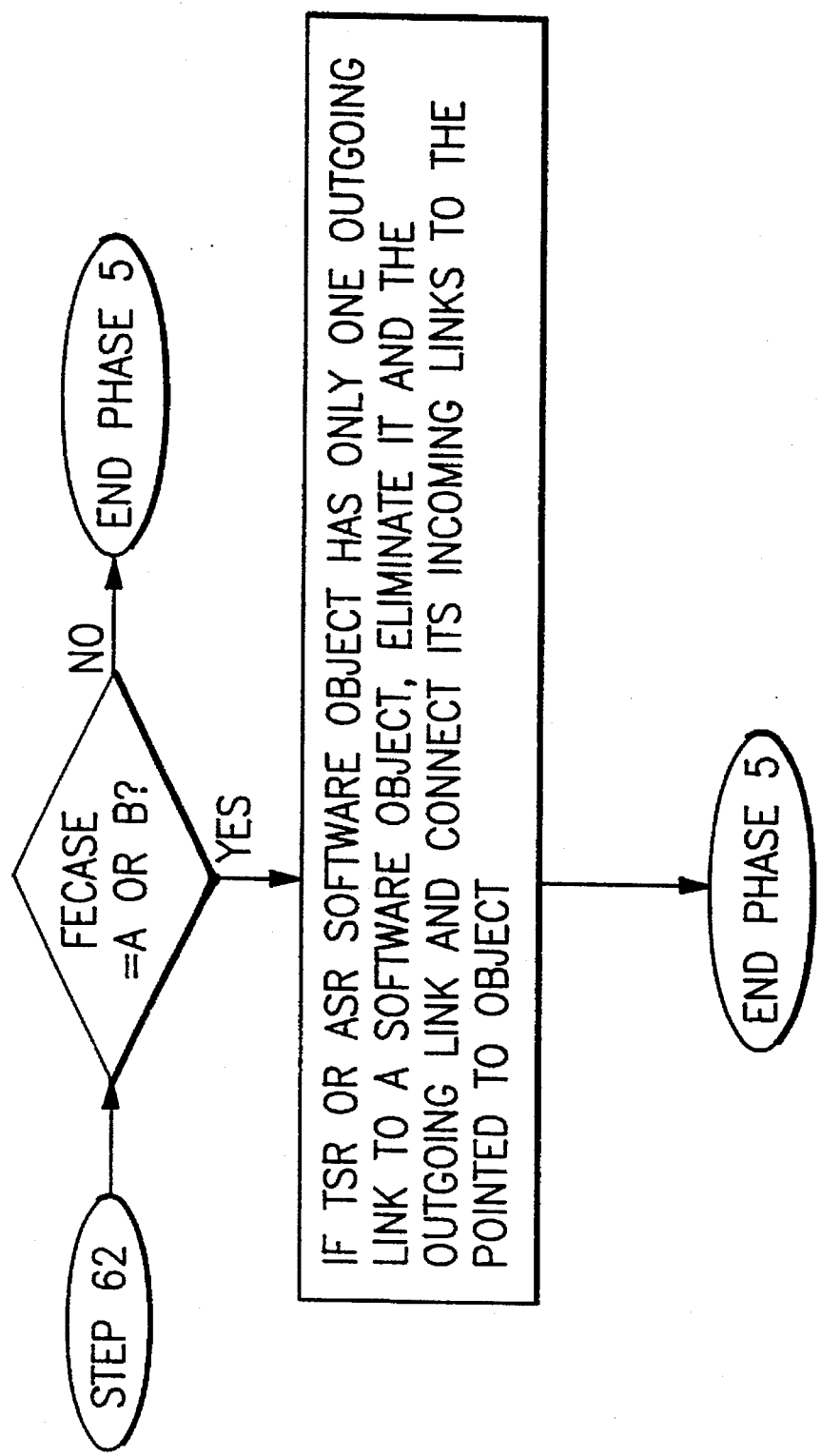
FIG.4j6

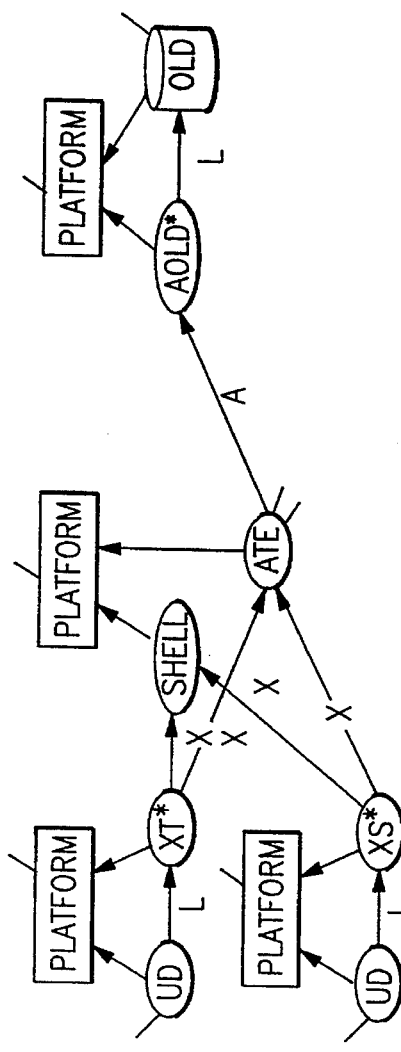
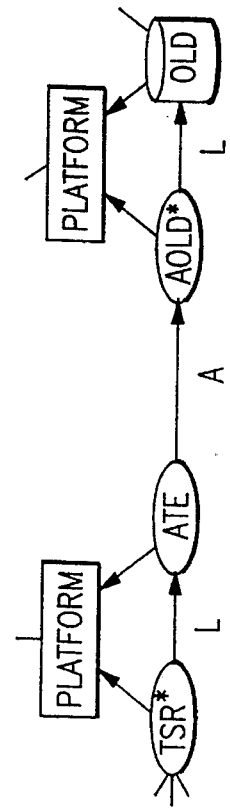
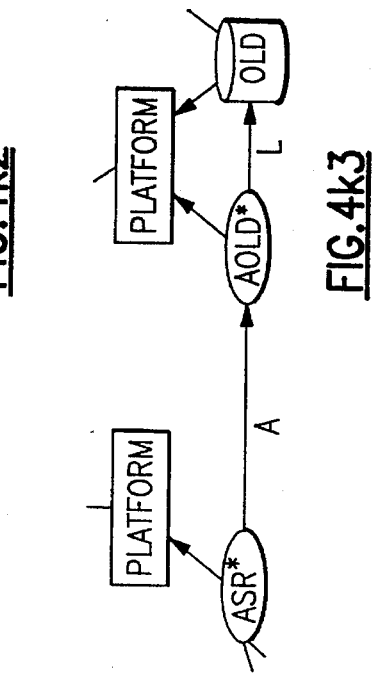
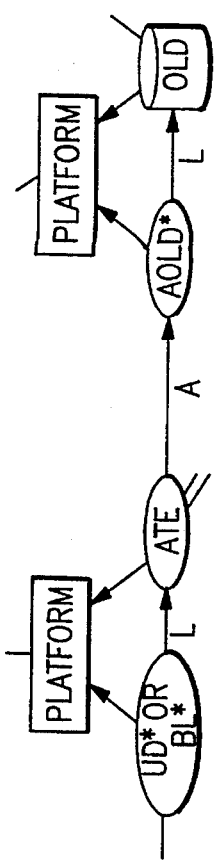
FIG.4k1
FIG.4k2
FIG.4k3
FIG.4k4

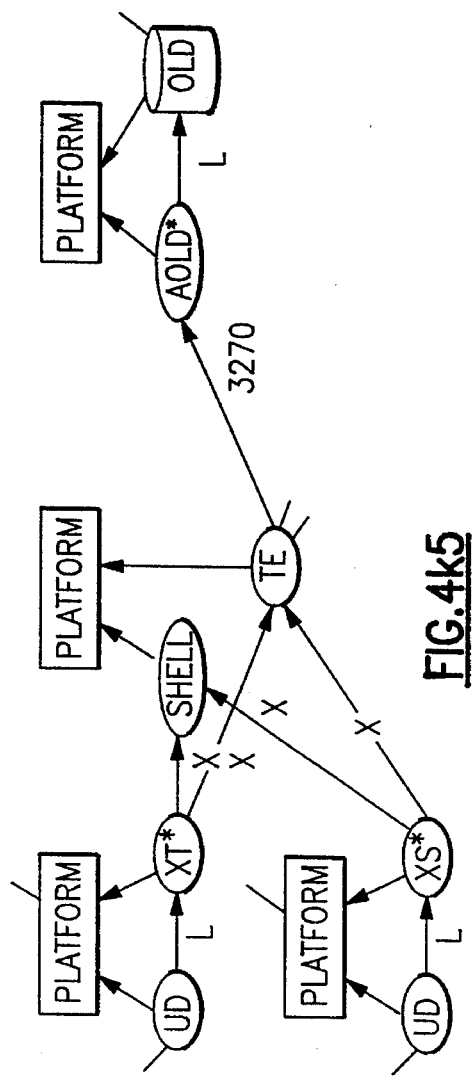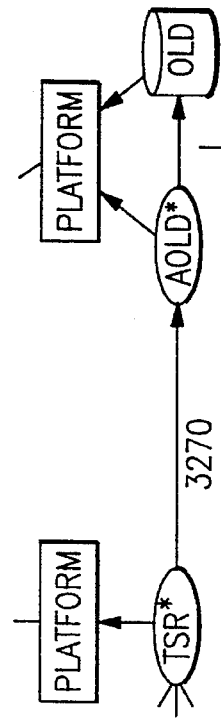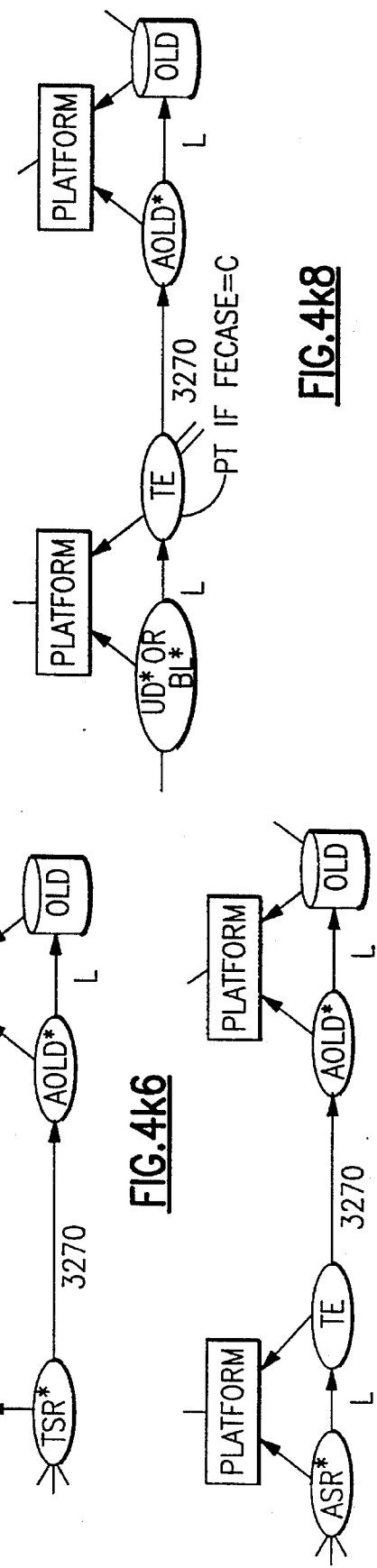

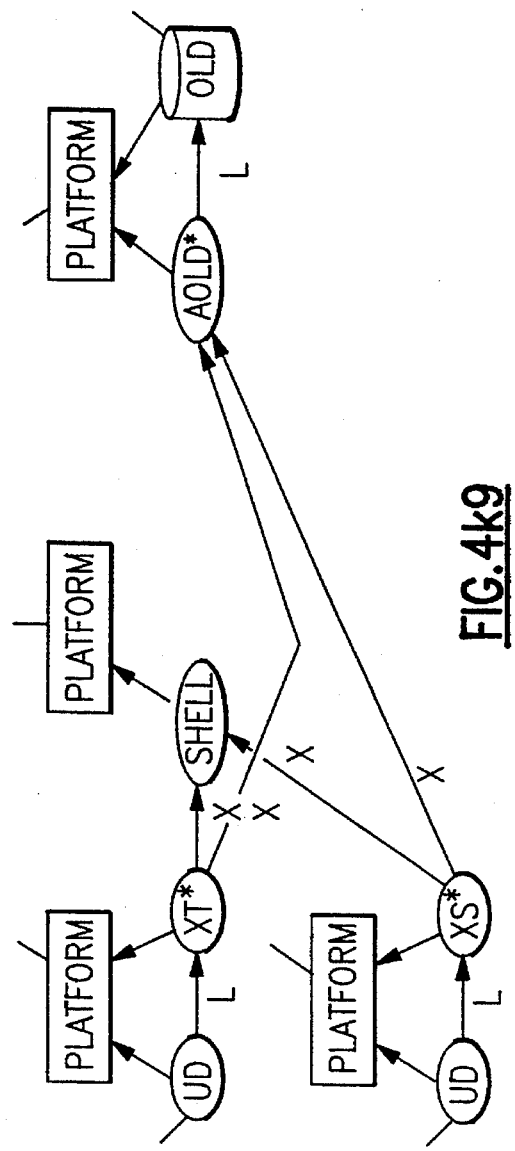
FIG. 4k9
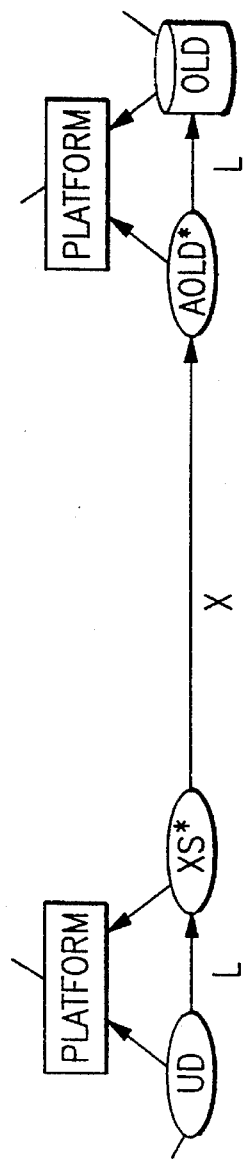
FIG. 4k10

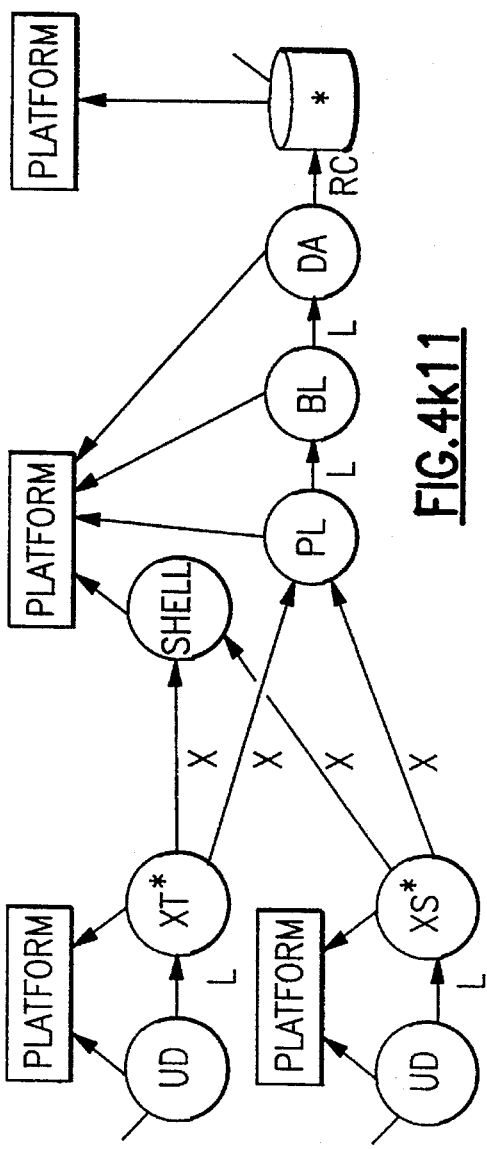
FIG.4k11
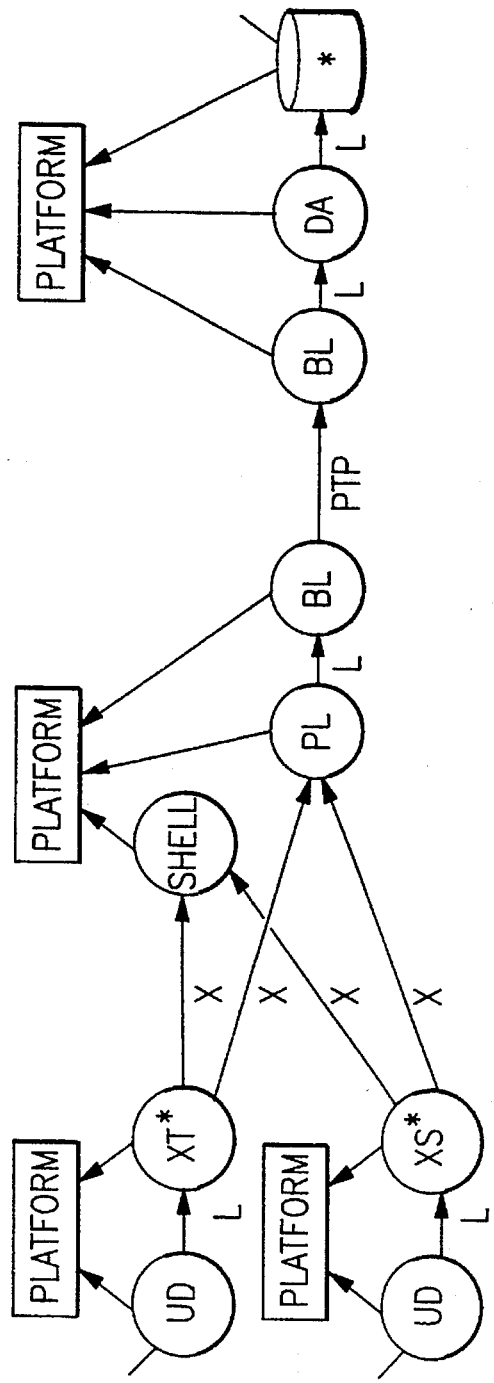
FIG.4k12

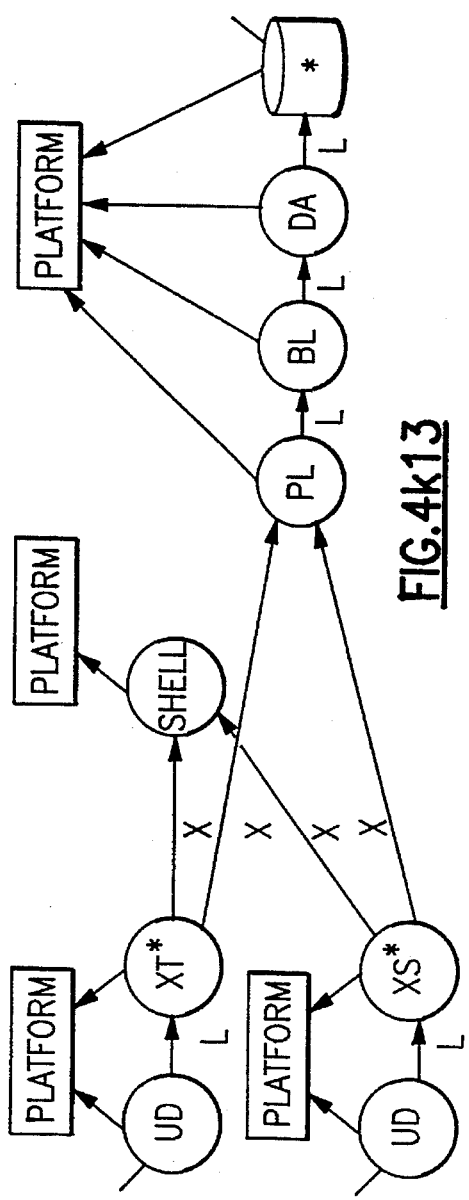
FIG.4k13
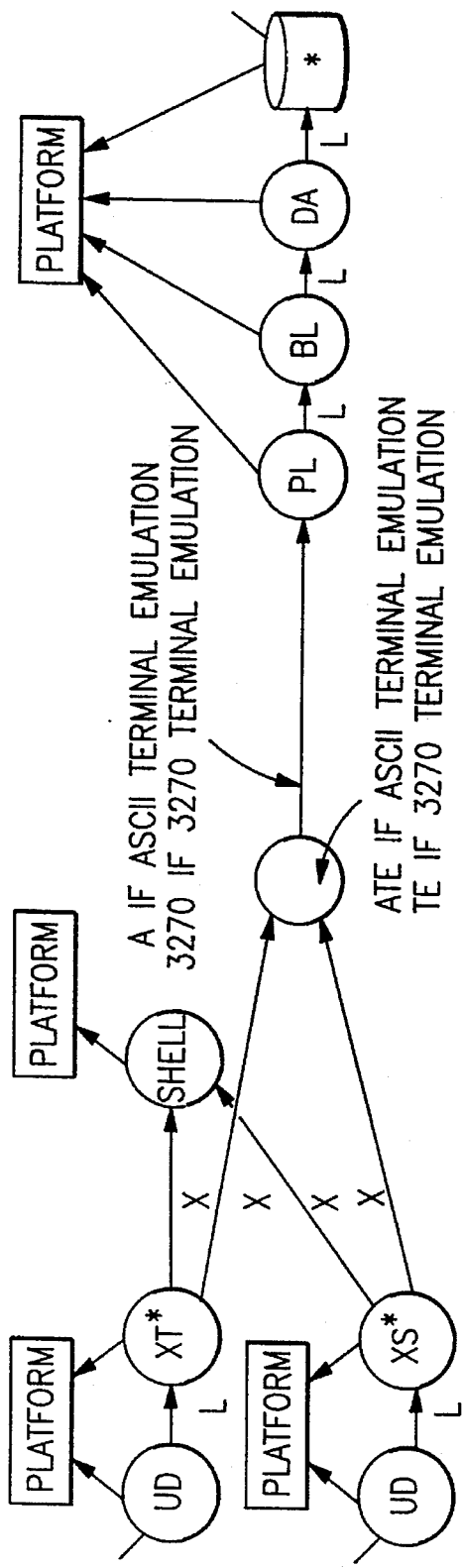
FIG.4k14

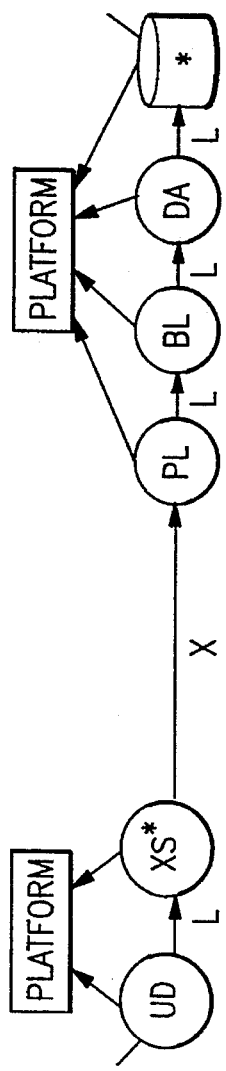
FIG.4k15
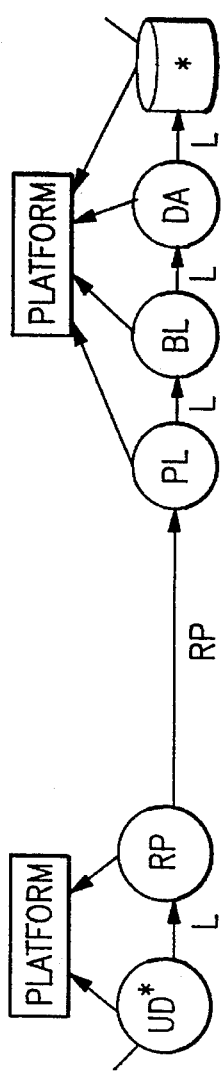
FIG.4k16
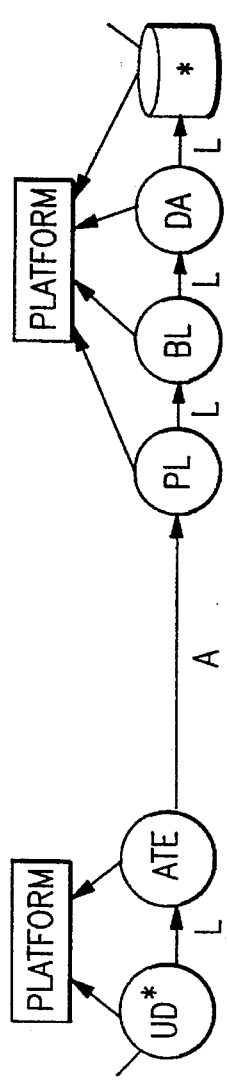
FIG.4k17
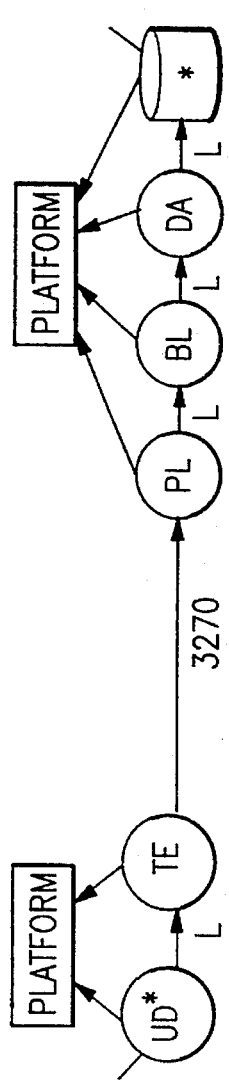
FIG.4k18

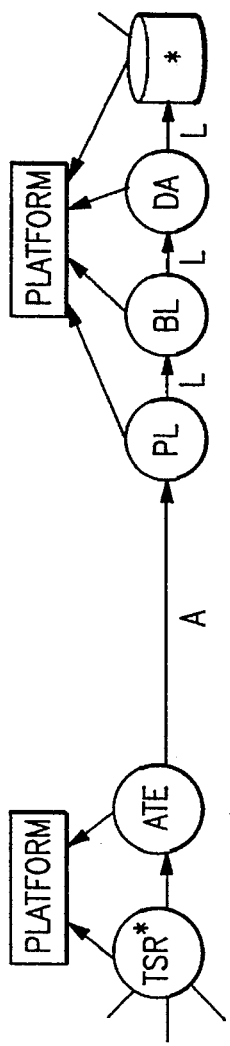
FIG.4k19
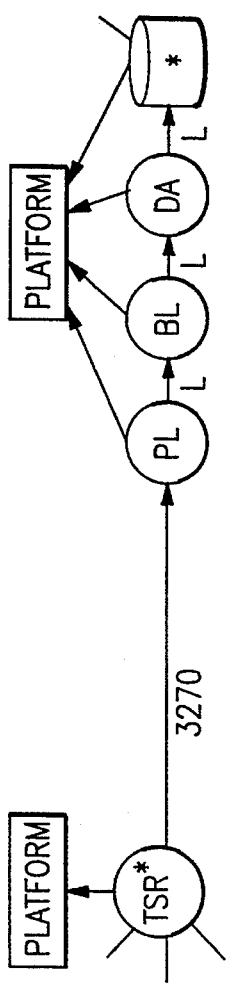
FIG.4k20
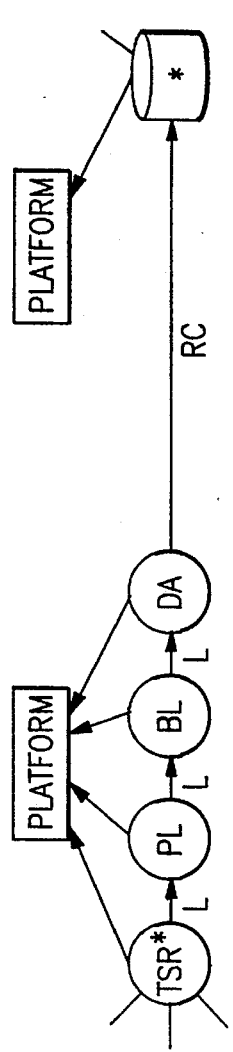
FIG.4k21
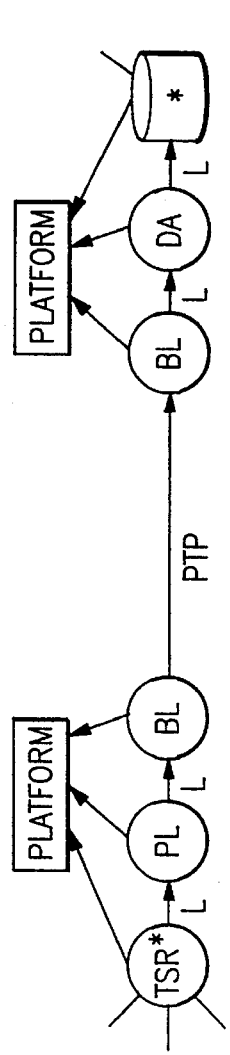
FIG.4k22

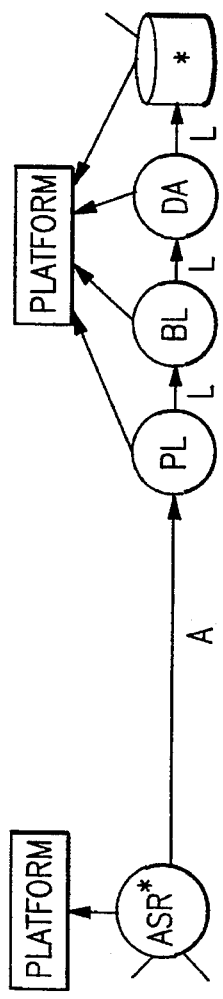
FIG.4k23
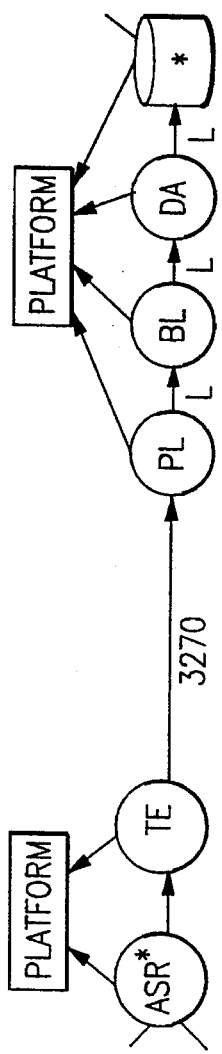
FIG.4k24
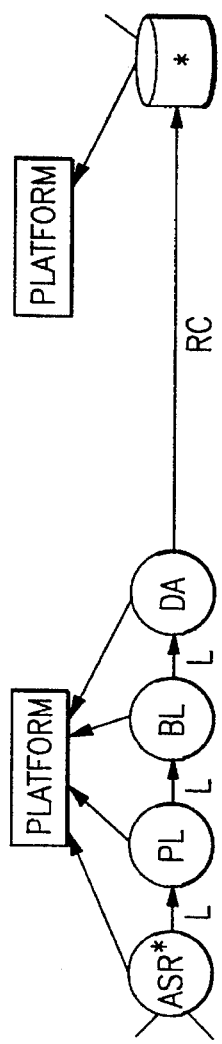
FIG.4k25
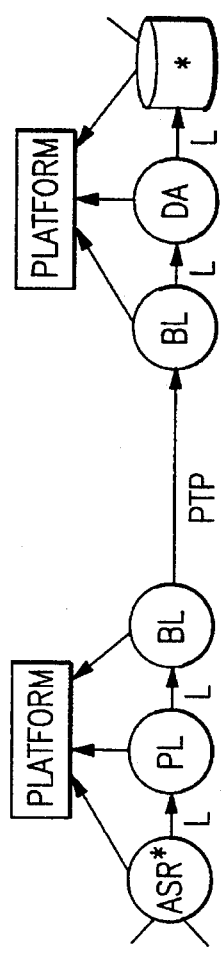
FIG.4k26

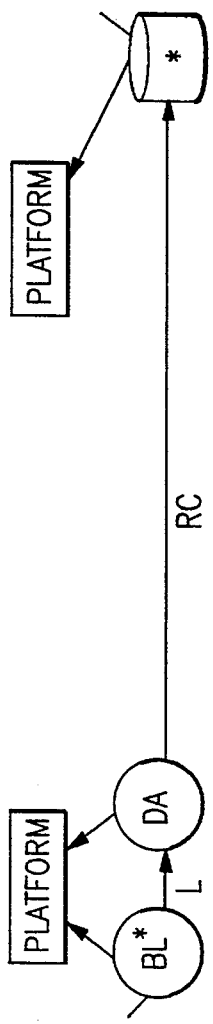
FIG.4k27
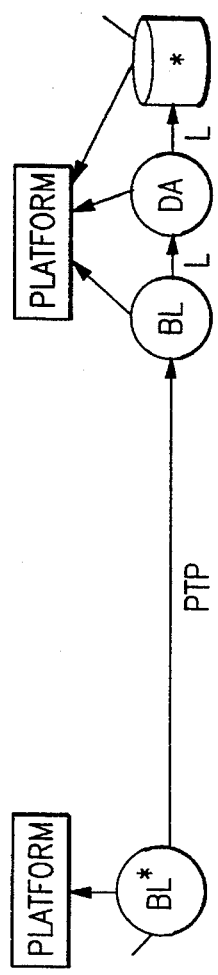
FIG.4k28
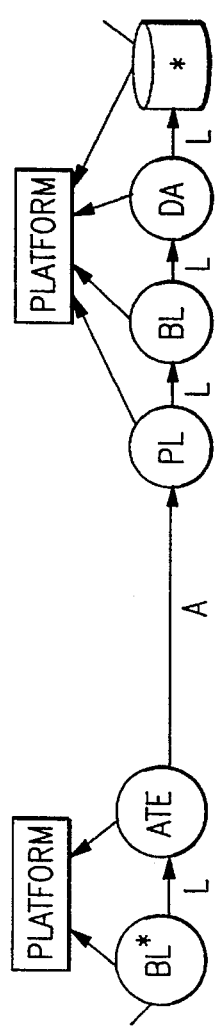
FIG.4k29
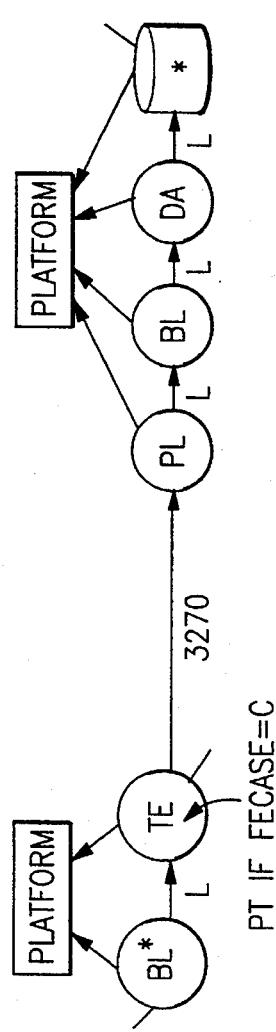
FIG.4k30

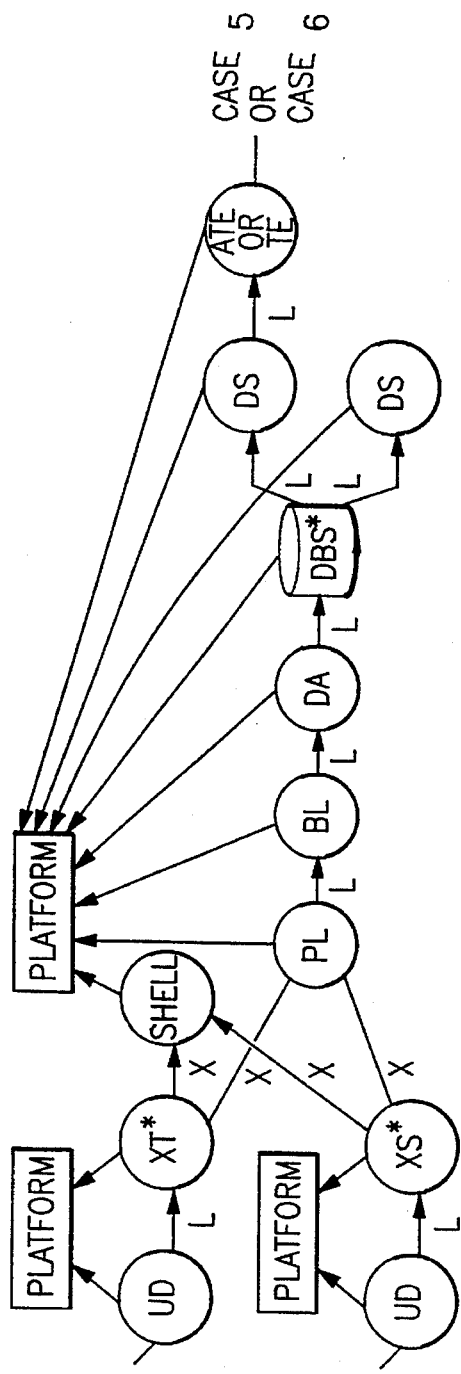
FIG.4k31
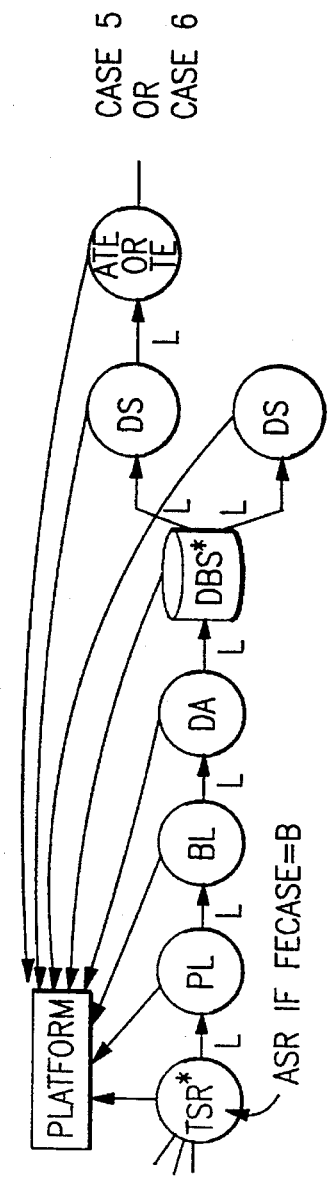
FIG.4k32
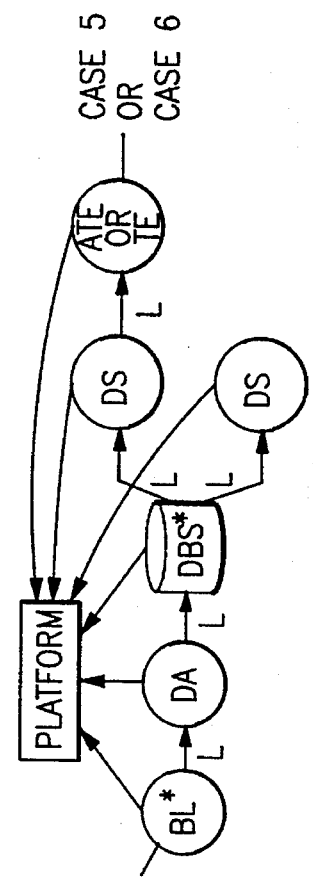
FIG.4k33

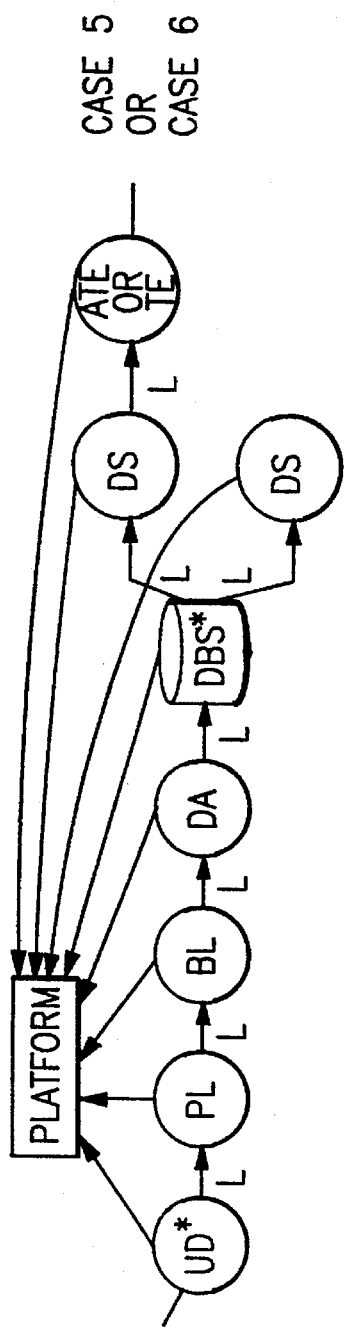
FIG.4k34
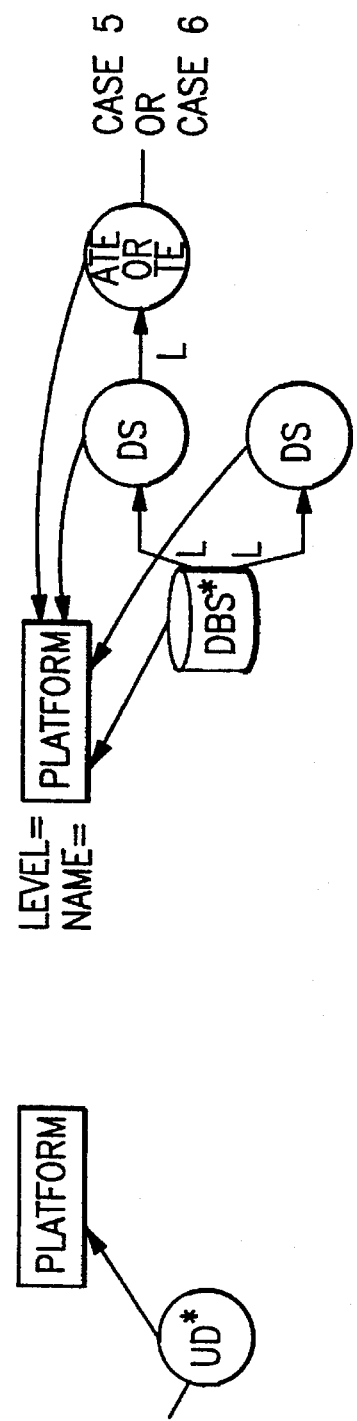
FIG.4k35

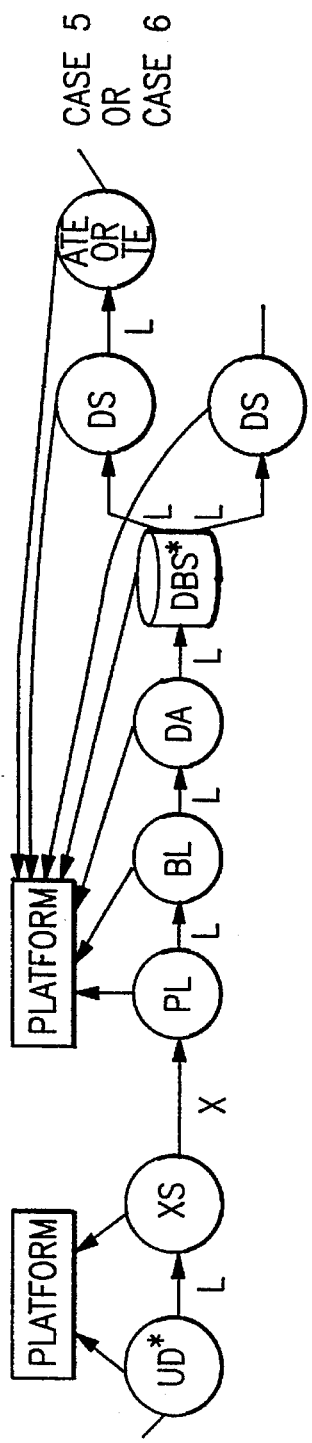
FIG.4k36
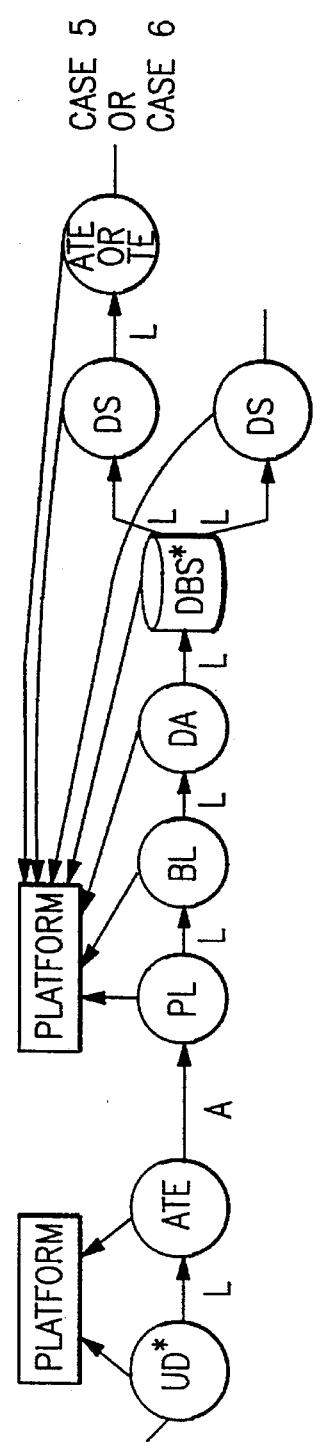
FIG.4k37
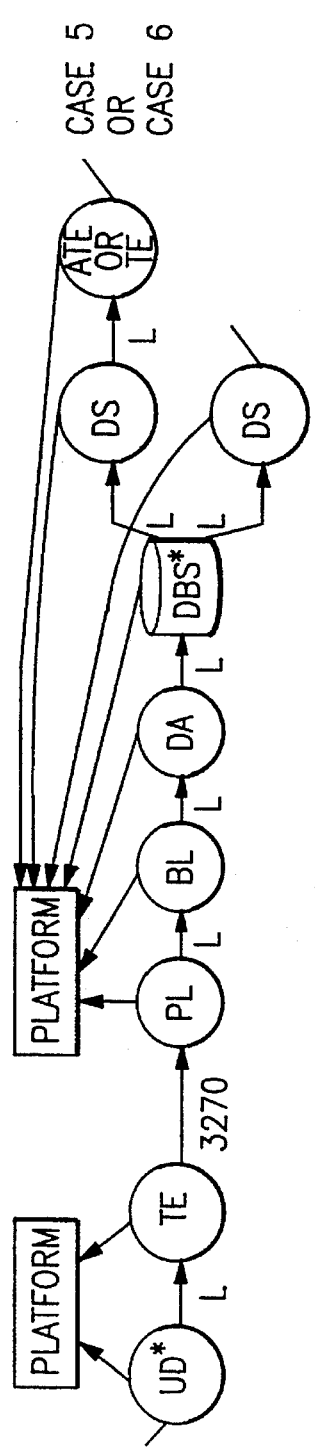
FIG.4k38

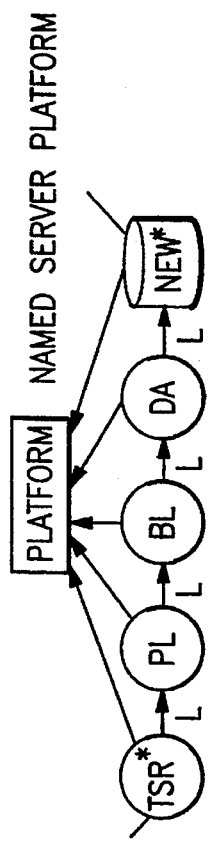
FIG.4k39
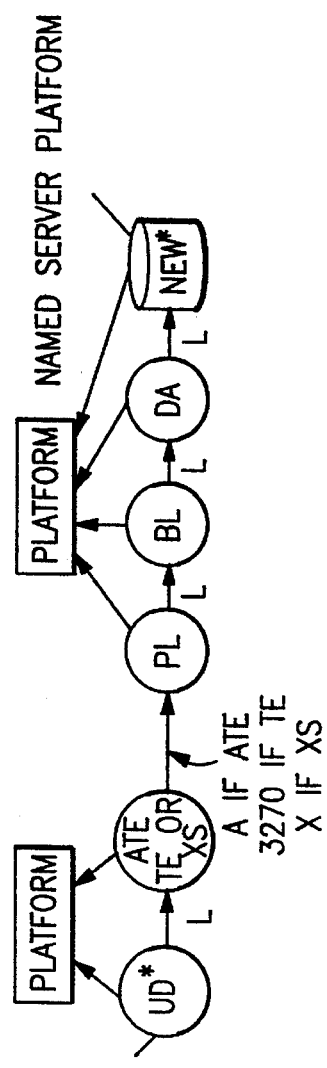
FIG.4k40
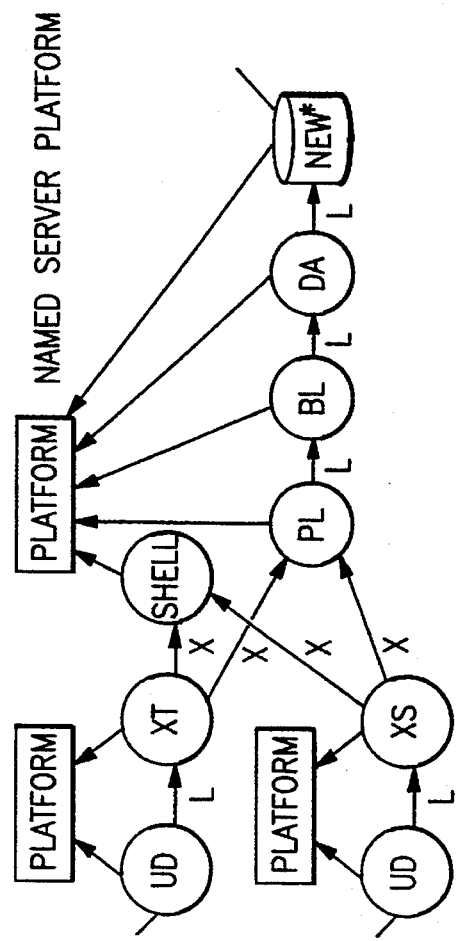
FIG.4k41

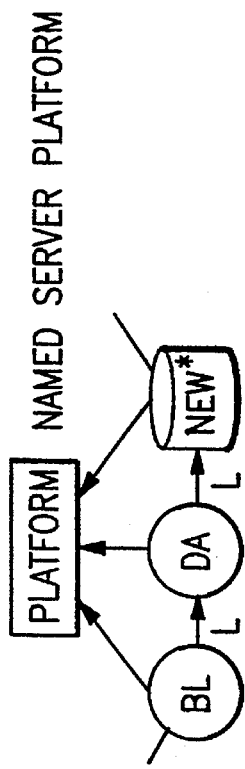
FIG.4k42
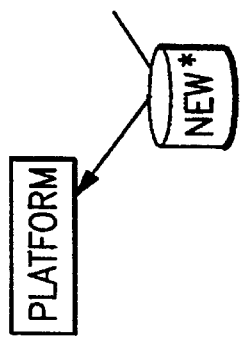
FIG.4k43
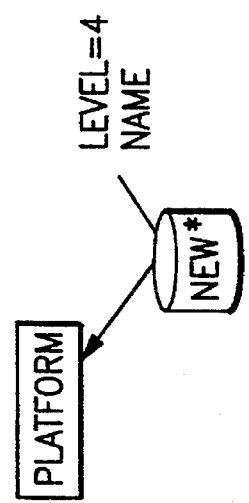
FIG.4k44

EXPERT SYSTEM FOR DESIGNING COMPUTER NETWORKS

BACKGROUND OF THE INVENTION

The invention relates generally to expert systems and deals more particularly with a system for designing a computer network comprising hardware platforms, applications, data bases, user interfaces, etc.

There are many types and arrangements of computer networks which can be formed today from a wide variety of hardware platforms, applications, data bases, user interfaces, interconnections, clustering techniques, user device supports, distribution techniques, etc. To optimize performance and minimize cost, the type and arrangement can be tailored to a specific business need. For example, members of a purchasing department in a company may need rapid and inexpensive communications with each other and access to a common data base. In such a case, it may be best to provide each member with a workstation, and connect all the workstations in a common network with a common server and common DASD managed by the common server. The problem is more complex considering there are also optimum network hardware and software, purchasing application, data base manager, etc. to select. If there are several such departments, it may be best to provide a like number of such networks and a single host computer connected to all of the network servers. In this extended environment, there is an optimum type of host computer, communication facility between the network servers and host computer, data base manager for host DASD, etc. Thus, even for a business need with so few basic requirements, there are many possible combinations from which to choose. Naturally, as the requirements increase in number and complexity, there are even more possible combinations to consider. It is difficult and time consuming for a person to design the optimum system without assistance in view of the many possible combinations and requirement to understand capabilities and performance of each component and link in each combination.

Accordingly, a general object of the present invention is to provide an automated system for designing a computer network.

Another object of the present invention is to provide such a system which minimizes hardware platforms and consolidates data bases.

SUMMARY OF THE INVENTION

The invention resides in an expert system for designing a computer network comprising hardware platforms, applications, data bases, user interfaces, etc. The expert system initially displays questions and receives responsive information from a user as to characteristics of backend data bases and whether there should be corresponding frontend data bases comprising respective copies of the backend data bases. In response, the expert system "builds" one of a predetermined set of backend models which corresponds to the information. Next, to reduce complexity, the expert system identifies two or more of the frontend data bases of compatible type that can be merged together and then displays questions and receives responsive information indicating whether the mergers should be made. Next, the expert system displays questions and receives responsive information as to characteristics of frontend components including a server intermediate the users and backend. In response, the expert system builds one of a set of predetermined frontend models which corresponds to the information. Next, the expert system identifies a function of the intermediate server that can be performed on a backend platform within the backend model. Next, the expert system displays questions and receives responsive information whether the function should be performed on the backend platform, and updates the frontend model accordingly. Next, the expert system displays questions and receives responsive information as to characteristics of connections between the updated frontend model and the backend model. In response, the expert system determines a final design of the computer network based on the connection information, backend model and updated frontend model.

BRIEF DESCRIPTION OF THE FIGURES

FIG. 4a is a flow chart illustrating the major steps performed by the expert system of FIG. 1 in determining the optimum design.

FIGS. 4b1a to 4b3 form a detailed flow chart of Phase 1 of the process performed by the expert system of FIG. 1 in determining the optimum design.

FIGS. 4c1 to 4c5 are reference models made by the expert system of FIG. 1 during Phase 1 of the design process.

FIG. 4c6 illustrates summary design model cases corresponding to the reference models of FIGS. 4c1 to 4c5.

FIG. 4d1 is a detailed flow chart of Phase 2 of the process performed by the expert system of FIG. 1 in determining the optimum design.

FIG. 4e1 illustrates an example of merging of a frontend portion of two staged data bases according to Phase 2 of the design process.

FIGS. 4f1 to 4f7 form a detailed flow chart of Phase 3 of the process performed by the expert system of FIG. 1 in determining the optimum design.

FIGS. 4g1 to 4g16 are reference models made by the expert system of FIG. 1 during Phase 3 of the design process.

FIGS. 4h1a to 4h2b form a detailed flow chart of Phase 4 of the process performed by the expert system of FIG. 1 in determining the optimum design.

FIGS. 4i1 to 4i9 are reference cases of merging of intermediary server functions into backend platforms during Phase 4 of the design process.

FIGS. 4j1a to 4j6 form a detailed flow chart of Phase 5 of the process performed by the expert system of FIG. 1 in determining the optimum design.

FIGS. 4k1 to 4k44 are final reference models of the design process.

DETAILED DESCRIPTION OF THE PREFERRED EMBODIMENTS

Figure 1:
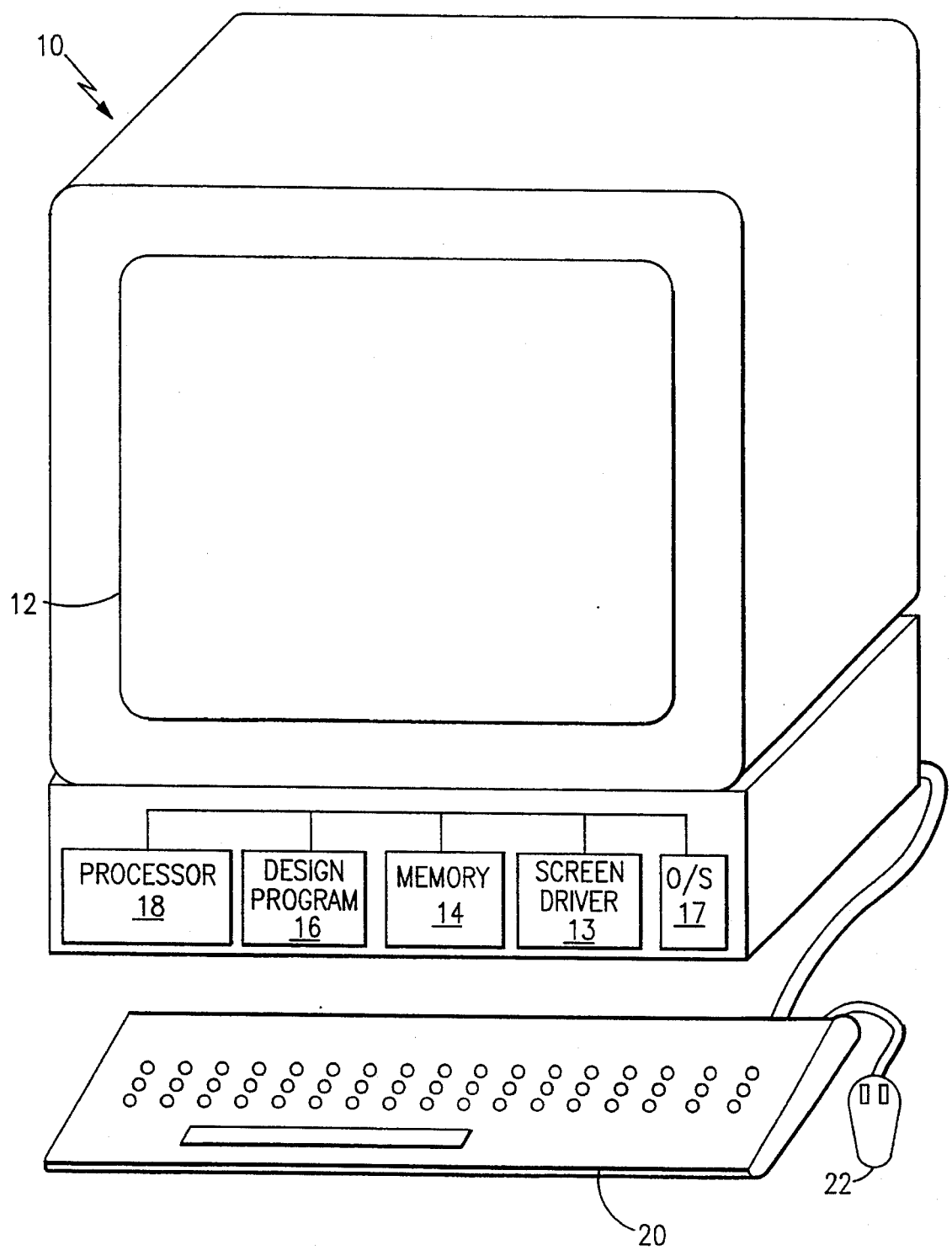
FIG. 1 is a block diagram of an expert system according to the present invention.

Referring now to the drawings in detail wherein like reference numbers indicate like elements throughout the several figures, FIG. 1 illustrates an expert system generally designated 10 according to the present invention. System 10 comprises a display screen 12, a screen driver 13, a memory 14 storing a design program 16 (in object code form) and resulting design data, an operating system 17, a processor 18 which executes program 16 and operating system 17, and a keyboard 20 with a selection mouse 22. By way of example, the computer 10 is an IBM PS/2 personal computer with an IBM OS/2 operating system.

Expert system 10 divides the design process into five phases as described in detail below. During three of the phases, the expert system solicits information from the user as to desired characteristics of the backend(s), frontend(s), interconnections, etc. The term "backend" mainly refers to data bases and platforms on which they reside. Often, backend resources are remote and shared globally by all users. The term "frontend" refers to components such as workstations, terminals and servers which are local to and shared by a single user or cluster of users. Based on the information provided by the user, expert system 10 also makes preliminary and final decisions during these three phases about the types and number of computer platforms, i.e. terminals, workstations, servers, and backend host systems, the number and placement of data bases and communication links and the splitting and placement of application logic. Expert system 10 also considers existing computer installations, the desired clustering of the user population, and the desired user interface style.

Figure 2A:
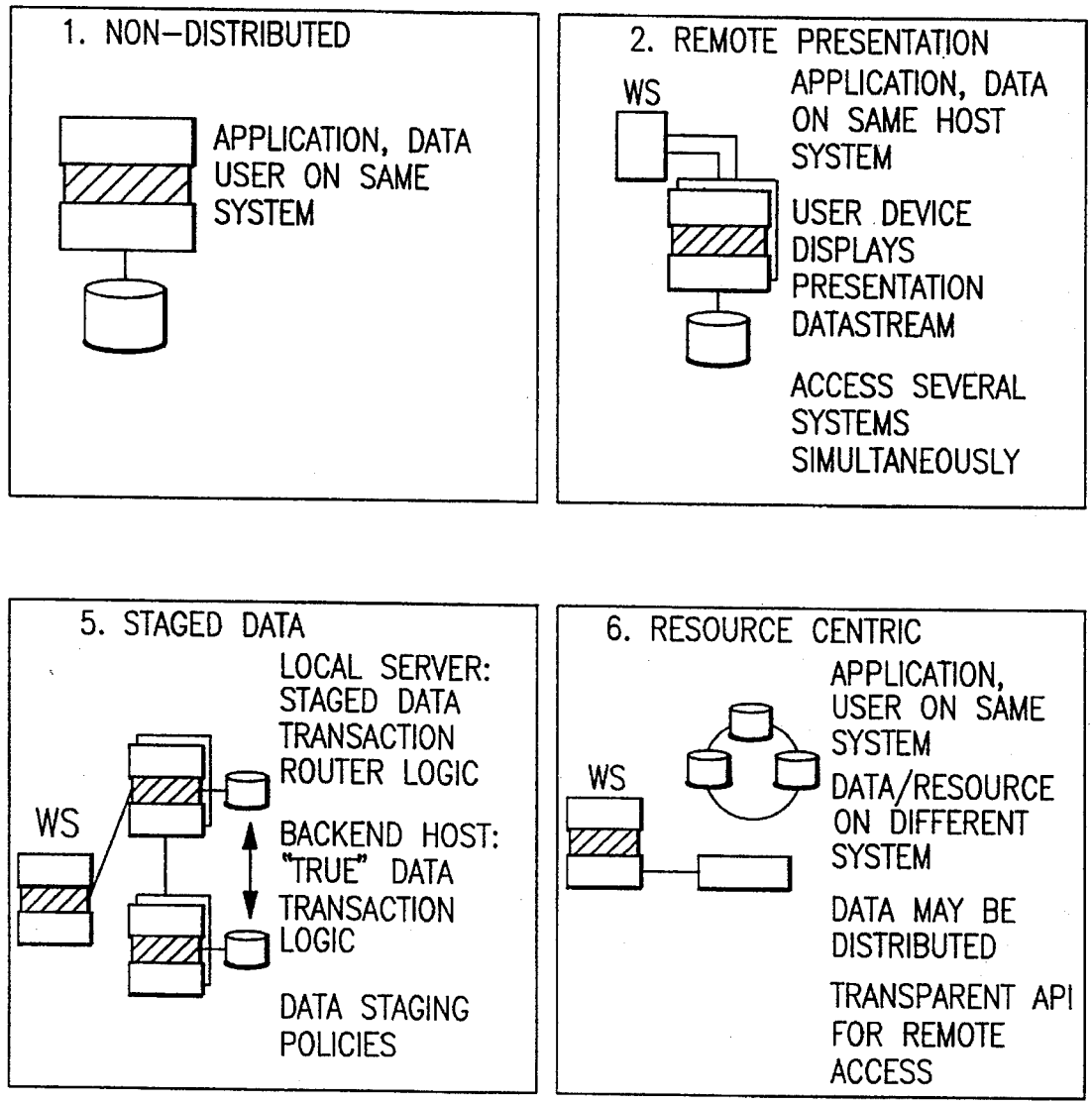
FIG. 2a and FIG. 2b collectively refered as FIG. 2 is a block diagram of network reference designs.
Figure 2:
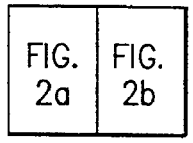

To simplify the design process, expert system 10 considers only predetermined reference designs or "cases" for the backend and frontend. This greatly reduces the number of combinations that must be considered. These backend and frontend reference designs are portions of eight predetermined network reference designs illustrated in FIG. 2. The network reference designs are the most viable and advantageous combinations of components and interconnections in view of cost, performance, communication bandwidth, operational complexity, and other practical constraints. The following definitions are helpful in understanding the network reference designs illustrated in FIG. 2:

REMOTE PRESENTATION is a reference design where the frontend consists of a user device with the capability of processing presentation data streams produced by applications on the backend systems. The protocol between the frontend and backend systems is a remote presentation protocol. X-windows is an example of remote presentation.

FRONT ENDING is a reference design where the frontend system has new application logic which is "layered" in front of (generally) old application logic on the backends. The protocol between the frontend and backend is an existing terminal data stream protocol.

DISTRIBUTED LOGIC is a reference design where the application logic is split between frontend and backend systems and a PROGRAM-TO-PROGRAM protocol is used for communication between the two. Examples of program-to-program protocols include conversations, remote procedure call, and message queuing.

DATA STAGING is a reference design where data is staged between data bases on the frontend and backend. The frontend data base can be viewed as a data cache and is called a STAGED DATA BASE. Staged data may flow in either direction between the two data bases. The term STAGED DATA PROTOCOL is used to refer to the variety of data transfer protocols that may be used for this purpose.

RESOURCE CENTRIC is a reference design where the application logic resides entirely on the frontend system and accesses data bases on backend systems via a local/remote access interface provided by the system. Software protocols used to support this access are referred to as resource centric protocols. Remote access file servers and data base servers are examples of resource centric designs.

The intermediary and final design models are based on combinations of the backend and frontend reference designs. Expert system 10 selects and assembles the combinations, step by step, as the information is received from the user during these three phases. During the remaining two phases, the expert system identifies to the user data bases that can be merged together and intermediary server functions that can be implemented on a backend platform in the interest of efficiency and economy. Then, the user determines if the merges should be made.

Figure 3A:
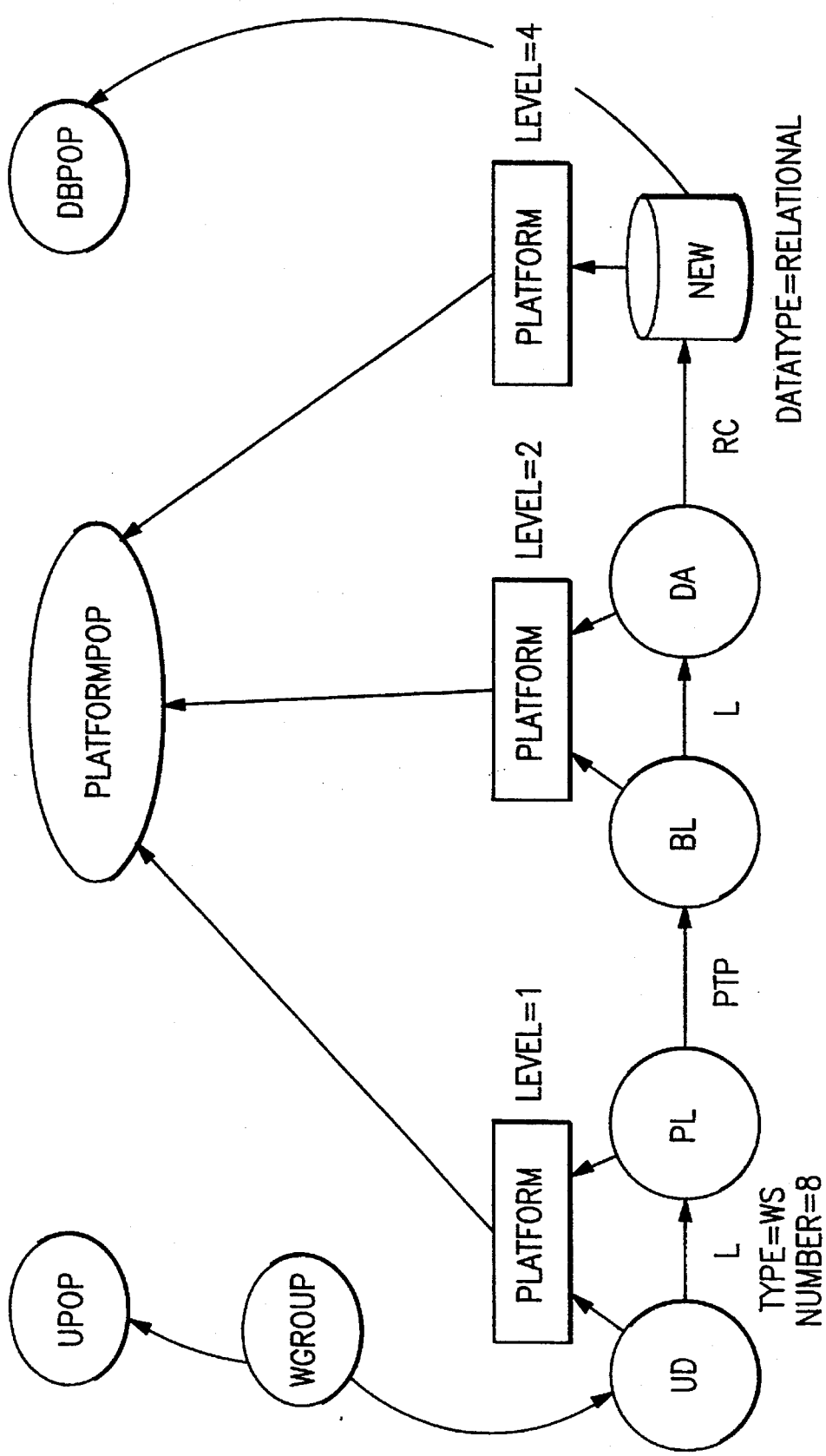
FIG. 3a is a schematic representation of design data generated by the expert system of FIG. 1.
Figure 3B:
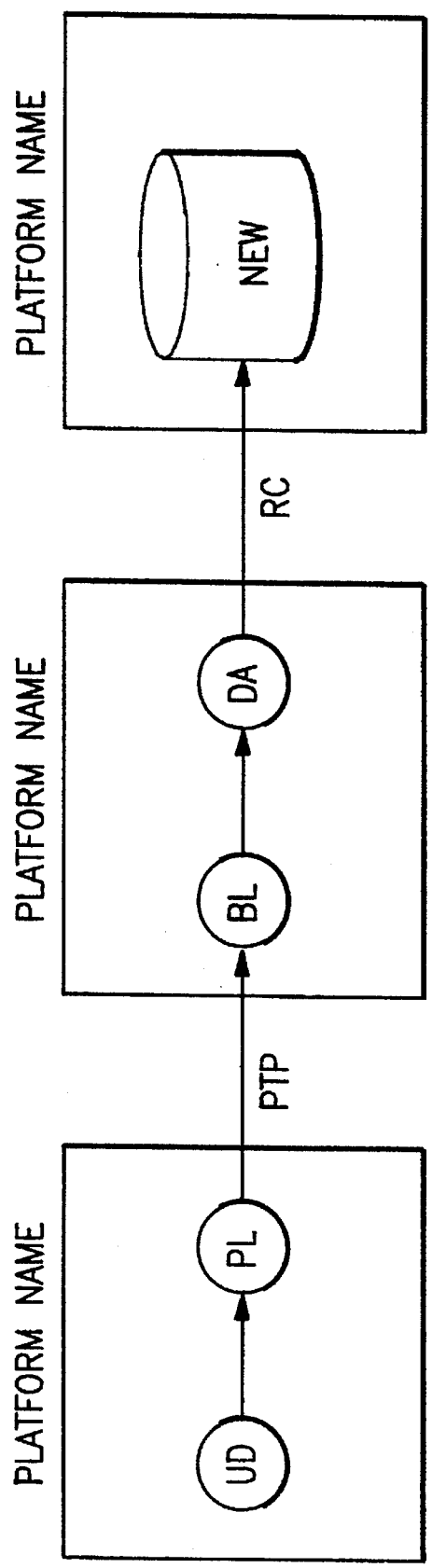
FIG. 3b is an example of a final design displayed by the expert system of FIG. 1.

An example of a final network design is illustrated schematically in FIG. 3a where hardware platforms are represented by rectangles, software applications are represented by circles, and user populations, workgroups, platform populations and database populations are represented by ovals. When all five phases are completed, expert system 10 displays the final design in graphical form as illustrated in FIG. 3b showing the hardware and software components and connections between them. In FIG. 3b, hardware platforms are represented by squares and user devices and software are represented by circles.

Object-Oriented Design Model

Figure 3C:
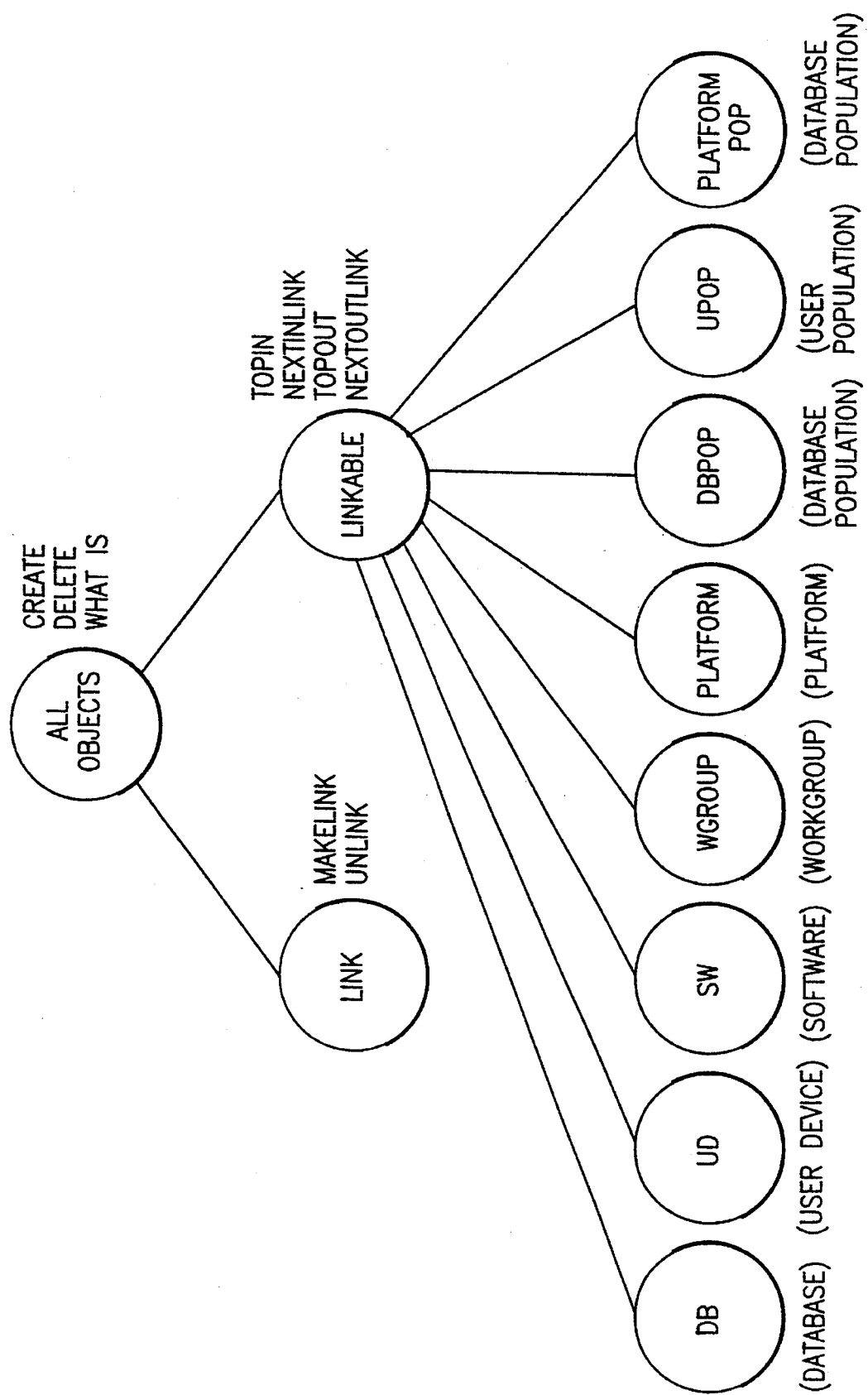
FIG. 3c is a schematic representation of a technique for organizing the design data into object oriented format.

As illustrated in FIG. 3c, expert system 10 actually stores the reference, intermediary and final design models in object-oriented format. Each design model is a data structure comprising a variety of objects representing hardware platforms, user devices, software, and data bases and links between the objects. The object oriented format is arranged hierarchically and contains two main classes of objects—linkable objects which are illustrated in the lowest level and links which are formed by the data structures defined in the upper two levels and connect together the linkable objects. The design model also contains state information which is used for the design process.

The linkable objects are as follows:

A DB object represents a data base and its storage medium such as DASD, and is illustrated in the figures by a cylinder. The type of data base may be shown inside the cylinder. The DB data structure is defined as follows:

DB
    NAME—user assigned name.
    TYPE—classification of the data base:
    OLD (already exists and will be used in the new design).
    NEW (a new data base created for the design).
    DBS (a new staged data base).
    DATATYPE—type of data stored:
    RELATIONAL (relational data base).
    HIERARCHICAL/IMS (IMS hierarchical).
    INDEXFILES (indexed files).
    BYTEFILES (byte string files).
    OTHER
    CASE—There are seven predetermined backend reference designs or "cases" which are illustrated in FIGS. 4c1 to 4c5 and used by the expert system to classify the backend.
    ATTACHPOINT—pointer to the object which will be attached to the frontend during Phases 4 and 5 of the design process.

MERGED—boolean variable, true if this data base has been merged in Phases 2 or 4 of the design process.

A UD object represents a user device. It is illustrated in the figures as a circle with UD inside. The UD data structure is defined as follows:

UD
  NUMBER—number of these devices in the workgroup.
  TYPE—type of device:
    T (3270 terminal).
    AT (ASCII terminal).
    XT (X terminal).
    WS (workstation).

A SW object represents a software application in the design. It is illustrated in the figures as a circle with its TYPE inside. While some of the SW object types are not strictly application level code, they are specified as such by expert system 10 to aid in user comprehension of the recommended design. The SW data structure is defined as follows:

SW
  TYPE—type of software component.
    AOLD (existing application code to be incorporated in the new application).
    PL (presentation logic).
    BL (business logic).
    DA (data access logic).
    DS (data staging logic).
    TSR (3270 terminal session router).
    ASR (ASCII terminal session router).
    C (convert ASCII session to 3270 session).
    PT (session pass thru).
    SHELL (windows shell).
    XS (Xserver).
    RP (remote presentation server).
    TE (3270 terminal emulator).
    ATE (ASCII terminal emulator).
    T (3270 terminal function).
    AT (ASCII terminal function).
    XT (X terminal function).

A WGROUP object represents a workgroup population of users. It is illustrated in the figures as a circle with WGROUP inside. The WGROUP data structure is defined as follows:

WGROUP
  NAME—user assigned name.
  ATTACHPOINT—pointer to the object in the workgroup frontend to which backend data bases will be attached during Phase 4 and 5 of the design process.

A platform object represents a hardware system platform. All DB, SW and UD objects must be linked (TYPE=N) to the platform object on which they are implemented. A platform object is illustrated in the figures as a rectangle with PLATFORM inside. The platform data structure is defined as follows:

PLATFORM
  NAME—user defined name.
  LEVEL—the level of this platform in the design:
    1 (user device).
    2 (local workgroup server, one per workgroup).
    3 (global workgroup server, one for all workgroups).
    4 (backend system).
    5 (backend system, source of staged data).
  3270—boolean; true indicates support for native attach of 3270 terminal.
  ASCII—boolean; true indicates support for native attach of ASCII terminal.

There is only one each of the DBPOP, UPOP and PLATFORMPOP objects for each design. These objects are convenient anchors for the populations of data bases, users, and hardware platforms. UPOP is linked (TYPE=N) to every WGROUP object, every DB object is linked (TYPE=N) to DBPOP, and every PLATFORM object is linked (TYPE=N) to PLATFORMPOP. These objects are shown as circles in the figures. The data structures for these objects contain internal variables. The data structure for UPOP contains a relevant variable and is defined as follows:

UPOP.
  FECASE—character string used to describe one of eleven frontend classifications (A,B,C,D,E,F,G,H1,H2,J1,J2).

Links are directional and are represented by arrows between components in FIG. 3.1, but they may be traversed in either direction. This is accomplished by providing both forward and backward pointers for each link. The link represents the association between two linkable objects. The link type is either shown below the arrow, or assumed to be N. The link types are as follows:
  L: local, both linkable objects are on the same platform.
  A: ASCII terminal protocol.
  3270: 3270 terminal protocol.
  X: X window protocol.
  RP: remote presentation protocol other than X-window.
  PTP: program-to-program protocol, for example, remote procedure calls, conversations, or message queuing.
  RC: resource centric protocol, for example, remote file access or remote data base access protocols.
  DS: data staging protocol. A data staging protocol is used to stage bulk data to or from a local data base.
  DSASCII: data staging via ASCII terminal protocol.
  DS3270: data staging via 3270 protocol.
  N: not a protocol relationship.

All of the link types except N represent an operational flow of data between linkable objects in the design. Type N links are used to represent other relationships such as "contained in" or "used by".

Expert system 10 requests MAKELINK to make a link and UNLINK to remove a link between two linkable objects. Linkable objects include the following routine to utilize the links. Expert system 10 specifies TOPIN and TOPOUT to set a cursor to the top of the list of incoming and outgoing links, respectively. Then, expert system 10 specifies NEXTINLINK and NEXTOUTLINK to return pointers to the next incoming and outgoing links, respectively, in the list.

In the final design of FIG. 3a there is one workgroup in which eight users have respective workstations. The workstations are connected to a local server which in turn accesses a new backend relational database. The application is split, with presentation logic running on the workstation and linked to business logic via a program-to-program protocol. Data access logic uses a resource centric protocol for remote access to the database. This example is a cascaded combination of distributed logic and resource centric reference designs illustrated in FIG. 2.

Graphical User Interface

During the design process, expert system 10 selects and presents a series of questions to the user about design requirements and builds the design model as these questions are answered. The questions are presented in common user access (CUA) style. Text accompanies some questions and possible answers to explain constraints, requirements, advantages, and disadvantages for choosing a given option and other design information. The text of all of these "dialog" panels is defined in the Appendix. Only a subset of these panels will be shown to a user, during one design session. Expert system 10 determines which panels to display based on its internal logic and previous answers given by the user. In some cases, expert system 10 displays a predefined panel but disables some questions or answers. In the panel illustrations, a dot is used to denote an answer option for which only one can be selected and brackets denote check box answer options for which more than one can be selected. Input and output fields are underlined. Expert system 10 also displays the current state of the design model in a window separate from the dialog panel. Consequently, the user can see the effect of a given answer on the state of the design model, and change the answer if necessary.

Design Process

FIG. 4a is a flow chart illustrating the five major phases of the design process which are implemented sequentially by expert system 10. The remaining figures illustrate the design process in flowchart form and the backend and frontend reference models and cases in fine detail. The flowcharts name each panel which is displayed at the respective point in the process, and beneath the name, the possible answers to questions or other selection options presented in the panel. Based on the answer or selection, the flowchart proceeds to build and display the appropriate model (and update the data base accordingly), classify the model according to a predetermined case, determine the next panel (defined in the Appendix) to display, etc. as indicated.

In Phase 1 (flowchart FIGS. 4b1a to 4b3, model FIGS. 4c1 to 4c5 and summary case FIG. 4c6), expert system 10 displays a set of dynamically selected question and answer panels, and using these panels, the user defines and classifies the physical data bases that will be accessed by users of a particular business application which is the subject of the design. One copy of the data base will always be maintained at a backend location which is globally accessible by all user workgroups. This copy is stored on a backend hardware platform and controlled by data base manager software which is executed on the backend hardware platform. The backend platform and software collectively form a "backend system". The question and answer panels also solicit information whether the data base should be staged, i.e. whether one or more of the data base copies should be stored and maintained closer to the actual user than the backend system. If the user specifies such a staged data base, expert system 10 will associate it with any other backend data base that will be a source or destination for staged dated. For example, if the network comprises workstations and a local server with DASD on a LAN and a remote host with DASD connected to the local network server, then the backend system is the remote host and remote host DASD. However, the data base can be staged such that another copy of the data is stored and maintained on the local network server. This facilitates access by the workstations. However, if the network comprises a set of local dumb terminals connected to the remote host and does not contain any local intelligent workstations, then staging is not possible because there is no DASD or data base manager between the local terminals and the remote host, and the terminals do not have the intelligence to manage the data base.

While the user provides the requisite information, expert system 10 builds and displays the appropriate backend model (illustrated in FIGS. 4c1 to 4c5). Thus, some of the illustrated backend models represent stages in the final backend system designs. The backend models also indicate data staging and respective data bases which reside in a frontend system. After Phase 1 is completed, expert system 10 classifies each backend model as one of seven predetermined "cases" illustrated in FIG. 4.3.6. Cases 1 and 2 represent a fixed function terminal connection without data staging. Case 3 represents an X-terminal connection without data staging. Case 4 represents a backend system without connection to a frontend system. Case 5 represents a LAN with an intelligent network server and DASD and a terminal emulator to interface to a remote host. Case 5 includes data staging. Case 6 represents a LAN with an intelligent network server that communicates directly with the remote host. Case 6 includes data staging. Case 7 represents a backend system which will not be defined until the end of Phase 5.

In Phase 2 (flowchart FIG. 4d1 and merging example FIG. 4e1), expert system 10 identifies any data bases that can be merged together to reduce complexity and improve efficiency. These are any two or more staged data bases of identical or compatible type. Then, expert system 10 asks the user if they should be merged into a single, staged data base. A resultant merged, staged data base contains staged data from multiple backend data bases. FIG. 4e1 illustrates such an example. Before merging, there is a frontend copy 102a and a backend copy 102b of the same data base and a frontend copy 104a and a backend copy 104b of another data base. After merging, there is a single consolidated data base 105 at the frontend; the two backend data bases 102b and 104b remain separate. Efficiency is improved because frontend applications can more easily transfer data within the consolidated data base 105 than between the two separate frontend data bases 102a and 104a. Also, the frontend applications do not have to keep track of two different data base names.

In Phase 3 (flowchart FIGS. 4f1 to 4f7 and design model FIGS. 4g1 to 4g16), expert system 10 displays a set of dynamically selected question and answer panels. Using these panels, the user defines and classifies the user devices that must be supported (for example, terminals, workstations—step 25 of FIG. 4f1), desired user interface (for example, separate window image of each backend or single image of all backends,—step 32 of FIG. 4f2), type of frontend server (for example, local or global servers), and type of frontend software (for example, remote presentation or distributed logic) that will be used to access the backend systems. The user also specifies a manner of grouping the user devices, servers and software into local clusters (step 26 of FIG. 4f1), whether a terminal is needed and whether an intermediate server appears to be needed. If an intermediate server appears to be needed, the user also specifies the functions to be performed by the intermediate server (step 38–39 of FIG. 4f3). Based on this information, expert system 10 "builds" one of sixteen predetermined frontend reference designs or "models" 8–23 which are illustrated in FIGS. 4g1 to 4g16. Some of the reference models are intermediate and some ate final design "cases".

Figure 2B:
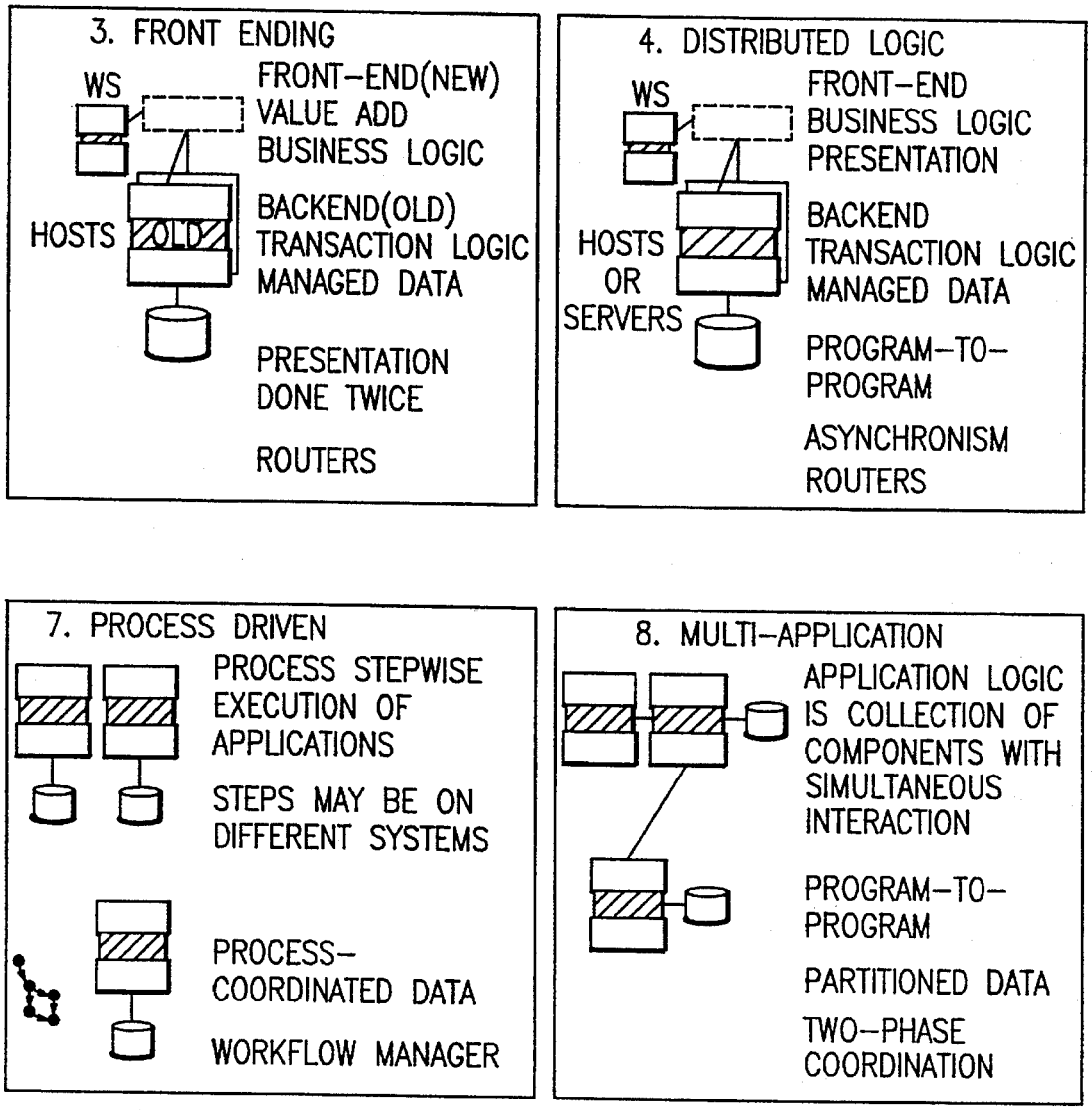

In Phase 4 (flowchart FIGS. 4h1a to 4h2b and design model FIGS. 4i1 to 4i9), expert system 10 identifies any intermediate server function defined in Phase 3 that could be performed in an existing backend platform. Expert system 10 makes this identification based on the criteria specified in FIGS. 4h1a and 4h1b. Then in FIGS. 4h2a and 4h2b, expert system 10 asks the user to approve such a merger. Such a merger may avoid the need for the intermediate server platform. FIGS. 4i1 to 4i9 to 4.9.9 illustrate examples of mergers where the components on the left represent the intermediate server platform and intermediate server function before the merger, the components in the middle represent the backend system before merger, and the components on the right represent the backend system including the intermediate server function after merger. Note that in all cases, the intermediate server platform is not required after the merger.

In Phase 5 (flowchart FIGS. 4*j*1a to 4*j*6 and design model FIGS. 4*k*1 to 4*k*44), expert system 10 displays a set of dynamically selected question and answer panels, and using these panels, the user indicates how to connect each backend system to the frontend systems. As noted above, text accompanies most of the questions and possible answers to explain the reasons for choosing each answer, i.e. constraints, requirements, advantages and disadvantages relating to each connection including the advantages and disadvantages of splitting and placement of application logic and connection protocols. After the user provides the information, expert system 10 identifies and displays one of reference designs or "models" 33–76 (illustrated in FIGS. 4*k*1 to 4*k*44). After Phase 5, the final design is complete and the computer network is constructed according to the final design.

Based on the foregoing, an expert system for designing a computer network has been disclosed. However, numerous modifications and substitutions can be made without deviating from the scope of the present invention. For example, if desired, the expert system could be modified to automatically merge the frontend data bases identified in Phase 2 and automatically merge the intermediate server functions, identified in Phase 4, into the backend system. Therefore, the invention has been disclosed by way of illustration and not limitation and reference should be made to the following claims to determine the scope of the present invention.

APPENDIX—DIALOG PANELS

Dialog panels 5 through 54 are illustrated in this Appendix. A dot represents a CUA-style, radio button answer option (only one can be selected). Brackets are used to denote check box answer options (more than one can be selected). Input and output fields are underlined. Output fields contain contextual information provided by the design algorithm. This contextual information is described in parentheses.

For the reader's convenience, the associated help texts are included below each answer option.

DIALOG PANEL 5

Describe the global databases or file systems that are part of the design. A database or file system is global if it is shared by all the users.
ADD A GLOBAL DATABASE OR FILE SYSTEM DESCRIPTION TO THE PROBLEM STATEMENT.
NO MORE GLOBAL DATABASE OR FILE SYSTEM DESCRIPTIONS TO ADD.

DIALOG PANEL 6

Describe the global database or file system.
Enter the database or file system name:
THIS DATABASE OR FILE SYSTEM ALREADY EXISTS.
THIS DATABASE OR FILE SYSTEM IS NEW.

DIALOG PANEL 7

Continue describing the database or file system named: (NAME)
Enter the name of the system platform where this database or file system resides:
Does this system platform support natively attached 3270 terminals?
YES
NO Does this system platform support natively attached ASCII terminals?
•YES
•NO

DIALOG PANEL 8

Continue describing the database named: (NAME)
Describe the application code used to access this database:
THE APPLICATION CODE TO ACCESS THE DATABASE ALREADY EXISTS.
THE APPLICATION CODE TO ACCESS THE DATABASE IS NEW.

DIALOG PANEL 9

Continue describing the database named (NAME).
Existing application code is used to access this data.
Identify the method used to talk to the application:
3270 DATA STREAM
ASCII DATA STREAM
WINDOWS PROTOCOL

DIALOG PANEL 10

Continue describing the database or file system named (NAME)
Identify the type of data base or file system:
RELATIONAL DATABASE
HIERARCHICAL DATABASE (IMS)
INDEXED RECORD FILES
OTHER TYPE OF STRUCTURED DATABASE
UNSTRUCTURED FILES (BYTE FILES)

DIALOG PANEL 12

Continue describing the database named: (NAME).
Identify if the data is staged.
NO DATA STAGING The data will remain in the global database and will be accessed in place.

DATA STAGING

The data will be "staged" between a local database and the global database. The user will work with the data in the local database.

The staging can be a periodic downloading of extracts from the global database, or a periodic uploading of accumulated data to the global database.

STEP THROUGH THE DECISION MAKING PROCESS TO DECIDE.

DIALOG PANEL 13

Continue describing the file system named: (NAME).
NO DATA STAGING

The files will remain in the global file system and be accessed in place.

DATA STAGING

1. The user will work with files maintained in a local file system. Files will be staged between the local file system and the global file system.

2. The staging can be periodic downloading of file copies from the global file system, or a periodic uploading of files to the global file system.

STEP THROUGH THE DECISION MAKING PROCESS TO DECIDE.

DIALOG PANEL 14

Continue describing the database named: (NAME).
The next questions help you decide if data staging should be used.
How does the new application use the data?
READ ONLY The application does not modify the data it accesses.

UPDATES OR INSERTIONS ARE MADE

The application modifies the data either by changing existing data or adding new data.

DIALOG PANEL 15
Continue describing the file system named: (NAME).
The next questions help you decide if data staging should be used.
How does the new application use the file data?
READ ONLY
 The application does not modify the files.
UPDATE FILE OR ADD NEW FILES
 The application modifies the files or adds new files.
DIALOG PANEL 16
Continue describing the database named: (NAME)
Weigh the following guidelines, then select the appropriate option.
NO DATA STAGING
 Select this option if:
 1. The application must see an instantaneously up-to-date version of the global data, or
 2. You don't want the operational complexity involved with periodically downloading extracts of the global database, or
 3. Security considerations will not allow extracts of the global database to be distributed, or
 4. You would like to avoid the extra cost of the local databases.
DATA STAGING (READ-ONLY DOWNLOADS)
 Select this option if:
 1. The application can tolerate periodically refreshed extracts which may not be instantaneously up-to-date, and
 2. The global database is far away and accessing the data in place may not perform well, or
 3. You want to create a new view of one or more back end databases by loading the extracts into a local database, or
 4. You want to be able to keep working with local data copies in the event that access to the host is interrupted, or
 5. The host system is already loaded and additional workload would impact performance, or
 6. The communication cost of periodic downloads is less than continuous access, or
 7. The downloaded data need to be loaded into a "walk-away" portable computer for later processing.
DIALOG PANEL 17
Continue describing the file system named: (NAME).
Weigh the following guidelines, then select the appropriate option.
NO DATA STAGING
 Select the option if:
 1. The application must see instantaneously up-to-date versions of the files, or
 2. You don't want the operational complexity involved with periodically downloading copies of the files, or
 3. You would like to avoid the extra cost of the local file systems.
DATA STAGING (COPY DOWNLOADS)
 Select this option if:
 1. The application can tolerate working with a copy of the file which may not be instantaneously up-to-date, and
 2. The global file system is far away and accessing the file in place may not perform well, or
 3. You want to be able to keep working with the local copy in the event that access to the global file system is interrupted, or
 4. The global file server is already loaded and additional workload would impact performance, or
 5. The communication cost of a copy download is less than continuous access, or
 6. The downloaded file needs to be loaded into a "walk-away" portable computer for later processing.
DIALOG PANEL 18
Continue describing the database named: (NAME).
Weigh the following guidelines, then select the appropriate option.
NO DATA STAGING
 Select this option if:
 1. Each user's update must be immediately committed by the global database and made visible to all other users, or
 2. No acceptable data staging policy can be devised to consolidate and distribute the data updates.
 3. You don't want the operational complexity involved with periodically downloading extracts and uploading or routing updates to the global database, or
 4. Security considerations will not allow extracts of the global database to be distributed,
 5. You would like to avoid the extra cost of the local databases.
DATA STAGING (UPDATE CONSOLIDATION)
 Select this option if:
 1. An acceptable data staging policy can be devised to consolidate and distribute (if necessary) the data updates, and
 2. The application can tolerate working with periodically refreshed extracts of the database, and
 3. The application can tolerate storing updates for uploading or routing updates to the global database, and
 4. You want to create a new view of one or more back end databases by loading extracts into a local database and routing updates to the appropriate back end, or
 5. The global database is far away and accessing the data in place may not perform well, or
 6. You want to be able to keep working with local data in the event that access to the host is interrupted, or
 7. The host system is already loaded and additional workload would impact performance, or
 8. The communication cost of periodic downloads and uploads is less than continuous access, or
 9. The data needs to be downloaded to and uploaded from a "walk away" portable computer.
DIALOG PANEL 17
Continue describing the file system named: (NAME).
Weigh the following guidelines, then select the appropriate option.
NO DATA STAGING
 Select the option if:
 1. The application must see instantaneously up-to-date versions of the files, or
 2. You don't want the operational complexity involved with periodically downloading copies of the files, or
 3. You would like to avoid the extra cost of the local file systems.
DATA STAGING (COPY DOWNLOADS)
 Select this option if:
 1. The application can tolerate working with a copy of the file which may not be instantaneously up-to-date, and
 2. The global file system is far away and accessing the file in place may not perform well, or 3. You want to be able to keep working with the local copy in the event that access to the global file system is interrupted, or
4. The global file server is already loaded and additional workload would impact performance, or
5. The communication cost of a copy download is less than continuous access, or
6. The downloaded file needs to be loaded into a "walk-away" portable computer for later processing.

DIALOG PANEL 19

Continue describing the file system named: (NAME).
Weigh the following guidelines, then select the appropriate option.

NO DATA STAGING

Select this option if:
1. Each updated file must be immediately entered into the global file system and made visible to all other readers, or
2. No acceptable data staging policy can be devised to deal with the version control problem caused by multiple writers, or
3. You don't want the operational complexity involved with periodically downloading file copies or uploading updated files, or
4. You would like to avoid the extra cost of the local file systems.

DATA STAGING (UPDATE CONSOLIDATION)

Select this option if:
1. An acceptable data staging policy can be devised to deal with the version control problem caused by multiple writers, and
2. You want to be able to keep working with the local file in the event that access to the global file server is interrupted, or
3. The global file system is far away and accessing the file in place may not perform well, or
4. The global file system is already loaded and additional workload would impact performance, or
5. The communication cost of periodic downloads and uploads is less than continuous access, or
6. The data needs to be downloaded to and uploaded from a "walk-away" portable computer.

DIALOG PANEL 20

Two or more global databases of the same data type are staging data to local databases. The local databases may be combined into a single database for staged data.
Indicate if the databases can be combined:
OK, COMBINE THE LOCAL DATABASES.
DON'T COMBINE THE LOCAL DATABASES.

DIALOG PANEL 21

Describe the mix of non-programmable terminals and programmable workstation the new application must support.
Select each type that is appropriate:
[] WORKSTATION
  Include these if:
  1. Some users already have workstations and the LAN wiring for them and you want to use them again.
  2. The application must have an advanced user interface.
  3. The workstations will be used for other purposes besides accessing the new application.
[] X-TERMINALS
  Include these if:
  1. Some users already have X-terminals and the LAN wiring for them and you want to use them again.
  2. You want an advanced user interface at a potentially lower cost per seat.
[] ASCII TERMINALS
  Include these if:
  1. Some users already have ASCII terminals and the serial wiring for them and you want to use them again.
  2. You are willing to accept a terminal style user interface in return for the potentially lowest cost per seat.
[] 3270 TERMINALS
  Include these if:
  1. Some users already have 3270 terminals and the coax wiring for them and you want to use them again.
  2. You expect that the host to which they attach will play a role in the design.

DIALOG PANEL 22

Users of the new application need to be described. The user population is grouped in workgroup clusters.
Select one:
ADD A WORK GROUP CLUSTER DESCRIPTION.
DO NOT ADD ANOTHER WORKGROUP CLUSTER DESCRIPTION.

DIALOG PANEL 23

Enter the name of this workgroup: .
And, enter how many of each device is in this group:
  Programmable Workstations:
  X-Terminals:
  ASCII Terminals:
  3270 Terminals:

DIALOG PANEL 24

DESIGN ADVISORY

The requirement to support (TYPE) terminals dictates that the user interface must be a terminal style with user logons to the new application.
For workstations, the user interface will be a terminal emulator in a window.

DIALOG PANEL 25

The requirement to support (TYPE) terminals dictates that the user interface must be a terminal style with user logons.
For workstations the user interface will be a terminal emulator in a window.
Indicate how the user interacts with the backend systems:
SINGLE SYSTEM IMAGE
  A user establishes one session with a front ending application. This application creates a single system image by transparently interfacing with the backend systems.
SESSION WITH EACH BACK-END SYSTEM
  A user establishes a session with the application on each backend system. There is no image of a single system.
  Select this option if you want to avoid writing the single system image application code.

DIALOG PANEL 26

The front-ending application must run on a platform capable of attaching ASCII terminals. It can run on a mainframe host with display controller support for ASCII terminals, or on a server that supports natively attached ASCII terminals.
Indicate where the application runs:
MAINFRAME HOST WITH DISPLAY CONTROLLER SUPPORT FOR ASCII TERMINALS
  Design Comments:
  1. The front-ending application will be programmed on the mainframe.
  2. The 3270 data streams produced by backend systems will be "passed thru".

SERVER CAPABLE OF NATIVE ASCII TERMINAL ATTACH

Design Comments:

1. The front-ending application will be programmed on the server.

DIALOG PANEL 27

DESIGN ADVISORY

The requirement to support X terminals dictates that the user interface is X terminal style (e.g., Motif).
The user opens a window to each backend system. The interface is terminal emulator-in-a-window or X-in-a-window depending on the type of backend system.

DIALOG PANEL 28

The requirement to support X terminals dictates that the user interface must be X terminal style (e.g., Motif)
Indicate which user interface is used:

NEW SYSTEM IMAGE

A new X-windows application forms a front-end which creates a new system image of the backend systems. The new system image may involve converting terminal style backends to a MOTIF style user interface, or creating a single system image out of the multiple backend systems. This option requires new application code on a server.

WINDOWS TO EACH BACK-END

The user opens a window to each backend system. There is no single system image. The user interface to each backend will be terminal emulator-in-a-window or X in-a-window, depending on the backend.

Reasons to select this option:

1. You don't want to write the application that would create a new system image.
2. You want to avoid the cost of the server that would be required to run the application.

DIALOG PANEL 29

Indicate how users of the new application are physically located:

SINGLE CLUSTER

Select this option if the users are arranged in a single cluster. The users are close enough to share a local server if necessary.

MULTIPLE CLUSTERS

Select this option if the users are arranged in multiple clusters. Within each cluster, users are close enough to share a local server if necessary. Branch offices and department workgroups are common examples of multiple clustering.

NO CLUSTERING

Select this option if there is no convenient clustering of the users. Any server used will be on the same level as the global backend systems previously described and accessed by all the users.

DIALOG PANEL 30

Enter the name of the population of users:
And, enter how many of each device are in this population:

Programmable Workstations:
X-Terminals:
ASCII Terminals:
3270 Terminals:

DIALOG PANEL 31

DESIGN ADVISORY

The existing X application on back end system: (NAME) dictates that the workstations be X-capable. The user opens a window to each back end system. The user interface will be X-in-a-window or terminal emulator-in-a-window depending on the type of back end system.

DIALOG PANEL 32

Select the way the user interface should work:

NEW FRONT-ENDING APPLICATION WITH ADVANCED USER INTERFACE

The front-ending application will run on a workstation or a server and provide a new application view of the backend systems.

Select this option if you want to:

1. Create a single system image of multiple backends, or
2. Modernize the user interface of old backend applications, or
3. Provide new functional use of old databases, and
4. You have or will install network wiring to the workstations.

NEW FRONT-ENDING APPLICATION WITH TERMINAL INTERFACE.

The workstation will use terminal emulation. the front-ending application will run on a server and provide a new application view of the backend system.

Select this option if you want to:

1. Create a single system image of multiple backends, or
2. Provide new functional use of old databases, and
3. You want to avoid the effort of GUI programming, or
4. You already have the terminal emulator software and wiring and you want to reuse it.

SEPARATE WINDOW SESSIONS TO EACH BACK END SYSTEM·

The user opens a separate window to each backend system. The user interface will be terminal-in-a-window or presentation-in-a-window depending on the backend.

Select this simpler option if you:

1. Don't want to create a single system image, and
2. You don't want to change the user interfaces of the backend applications.

DIALOG PANEL 33

The application code which creates the new application view can run on each workstation or on a shared server.
Indicate where the new application resides:

EACH WORKSTATION

Reasons to select this option:

1. You want to avoid the cost of a shared server.
2. Heavily loaded servers may give unpredictable response times.
3. You could not work if the server were unavailable.
4. You want any staged data to be directly loaded into a portable for "walk-away" work.

SHARED SERVER

Reasons to select this option:

1. You may want to use the server for other purposes also.
2. You may have unused capacity on an existing server.
3. Concentrating software function on a server may reduce licensing costs and simplify system management.
4. Minimizing workstation software is important if you have to port it to a variety of workstations.
5. Security considerations prohibit you from placing any staged data in each workstation.
6. Changes to the definition of any staged database are easier to manage on a server.

DIALOG PANEL 34
A single cluster of (NUMBER) users will share the server. There are two ways to connect the workstation client software to the server.
Indicate the type of connection:
REMOTE PRESENTATION (e.g., X windows or PM remote presentation)

1. The presentation logic of the application runs on the server.
2. There is no application code required on the workstation.
3. Concentrates application workload on the server.
4. No application code to port across different workstations.
5. Simplifies application software distribution.
6. Simplifies application development of the new application, since the code need not be split.
7. Minimizes workstation memory requirements.

DISTRIBUTED LOGIC

1. The application code is split: presentation logic on the workstation, business logic on the server.
2. Reduces application workload on the server.
3. Can be used to optimize performance/response time.
4. May be necessary if not every workstation has the same remote presentation support.
5. May be necessary for a given server to support a large number of users.

DIALOG PANEL 35
Indicate which type of remote presentation support the workstations use:
X-WINDOWS
PM REMOTE PRESENTATION
OTHER
DIALOG PANEL 36
There are (NUMBER) workgroup clusters. The total user population is (NUMBER). You can assign a local server to each workgroup, or one large server to be shared by all the workgroups.
To evaluate the cost of each approach, consider the costs of connecting the workstations to the servers and the servers to the backend systems, communications bandwidth, and software licensing for one versus many servers.
Indicate how servers are assigned:
LOCAL SERVER FOR EACH WORKGROUP Reason to select this option:

1. Cost
2. Better/more predictable response time.
3. There are other uses for the local server.
4. You already have the servers and wiring.
5. May allow thinner client software on the workstation.

ONE SERVER FOR ALL WORKGROUPS

Reasons to select this option:

1. Cost
2. You can use the excess capacity of an existing system
3. Fewer systems to manage/simplified software distribution
4. Physical security for the server is easier to enforce.

DIALOG PANEL 37
The workgroup clusters range from (NUMBER) users to (NUMBER) users per workgroup. There are two ways to connect the workstation client software to the server.
Indicate the type of connection:
REMOTE PRESENTATION (e.g., X windows or PM remote presentation)

1. The presentation logic of the application runs on the server.
2. There is no application code required on the workstation.
3. Concentrates application workload on the server.
4. No application code to port across different workstations.
5. Simplifies application software distribution.
6. Simplifies application development of the new application, since the code need not be split.
7. Minimizes workstation memory requirements.

DISTRIBUTED LOGIC

1. The application code is split: presentation logic on the workstation, business logic on the server.
2. Reduces application workload on the server.
3. Can be used to optimize performance/response time.
4. May be necessary if not every workstation has the same remote presentation support.
5. May be necessary for a given server to support a large number of users.

DIALOG PANEL 38

DESIGN ADVISORY

The backend system (NAME) with an old 3270 application dictates that the front-ending application must run on a system capable of intercepting the 3270 data stream. In general, a UNIX server with a 3270 emulator is the best choice for this. Consequently, the workstation will talk to the front-ending application via an ASCII terminal emulation session.
DIALOG PANEL 39
Indicate what kind of system platform the front-ending application runs on:
SERVER CAPABLE OF NATIVELY ATTACHING ASCII TERMINALS (e.g., UNIX).

Reasons to select this option:

1. The workstation will use an ASCII terminal emulator to talk to the front-ending application.
2. This type of server generally costs less.
3. You already have a server platform like this and you want to use it again.
4. You prefer to write the front-ending application for a UNIX environment.
5. The wiring for ASCII terminals is already in place.

SERVER CAPABLE OF NATIVELY ATTACHING 3270 TERMINALS.

Reasons to select this option:

1. The workstation will use a 3270 terminal emulator to talk to the front-ending application.
2. You want to use the excess capacity of a system you already have.
3. You prefer to write the front-ending application for a host environment.
4. The wiring for 3270 terminals is already in place.

DIALOG PANEL 41
Two or more global file systems are staging files to local file systems. The local file systems may be combined into a single file system for staged files.
Indicate if the file systems can be combined:
OK, COMBINE THE LOCAL FILE SYSTEMS.
DON'T COMBINE THE LOCAL FILE SYSTEMS.
DIALOG PANEL 42

DESIGN ADVISORY

The only backends in this design are staged databases. The application code will create a new application view by allowing the user to access the staged data using an advanced user interface.

DIALOG PANEL 43

The function of the (NAME) server can be implemented on a new hardware platform or on one of the existing backend platform(s) listed below:

Reasons to select a new server platform:
1. You don't want to develop the server code for the environment of the existing platform(s).
2. A new platform will avoid placing additional workload on the existing platforms.
3. Wiring considerations may make it more desirable to add a new server platform.
4. The new server platform can be placed closer to the users for performance considerations.

Reasons to select an existing platform:
1. If the existing platform has excess capacity, you can avoid the cost of an additional server platform.
2. The existing platform is close enough to the users to avoid excessive delays.
3. Available programming skills favor an existing platform.

Select the platform:
IMPLEMENT SERVER ON A NEW PLATFORM
IMPLEMENT SERVER ON (NAME)
IMPLEMENT SERVER ON (NAME)
IMPLEMENT SERVER ON (NAME)

DIALOG PANEL 44

Decide how to connect the workstation to the backend data system.

DATA SYSTEM NAME: (NAME)
DATA TYPE: (TYPE)

The user interface is a separate window to each backend system. The application logic on the backend can produce the following choices in a window.

Identify the connection:

X IN A WINDOW

Reasons to select this option:
1. Can produce a graphics user interface (GUI).
2. X windows is available on a wide variety of workstations.

REMOTE PRESENTATION IN A WINDOW

Reasons to select this option:
1. Can produce a graphic user interface (GUI).
2. Special remote presentation support other than x windows is available.

ASCII TERMINAL IN A WINDOW

Reasons to select this option:
1. Serial wiring to the backend is already in place.
2. Available programmer skills favor this option.
3. Potentially better performance over long distances.
4. Existing backend software environment supports this option.

3270 TERMINAL IN A WINDOW

Reasons to select this option:
1. Coax wiring to the backend is already in place.
2. Available programmer skills favor this option.
3. Potentially better performance over long distances.
4. Existing backend software environment supports this option.

DIALOG PANEL 45

Decide how to connect the application on the (PLATFORM NAME) to the backend data system.

DATA SYSTEM NAME: (NAME)
DATA TYPE: (DATA TYPE)

RESOURCE CENTRIC

Application code accesses backend data via a transparent programming interface.

Reasons to select this option:
1. No application code is required on the backend.
2. It's easier to design the application since it's not split.
3. You prefer to avoid writing new application code for the backend system.
4. A resource centric protocol is available (e.g., remote file access, DRDA, SQLNET).
5. Good approach if a single system image is desired.

DISTRIBUTED LOGIC

The application code is split. A program-to-program protocol is used (e.g., APPC, RPC, MESSAGE QUEUES, PL SQL).

Reasons to select this option:
1. The access to the data is frequent and the performance of a resource centric protocol across the network would not be good.
2. You want the request to the backend to be asynchronous, so the user need not wait for a reply.
3. A resource centric protocol is not available for this platform.
4. Available programming skills and tools support writing code for both platforms.
5. Additional workload on the backend system may be minimized.
6. Good approach if a single system image is desired.
1. You want to be consistent with other backends connected this way to avoid purchasing additional software enablers.
2. Coax wiring to the backend is already in place.
3. The existing backend software environment supports this option.
4. Programming skills favor this option.
5. Not recommended if a single system image is required.

ASCII TERMINAL EMULATION

Application code on the backend produces an ASCII terminal data stream.

Reasons to select this option:
1. You want to be consistent with other backends connected in this way to avoid purchasing additional software enablers.
2. Serial wiring to the backend is already in place.
3. The existing backend software environment supports this option.
4. Programming skills favor this option.
5. Not recommended if a single system image is required.

3270 TERMINAL EMULATION

Application code on the backend produces a 3270 terminal data system.

Reasons to select this option:
5. Data staging software support to all the workstations is available.

SHARED SERVER

Reasons to select this option:

1. Security considerations prohibit staging the data to the workstation.
2. The required data system is not available on every workstation (e.g., file system or database manager).
3. Data staging software support is not available for all the workstations.
4. The data staging policy is easier to manage because the server is always available for transfers; and there are fewer servers than workstations.
5. The overall software licensing costs may be less for a shared server.

DIALOG PANEL 47
Decide how to connect the workstation to the staged data on the server.
The user opens a window to the server to access the staged data.
Indicate how this window connection works:
X-IN-A-WINDOW
  Reasons to select this option:
  1. This option can support a graphic user interface (GUI).
  2. X-server software is required on each workstation.
ASCII TERMINAL EMULATOR IN A WINDOW
  Reasons to select this option:
  1. Requires an ASCII capable platform for the server.
  2. Serial wiring may already be in place and you want to use it.
  3. Requires an ASCII terminal emulator on each workstation.
  4. Distance to the server may inhibit X-window performance.
3270 TERMINAL EMULATOR IN A WINDOW
  Reasons to select this option:
  1. Requires a 3270 capable platform for the server.
  2. Coax wiring may already be in place and you want to use it.
  3. Requires a 3270 terminal emulator on each workstation.
  4. Distance to the server may inhibit X-window performance.

DIALOG PANEL 48
Decide where to place the new backend data system.
  DATA SYSTEM NAME: (NAME)
  DATA TYPE: (DATA TYPE)
Assign the data system to a platform:
ASSIGN IT TO THE SERVER NAMED: (NAME)
  Reasons to select this option:
  1. Excess workload capacity on the server can be used to avoid cost.
  2. Performance may benefit due to the proximity of the server.
ASSIGN IT TO ONE OF THE OTHER BACKEND PLATFORMS.
  Reasons to select this option:
  1. Excess workload capacity can be used to avoid cost.
  2. Programming skills may favor this platform.
  3. This platform already has the required data system software.
ASSIGN IT TO A NEW PLATFORM.
  Reasons to select this option:
  1. A new platform may be used to spread the workload.
  2. You want to avoid writing code for the existing platforms.

DIALOG PANEL 49
Decide where to place the new backend data system.
  DATA SYSTEM NAME: (NAME)
  DATA TYPE: (DATA TYPE)
Enter the name of the backend platform to which this data system will be assigned:
DIALOG PANEL 50
Decide where to place the new backend data system.
  DATA SYSTEM NAME: (NAME)
  DATA TYPE: (DATA TYPE)
Enter the name of the backend platform to which this data system will be assigned:
Does this platform support natively attached 3270 terminals?
YES
NO
Does this platform support natively attached ASCII terminals?
YES
NO
DIALOG PANEL 51
Decide how to connect the backend data system.
  DATA SYSTEM NAME: (NAME)
  DATA TYPE: (DATA TYPE)
RESOURCE CENTRIC
  Application code on the server accesses backend data via a transparent programming interface.
  Reasons to select this option:
  1. No application code is required on the backend.
  2. It's easier to design the application since it's not split.
  3. You prefer to avoid writing new application code for the backend system.
  4. A resource centric protocol is available (e.g., remote file access, DRDA, SQLNET).
  5. The application can produce a graphic user interface (GUI) on the X-terminals.
DISTRIBUTED LOGIC
  The application code is split between the server and the backend platform. A program-to-program protocol is used (e.g., APPC, RPC, MESSAGE QUEUES, PL SQL).
  Reasons to select this option:
  1. The access to the data is frequent and the performance of a resource centric protocol across the network would not be good.
  2. You want the request to the backend to be asynchronous, so the user need not wait for a reply.
  3. A resource centric protocol is not available for this platform.
  4. Available programming skills and tools support writing code for both platforms.
  5. Additional workload on the backend system may be minimized.
  6. The application can produce a graphic user interface (GUI) on the X-terminal.
X-PROTOCOL
  Application code on the backend connects directly to the X-terminals via an X-protocol.
  Reasons to select the option:
  1. No application code is required on the server.
  2. Performance demands on the backend are relatively light, and the network distance is relatively close.

3. It's easier to design the application since it's not split.

4. The application can produce a graphic user interface (GUI) on the X-terminal.

ASCII TERMINAL EMULATION

Application code on the backend produces an ASCII terminal data stream.

Reasons to select the option:

1. It's easier to design the application since it's not split and it produces a terminal interface.

2. A terminal user interface is acceptable.

3. An ASCII to X-converter is available on the server.

4. The backend platform supports ASCII terminal devices.

5. Available programmer skills favor this approach.

6. The existing backend software environment supports this option.

3270 TERMINAL EMULATION

Application code on the backend produces a 3270 terminal data stream.

Reasons to select this option:

1. It is easier to design the application since it is not split and it produces a terminal interface.

2. A terminal user interface is acceptable.

3. A 3270-to-X converter is available on the server.

4. The backend platform supports 3270 terminal devices.

5. Available programmer skills favor this approach.

6. The existing backend software environment supports this option.

DIALOG PANEL 52

There are (NUMBER) workgroup clusters. The total user population is (NUMBER). Each cluster is supported by a terminal server which provides the (SERVER TYPE) function. You can assign a local terminal server to each workgroup, or one large terminal server to be shared by all the workgroups.

To evaluate the cost of each approach, consider the costs of connecting the terminals to the servers and the servers to the backend systems, communications bandwidth, and software licensing for one versus many servers.

Indicate how servers are assigned:

LOCAL TERMINAL SERVER FOR EACH WORKGROUP

Reasons to select this option:

1. Cost.

2. Better/more predictable response time.

3. There are other uses for the local server

4. You already have the servers and wiring.

ONE TERMINAL SERVER FOR ALL WORKGROUPS

Reasons to select this option:

1. Cost.

2. You can use the excess capacity of an existing system.

3. Fewer systems to manage/simplified software distribution.

4. Physical security for the server is easier to enforce.

DIALOG PANEL 53

Decide how to connect the terminal server to the backend data system.

DATA SYSTEM NAME: (NAME)

DATA TYPE: (DATA TYPE)

TERMINAL SERVER ROUTES ASCII TERMINAL SESSION TO BACK-END

Reasons to select this option:

1. No application code is required on the terminal server.

2. You want to be consistent with other backends connected this way.

3. Keystroke echoing from the backend will not be a problem.

TERMINAL SERVER ROUTES 3270 TERMINAL SESSION TO BACK-END

Reasons to select this option:

1. No application code is required on the terminal server.

2. Subsecond response times may be possible.

RESOURCE CENTRIC

Application on server accesses backend data via transparent programming interface.

1. Application code runs on server instead of backend.

2. Minimize workload on backend/utilize workload capacity of server.

3. The number of round trip interactions with the backend will not be a performance issue.

4. A resource centric protocol is available (e.g., remote file access, DRDA).

DISTRIBUTED LOGIC

Split application components communicate via a program-to-program protocol, e.g., APPC, RPC, MESSAGE QUEUES).

Reasons to select this option:

1. The access to the data is frequent and the performance of a resource centric protocol across the network would not be good.

2. A resource centric protocol is not available for this platform.

DIALOG PANEL 54

DESIGN ADVISORY

The requirement to support (TYPE OF) terminals dictates that the user interface must be a terminal style with user logons to the single backend.

For workstations, the user interface is a terminal emulator in a window.

I claim:

1. An expert system for designing a computer network, said system comprising:

means for displaying questions and receiving responsive decisions as to types of back end data bases and whether copies of said back end data bases should be stored in respective fronted data bases;

means for determining if two or more of said fronted data bases can be merged together based on compatibility of their types and notifying an operator of the determination;

means for receiving a decision from said operator whether said two or more fronted data bases should be merged together, if compatible; and means for determining a final design of the computer network based in part on the decision whether said two or more fronted databases should be merged together.

2. A system as set forth in claim 1 wherein said types of data bases comprise relational data bases, hierarchical data bases and/or file systems.

3. A system as set forth in claim 2 wherein only data bases of the same type are compatible with each other.

4. A system as set forth in claim 1 further comprising means for displaying a question and receiving a responsive decision whether data from two of said back end data bases should be staged into a common fronted data base, and if so, designing a computer network which merges the staged data into a common fronted data base if the two back end data bases are compatible types.

5. A method for designing a computer network, said method comprising the computer implemented steps of:

displaying questions and receiving responsive decisions as to types of back end data bases and whether copies of said back end data bases should be stored in respective fronted data bases, and in response identifying a back end model which corresponds to the back end decisions;

displaying questions and receiving responsive decisions of types of fronted components, and in response identifying a fronted model which corresponds to the fronted decisions;

identifying a program function that can be performed on either an intermediate server or the back end model; and displaying a question and receiving a responsive decision whether said intermediate server should be included in said computer network to perform said program function.

6. A method as set forth in claim 5 further comprising the step of displaying questions and receiving responsive decisions of types of connections between said intermediate server, if any, fronted model, and said back end model, and in response determining a final design of said computer network based on said connection decision, intermediate server, if any, back end model and fronted model.

7. A method as set forth in claim 6 further comprising the step of displaying information with said questions about said connections, said information indicating advantages or disadvantages for different connection decisions.

8. A method as set forth in claim 5 further comprising the step of:

identifying two or more of said fronted data bases of compatible type that can be merged together; and displaying a question and receiving a responsive decision whether said two or more fronted data bases should be merged together.

9. A method as set forth in claim 8 wherein said two or more front end data bases of compatible type are each staged.

10. A method as set forth in claim 5 further comprising the step of displaying information with said questions about said fronted components, said information indicating advantages or disadvantages for different front end decisions.

11. A method as set forth in claim 5 wherein the design is built in stages and further comprising the step of displaying the design after each of various stages.

12. A method as set forth in claim 5 wherein said questions about said fronted components include questions about desired clustering of users into workgroups.

13. A method as set forth in claim 5 further comprising the subsequent step of constructing the computer network according to the final design.

14. A method for designing a computer network, said method comprising the computer implemented steps of:

displaying questions and receiving responsive decisions of types of back end data bases and whether copies of said back end data bases should be stored in respective fronted data bases, and in response identifying a predetermined back end model which corresponds to said back end decisions;

displaying questions and receiving responsive decisions of types of fronted components, and in response identifying a fronted model which corresponds to said fronted component decisions;

determining and presenting reasons to include an intermediate server to execute a program function needed in said computer network; and in response to the presented reasons, receiving a decision from an operator whether to include said intermediate server in a final design of said computer network.

15. A method as set forth in claim 14 further comprising the step of displaying the final design of the computer network.

16. A method as set forth in claim 14 wherein said computer network needs presentation logic program function, business logic program function and data access logic program function, and determines and presents reasons to include said intermediate server to execute any of said program functions.

17. A method as set forth in claim 14 further comprising the step of:

displaying questions and receiving responsive decisions of types of connections between said fronted model, said back end model and said intermediate server, if any, and in response determining said final design based on the connection decisions, intermediate server, if any, back end model and fronted model.

18. A process as set forth in claim 14 wherein said reasons include performance considerations.

19. A process as set forth in claim 14 wherein said reasons include scope of required access to data associated with said function.

20. A system for designing a computer network, said system comprising:

means for displaying questions and receiving responsive decisions of types of back end data bases and in response identifying a back end system from a predetermined set of back end systems which corresponds to the back end decisions;

means for displaying questions and receiving responsive decisions of types of fronted components and in response identifying a fronted system from a predetermined set of fronted systems which corresponds to the fronted decisions; and means for displaying questions and receiving responsive decisions of types of connections between the identified fronted system and the identified back end system, and in response determining a final design of said computer network based on the connection decision, the identified back end system and the identified fronted system.

21. A system as set forth in claim 20 wherein said predetermined set of back end systems consists substantially of DBobject Cases 1–7.

22. A system as set forth in claim 21 wherein said predetermined set of fronted systems consists substantially of Fecases A–G, H1, H2, J1 and J2.

23. A system as set forth in claim 20 wherein said predetermined set of back end systems comprises at least five of DBobject Cases 1–7.

24. A system as set forth in claim 23 wherein said predetermined set of fronted systems comprises at least eight of Fecases A–G, H1, H2, J1 and J2.

25. A system as set forth in claim 20 wherein said predetermined set of fronted systems consists substantially of Fecases A–G, H1, H2, J1 and J2.

26. A system as set forth in claim 20 wherein said predetermined set of fronted systems comprises at least eight of Fecases A–G, H1, H2, J1 and J2.

27. A system as set forth in claim 20 further comprising:
means for displaying questions and receiving responsive decisions of whether an application executing in said system is distributed, resource centric or front ended and using said application decisions to determine whether to place components of application logic on said back end model, said fronted model or said intermediate server, if any.

28. A system as set forth in claim 20 further comprising:
means for displaying questions and receiving responsive decisions of whether an application executing in said system is distributed, resource centric or front ended and using said application decisions to determine a number of each of said back end model, said fronted model and said intermediate server to include in the final design.

* * * * *